US 10,719,395 B2

(12) United States Patent
Hara et al.

(10) Patent No.: US 10,719,395 B2
(45) Date of Patent: Jul. 21, 2020

(54) MEMORY SYSTEM

(71) Applicant: Toshiba Memory Corporation, Minato-ku (JP)

(72) Inventors: Tokumasa Hara, Kawasaki (JP); Kejen Lin, Yokohama (JP); Sho Kodama, Kawasaki (JP); Keiri Nakanishi, Kawasaki (JP); Kohei Oikawa, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 4 days.

(21) Appl. No.: 16/121,336

(22) Filed: Sep. 4, 2018

(65) Prior Publication Data
US 2019/0294500 A1 Sep. 26, 2019

(30) Foreign Application Priority Data
Mar. 22, 2018 (JP) .................. 2018-055168

(51) Int. Cl.
*G06F 11/10* (2006.01)
*H03M 13/29* (2006.01)
*G11C 29/52* (2006.01)

(52) U.S. Cl.
CPC .......... *G06F 11/1068* (2013.01); *G11C 29/52* (2013.01); *H03M 13/2906* (2013.01)

(58) Field of Classification Search
CPC ............................. H03M 13/2957
USPC ....................... 714/755, 757, 760
See application file for complete search history.

(56) References Cited

U.S. PATENT DOCUMENTS

| 7,518,922 B2 | 4/2009 | Maejima et al. |
| 7,644,225 B2 | 1/2010 | Dover |
| 7,729,166 B2 | 6/2010 | Kim et al. |
| 7,952,923 B2 | 5/2011 | Kim et al. |
| 8,341,501 B2 | 12/2012 | Franceschini et al. |
| 8,347,179 B2 | 1/2013 | Soma |
| 8,724,382 B2 | 5/2014 | Kim et al. |

(Continued)

FOREIGN PATENT DOCUMENTS

| JP | 2000-20409 | 1/2000 |
| JP | 2001-202793 | 7/2001 |

(Continued)

*Primary Examiner* — Fritz Alphonse
(74) *Attorney, Agent, or Firm* — Oblon, McClelland, Maier & Neustadt, L.L.P.

(57) ABSTRACT

According to one embodiment, a memory system includes an error mitigation encoder that executes error mitigation coding on write data to be stored in a processing target page of a non-volatile memory, a memory interface that writes the write data which has undergone the error mitigation coding in the processing target page of the non-volatile memory and reads the write data which has undergone the error mitigation coding from the processing target page as read data, an error mitigation decoder that performs error mitigation decoding on the read data read from the processing target page of the non-volatile memory, and an error mitigation coding rate deciding unit that decides an error mitigation coding rate of the error mitigation encoder and the error mitigation decoder on the basis of at least one of information indicating the processing target page and information indicating a device characteristic of the processing target page.

20 Claims, 28 Drawing Sheets

(56) References Cited

U.S. PATENT DOCUMENTS

| | | |
|---|---|---|
| 8,724,384 B2 | 5/2014 | Kim et al. |
| 8,756,365 B2 | 6/2014 | Sharon et al. |
| 8,756,464 B2 | 6/2014 | Kim et al. |
| 8,799,559 B2 | 8/2014 | Sharon et al. |
| 8,874,994 B2 | 10/2014 | Sharon et al. |
| 8,880,977 B2 | 11/2014 | Sharon et al. |
| 9,032,269 B2 | 5/2015 | Sharon et al. |
| 9,098,445 B2 | 8/2015 | Meir et al. |
| 9,311,969 B2 | 4/2016 | Sharon et al. |
| 9,311,970 B2 | 4/2016 | Sharon et al. |
| 9,318,166 B2 | 4/2016 | Sharon et al. |
| 9,390,774 B2 | 7/2016 | Sharon et al. |
| 9,465,552 B2 | 10/2016 | Meir et al. |
| 9,569,320 B2 | 2/2017 | Werner et al. |
| 2016/0055055 A1* | 2/2016 | Harada .................. G11C 29/52 714/764 |
| 2017/0026379 A1 | 1/2017 | Lu et al. |
| 2017/0147435 A1 | 5/2017 | Werner et al. |
| 2019/0296774 A1* | 9/2019 | Uchikawa ......... H03M 13/2906 |

FOREIGN PATENT DOCUMENTS

| | | |
|---|---|---|
| JP | 2011-508358 | 3/2011 |
| JP | 4928830 | 5/2012 |
| JP | 2013-45428 | 3/2013 |
| JP | 5303325 | 10/2013 |
| JP | 2014-130587 | 7/2014 |
| JP | 2015-36982 | 2/2015 |
| JP | 2015-64925 | 4/2015 |
| JP | 2016-510928 | 4/2016 |
| JP | 6025844 | 11/2016 |

\* cited by examiner

|        | Er | A | B | C | D | E | F | G |
|--------|----|----|----|----|----|----|----|----|
| UPPER  | 0  | 1 | 0 | 1 | 0 | 1 | 0 | 1 |
| MIDDLE | 0  | 0 | 1 | 1 | 0 | 0 | 1 | 1 |
| LOWER  | 0  | 0 | 0 | 0 | 1 | 1 | 1 | 1 |

FIG.11
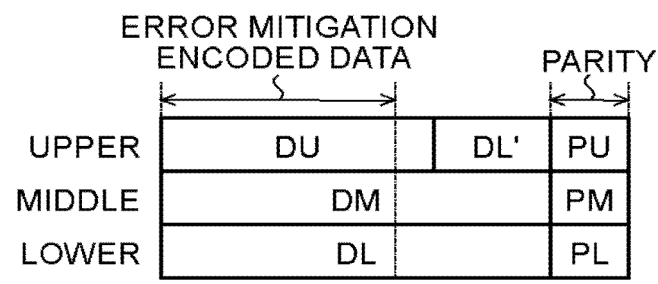
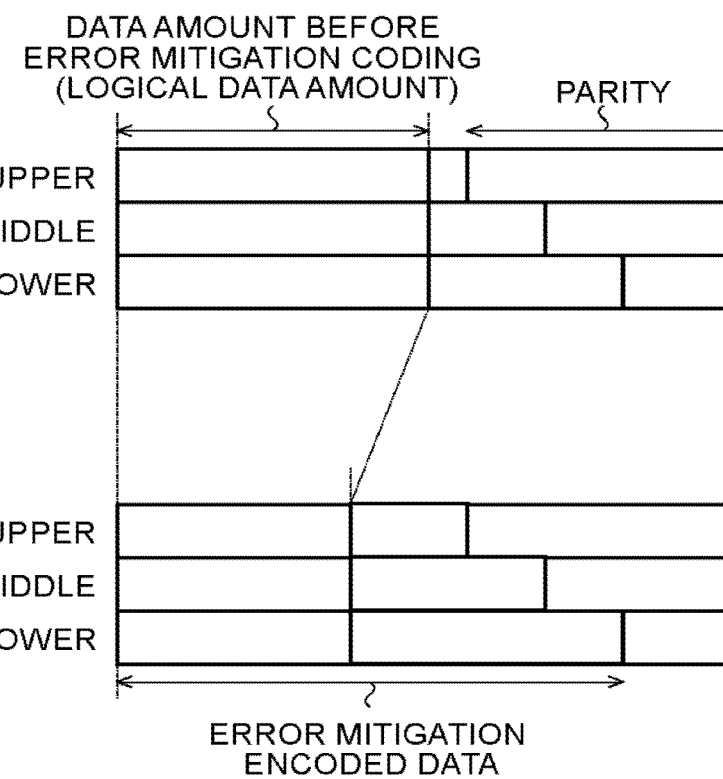

FIG.13A
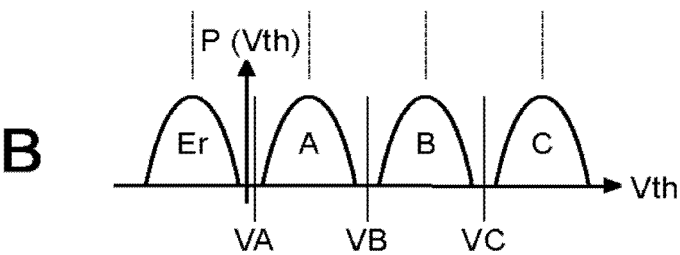
FIG.13B
FIG.14
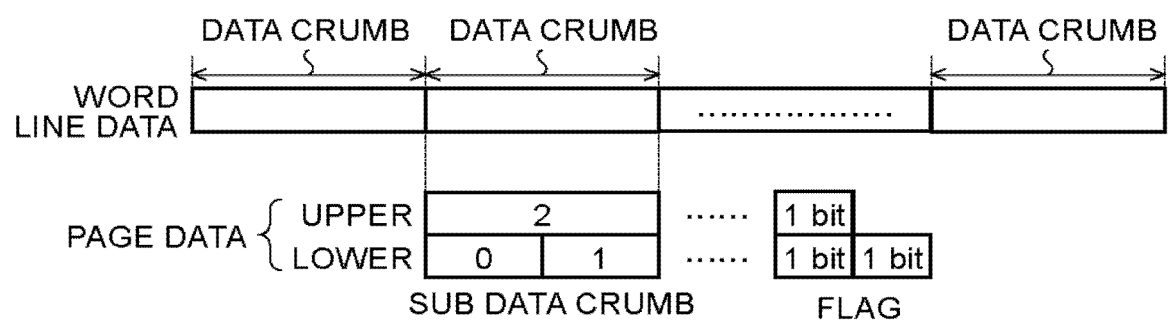

FIG.15A

| PAGE | DATA CONVERSION CANDIDATE | | | | | | | | FLAG | |
|---|---|---|---|---|---|---|---|---|---|---|
| UPPER | 1 | 1 | 1 | 0 | 0 | 0 | 0 | 1 | 0 | |
| LOWER | 1 | 0 | 0 | 0 | 0 | 1 | 1 | 1 | 0 | 0 |

FIG.15B

| PAGE | DATA CONVERSION CANDIDATE | | | | | | | | FLAG | |
|---|---|---|---|---|---|---|---|---|---|---|
| UPPER | 1 | 1 | 1 | 0 | 0 | 0 | 0 | 1 | 0 | |
| LOWER | 0 | 1 | 1 | 1 | 0 | 1 | 1 | 1 | 1 | 0 |

FIG.15C

| PAGE | DATA CONVERSION CANDIDATE | | | | | | | | FLAG | |
|---|---|---|---|---|---|---|---|---|---|---|
| UPPER | 1 | 1 | 1 | 0 | 0 | 0 | 0 | 1 | 0 | |
| LOWER | 1 | 0 | 0 | 0 | 1 | 0 | 0 | 0 | 0 | 1 |

FIG.15D

| PAGE | DATA CONVERSION CANDIDATE | | | | | | | | FLAG | |
|---|---|---|---|---|---|---|---|---|---|---|
| UPPER | 1 | 1 | 1 | 0 | 0 | 0 | 0 | 1 | 0 | |
| LOWER | 0 | 1 | 1 | 1 | 1 | 0 | 0 | 0 | 1 | 1 |

FIG.15E

| PAGE | DATA CONVERSION CANDIDATE | | | | | | | | FLAG | |
|---|---|---|---|---|---|---|---|---|---|---|
| UPPER | 0 | 0 | 0 | 1 | 1 | 1 | 1 | 0 | 1 | |
| LOWER | 1 | 0 | 0 | 0 | 0 | 1 | 1 | 1 | 0 | 0 |

FIG.15F

| PAGE | DATA CONVERSION CANDIDATE | | | | | | | | FLAG | |
|---|---|---|---|---|---|---|---|---|---|---|
| UPPER | 0 | 0 | 0 | 1 | 1 | 1 | 1 | 0 | 1 | |
| LOWER | 0 | 1 | 1 | 1 | 0 | 1 | 1 | 1 | 1 | 0 |

FIG.15G

| PAGE | DATA CONVERSION CANDIDATE | | | | | | | | FLAG | |
|---|---|---|---|---|---|---|---|---|---|---|
| UPPER | 0 | 0 | 0 | 1 | 1 | 1 | 1 | 0 | 1 | |
| LOWER | 1 | 0 | 0 | 0 | 1 | 0 | 0 | 0 | 0 | 1 |

FIG.15H

| PAGE | DATA CONVERSION CANDIDATE | | | | | | | | FLAG | |
|---|---|---|---|---|---|---|---|---|---|---|
| UPPER | 0 | 0 | 0 | 1 | 1 | 1 | 1 | 0 | 1 | |
| LOWER | 0 | 1 | 1 | 1 | 0 | 0 | 0 | 0 | 1 | 1 |

FIG.18A
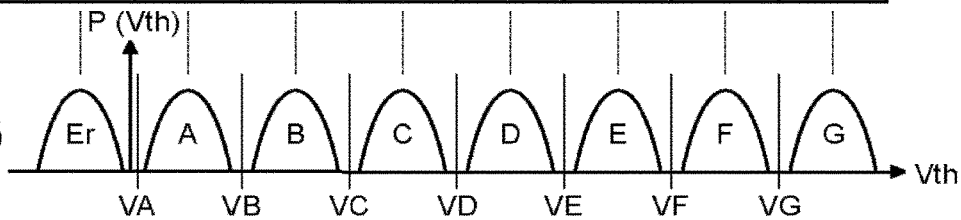
FIG.18B
FIG.19
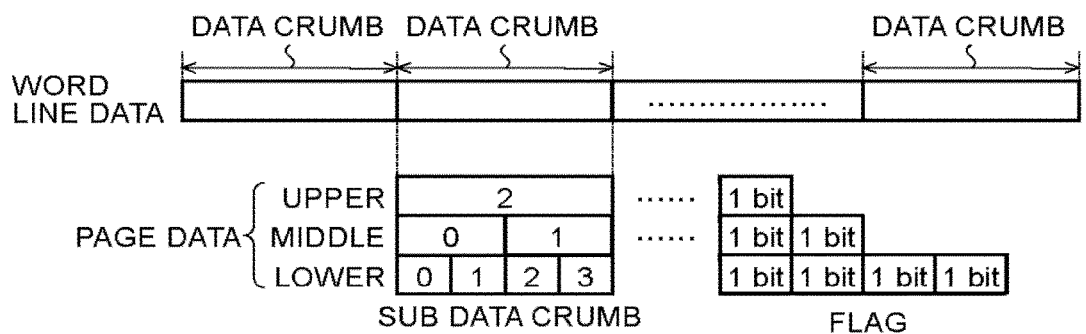

ERROR MITIGATION ENCODER INPUT

ERROR MITIGATION ENCODER OUTPUT

ERROR MITIGATION DECODER INPUT

ERROR MITIGATION DECODER OUTPUT

MEMORY SYSTEM

CROSS-REFERENCE TO RELATED APPLICATIONS

This application is based upon and claims the benefit of priority from Japanese Patent Application No. 2018-055168, filed on Mar. 22, 2018; the entire contents of all of which are incorporated herein by reference.

FIELD

Embodiments described herein relate generally to a memory system.

BACKGROUND

In recent years, in the field of non-volatile semiconductor memories such as NAND cell type flash memories (hereinafter referred to simply as NAND memories), with the size reduction, a bit error occurring at the time of reading has increased. For this reason, techniques for reducing errors in the entire system are important. Generally, in non-volatile semiconductor memories, data "1" is associated with an erase state, and data "0" is associated with a write state, but as the number of reciprocations of the write state and the erase state (hereinafter, referred to as the number of W/Es) increases while writing/erasing is being repeated, the number of electrons passing through an oxide film of a memory cell increases, leading to a state in which the memory cell is exhausted. Further, as writing is performed with a higher threshold voltage distribution, an interference effect on an adjacent memory cell increases, and a probability of bit errors being induced increases accordingly.

BRIEF DESCRIPTION OF THE DRAWINGS

FIG. 11 is a diagram illustrating a schematic configuration example of a data crumb according to a second embodiment;

FIGS. 12A and 12B are diagrams for describing a relation between the error mitigation coding rate in the first embodiment and an error mitigation coding rate according to a fourth embodiment;

FIGS. 13A and 13B are diagrams illustrating an example of a correspondence between a threshold voltage distribution of an MLC and data coding according to the sixth embodiment;

FIG. 14 is a diagram for describing a flow of dividing word line data which is write data into units (sub data crumbs) smaller than a data crumb in the sixth embodiment;

FIGS. 15A to 15H are diagrams illustrating examples of data conversion candidates generated in the sixth embodiment;

FIGS. 18A and 18B are diagrams illustrating an example of a correspondence between a threshold voltage distribution of a TLC and data coding according to a seventh embodiment;

FIG. 19 is a diagram for describing a flow of dividing word line data into sub data crumbs according to the seventh embodiment;

DETAILED DESCRIPTION

In general, according to the embodiment, a memory system includes a non-volatile memory having a plurality of memory cells each capable of storing a multi-value bit, an error mitigation encoder that executes error mitigation coding on write data to be stored in a processing target page of the non-volatile memory, a memory interface that writes the write data which has undergone the error mitigation coding in the processing target page of the non-volatile memory and reads the write data which has undergone the error mitigation coding from the processing target page as read data, an error mitigation decoder that performs error mitigation decoding on the read data read from the processing target page of the non-volatile memory, and an error mitigation coding rate deciding unit that decides an error mitigation coding rate of the error mitigation encoder and the error mitigation decoder on the basis of at least one of information indicating the processing target page and information indicating a device characteristic of the processing target page.

Exemplary embodiments of a memory system will be explained below in detail with reference to the accompanying drawings. The present invention is not limited to the following embodiments.

First Embodiment

As a technology of converting data of a write target (hereinafter referred to as write data) through signal processing and reducing exhaustion of a memory cell (also referred to as a cell) (hereinafter referred to as cell exhaustion) caused by an inter-cell interference effect or writing/erasing, for example, an error mitigation code is known. Examples of the error mitigation code include an error mitigation code using asymmetric coding (AC) and an error mitigation code using a bit swap encoding (BSE), and suppression of cell exhaustion and reduction of bit error rate (BER) are performed by applying data conversion to write data to be written in a non-volatile memory in order to improve durability or reliability of a memory system. In the error mitigation code using the BSE, for example, all pages in a word line are grouped and then divided into data crumbs with a fixed length, and then at the time of encoding, a state of a threshold value distribution is analyzed for each data crumb, and a data conversion method is decided.

Figure 1:
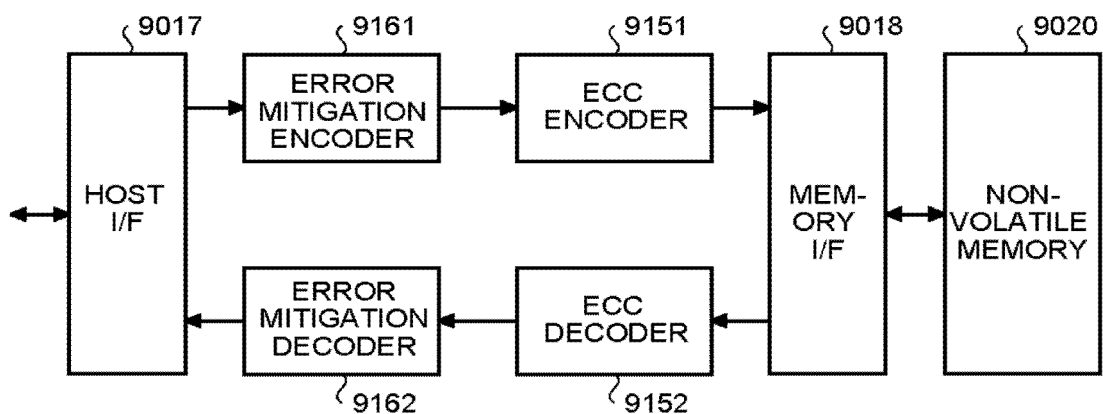
FIG. 1 is a block diagram illustrating a schematic configuration example of a memory system having an implementation form of a general error mitigation code and an error correction code.

FIG. 1 is a block diagram illustrating a schematic configuration example of a memory system having an implementation form of a general error mitigation code and an error correction code. In a configuration illustrated in FIG. 1, write data input from a host via a host interface (I/F) 9017 undergoes error mitigation coding performed by an error mitigation encoder 9161, a parity is added by an error correction encoder (hereinafter referred to as ECC encoder) 9151, and resulting write data is written from a memory I/F 9018 to a non-volatile memory 9020. On the other hand, data read from the non-volatile memory 9020 (hereinafter referred to as read data) by the memory I/F 9018 undergoes error correction performed by an error correction decoder (hereinafter referred to as ECC decoder) 9152 and then decoded by an error mitigation decoder 9162.

Here, there are several variations in a method of defining a coding unit of the error mitigation code, and a data amount which needs to be read from the non-volatile memory 9020 in order to obtain read data corresponding to one page differs depending on a coding unit. In general, the performance of the error mitigation code tends to be improved as the coding unit increases, but on the other hand, random accessibility decreases, that is, there is a trade-off relation between the performance of the error mitigation code and the random accessibility.

Figure 2:
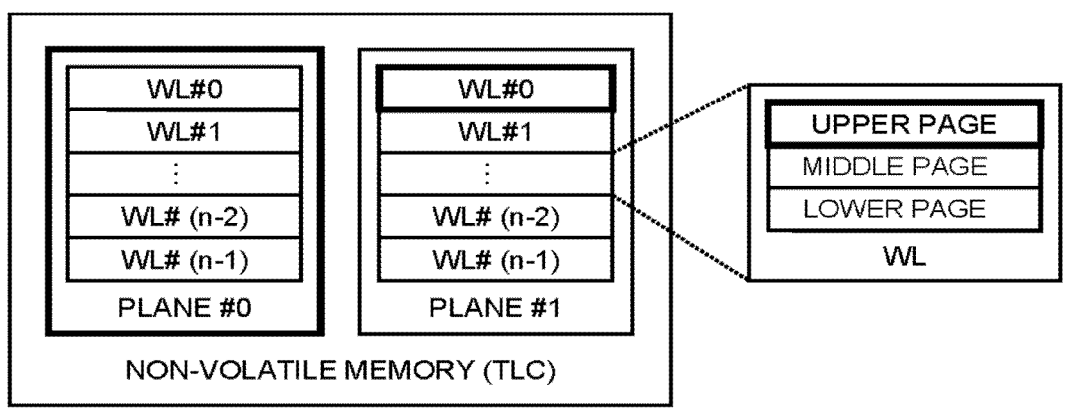
FIG. 2 is a diagram for describing error mitigation performance of each coding unit.

FIG. 2 is a diagram for describing error mitigation performance of each coding unit. As illustrated in FIG. 2, for example, in a case in which a frame unit, a word line (WL) unit, and a page unit are used as the coding unit, the error mitigation performance of each coding unit is highest when the frame unit is used, next highest when the word line unit is used, and lowest when the page unit is used. On the other hand, the random accessibility to desired data is highest when the page unit is used, next highest when the word line unit is used, and lowest when the frame unit is used. In this description, a page includes, for example, a plurality of cells and serves as a unit of data writing/reading. The word line is a control signal line to which a plurality of cells constituting a plurality of pages are connected. Therefore, a plurality of pages are included in the word line unit. Further, a plane corresponds to, for example, one or more blocks or one or more memory chips. Therefore, a plurality of word lines are included in the frame unit. Here, the present disclosure is not limited thereto. In the following description, the error mitigation code in a case in which a page is used as the coding unit will be described as an example.

In a basic principle for cell exhaustion suppression and BER reduction by error mitigation, when data conversion is performed on write data, bias is given to a threshold voltage of a cell, and thus cells programmed to a threshold voltage with a poor characteristic for cell exhaustion and BER are reduced, and cells programmed to a threshold voltage with a good characteristic are increased.

Figure 3A:
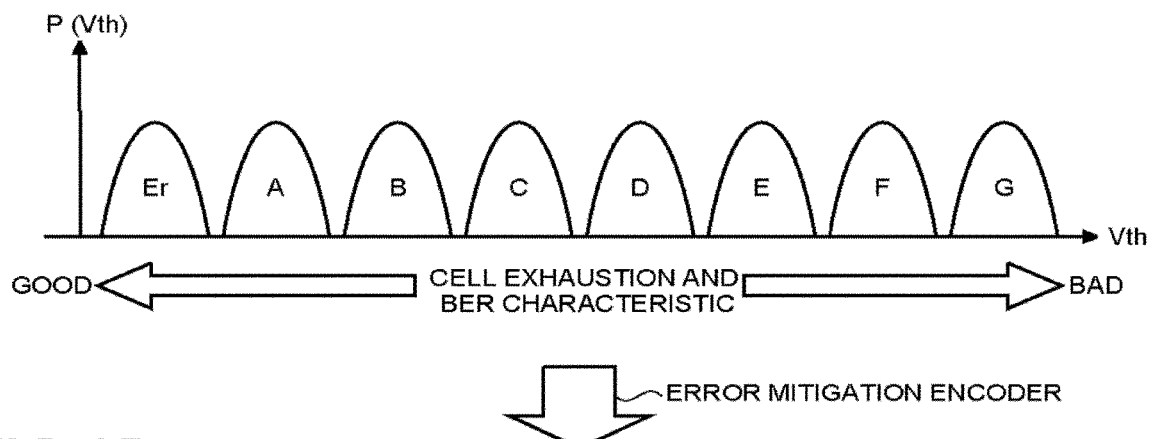
FIGS. 3A and 3B are diagrams illustrating examples of threshold voltage distributions in cases in which an error mitigation code is applied and not applied to a non-volatile memory using a TLC.
Figure 3B:
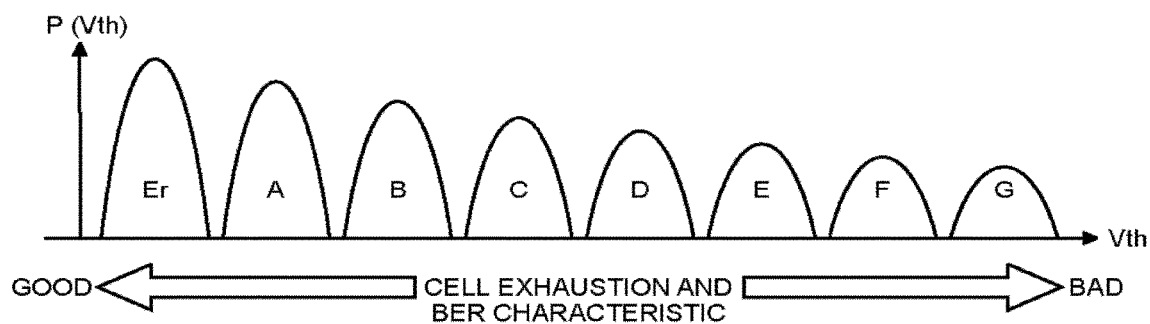

FIGS. 3A and 3B illustrate examples of threshold voltage distributions in cases in which an error mitigation code is applied and not applied to a non-volatile memory using a triple level cell (TLC) in which 3-bit data can be stored in one cell (hereinafter referred to as a 3-bit/cell). FIG. 3A illustrates cell exhaustion and BER characteristic in a case in which the error mitigation code is not applied, and FIG. 3B illustrates cell exhaustion and PER characteristic in a case in which the error mitigation code is applied. As illustrated in FIG. 3A, the cell exhaustion and the BER characteristic tend to be worse as the threshold voltage is higher. Therefore, as illustrated in FIG. 3B, the error mitigation coding is performed in such a manner that an appearance probability P(Vth) of a cell with a high threshold voltage is decreased, and an appearance probability P(Vth) of a cell with a low threshold voltage is increased.

Figures 4, 5:
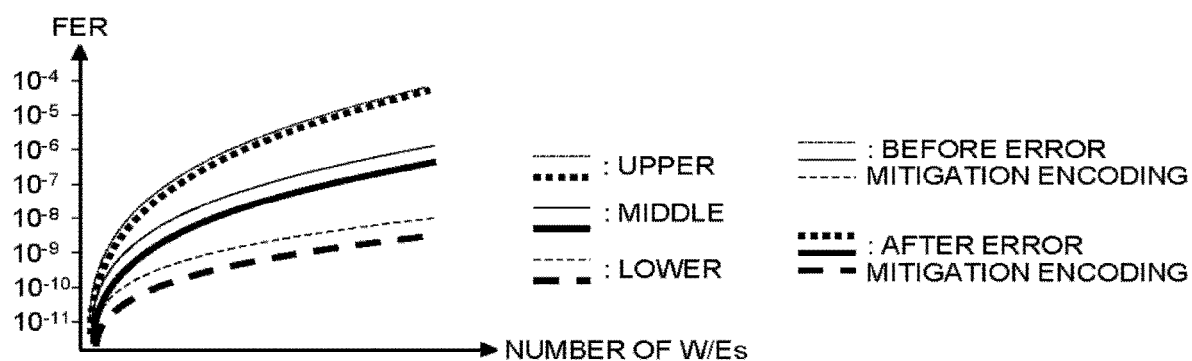
FIG. 4 is a diagram illustrating an example of a coding table for a non-volatile memory using a TLC.
FIG. 5 is a diagram illustrating an example of a FER characteristic in a case in which the same error mitigation coding rate is set for a non-volatile memory having a non-uniform error characteristic for each page.

Further, in a case in which the TLC is used, a plurality of cells which are connected to the same word line WL and grouped constitute an UPPER page, a MIDDLE page, and a LOWER page. A bit value of each page (the UPPER page, the MIDDLE page, and the LOWER page) is associated with a threshold voltage of a cell, for example, through a coding table as illustrated in FIG. 4. Therefore, in a case in which the error mitigation coding is performed using the page as the coding unit, the appearance probability P(Vth) of a bit "0" in the UPPER/MIDDLE/LOWER page and the appearance probability P(Vth) of a bit "1" are controlled such that the appearance probability P(Vth) of the threshold voltage is decreased/increased. For example, in a case in which the highest threshold voltage (corresponding to a G level to be described later) in the TLC is reduced using the encoding table illustrated in FIG. 4, the error mitigation coding executed so that the bits "1" are reduced in each UPPER/MIDDLE/LOWER page.

If the error mitigation coding is performed, a data amount increases before and after the coding, but the data amount increase can be concealed by reducing the parity bit of the error correction code by the increase in the data amount caused by the error mitigation. Here, an error correction capability is decreased by reducing the parity bit, but in a case in which the BER improvement by the error mitigation exceeds a decrease in the error correction capability, it is possible to improve reliability of a memory system accordingly.

Here, in a case in which the reliability is evaluated for the mitigation and the error correction, for example, an error correction failure rate (a frame error rate (FER)) can be used as an index for evaluating the reliability. Since the FER changes depending on a coding rate of the error mitigation coding (=data amount before encoding/data amount after encoding) and a coding rate of the error correction which changes accordingly, it is possible to select the coding rate of the error mitigation having the best FER characteristic.

Meanwhile, there are cases in which the error characteristics of the respective pages included in the word line do not coincide with each other. For example, in the case of the TLC, the LOWER page, the MIDDLE page, and the UPPER page may differ in the error characteristic. The same applies to a multiple level cell (MLC) in which data of 2 bits can be stored in one cell (hereinafter referred to as a 2-bit/cell) or a quad level cell (QLC) in which data of 4 bits can be stored in one cell (hereinafter referred to as a 4-bit/cell). Therefore, each page may differ in FER even when the error mitigation code is applied using the same coding rate, and thus the coding rate of the error mitigation may be excessive for an error characteristic of a certain page (the coding rate of the error correction may be too small, and the correction capability may be excessive), or the coding rate of the error mitigation may be too small (the coding rate of the error correction may be excessive, and the correction capability may be too small).

FIG. 5 illustrates an example of the FER characteristic in a case in which the same error mitigation coding rate is set for the non-volatile memory 9020 having the non-uniform error characteristic for each page. FIG. 5 illustrates an example in a case in which the TLC is used. As illustrated in FTC. 5, in the UPPER page with the worst FER characteristic, the FER hardly change before and after the error mitigation. Further, the FERs of the MIDDLE page and the LOWER page are improved, but since the reliability seen from the outside of the memory system is strongly influenced by the UPPER page with the worst FER, in this example, the improvement effect of the reliability by the error mitigation code is small.

In this regard, in a first embodiment, an example in which the coding rate of the error mitigation is caused to change depending on the error characteristic of each page in a case in which the error mitigation coding is applied to each page will be described. According to the first embodiment to be described below, it is possible to improve the probability (FER) of the failure of the error correction in each page as compared with a case in which an error correction suppression coding rate common to all pages is used.

Figure 6:
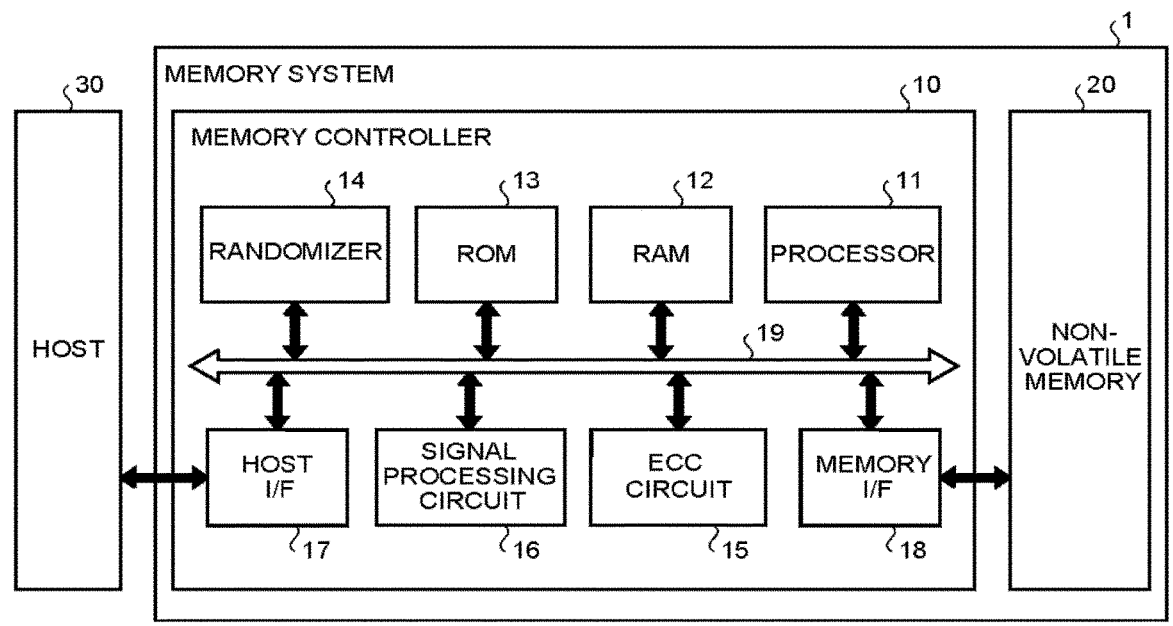
FIG. 6 is a block diagram illustrating a schematic configuration example of a memory system according to a first embodiment.

FIG. 6 is a block diagram illustrating a schematic configuration example of a memory system according to the first embodiment. As illustrated in FIG. 6, a memory system 1 includes a memory controller 10 and a non-volatile memory 20. The memory system 1 is connectable to a host 30, and the state in which the memory system 1 is connected to the host 30 is illustrated in FIG. 6. The host 30 may be, for example, an electronic device such as a personal computer or a mobile terminal.

The non-volatile memory 20 is a non-volatile memory that stores data in a non-volatile manner, and is, for example, a NAND flash memory (hereinafter referred to simply as a NAND memory). In the following description case in which a NAND memory is used as the non-volatile memory 20 will be described, but a storage device other than the NAND memory such as a three-dimensional structure flash memory, a resistance random access memory (ReRAM), or a ferroelectric random access memory (FeRAM) may be used as the non-volatile memory 20. Further, preferably, the non-volatile memory 20 is a semiconductor memory, and the present embodiment can be applied to various storage media other than the semiconductor memory.

The memory system 1 may be a memory card or the like in which the memory controller 10 and the non-volatile memory 20 are configured as one package or may be a solid state drive (SSD) or the like.

The memory controller 10 is, for example, a semiconductor integrated circuit configured as a System-On-a-Chip (SoC). Some or all of operations of constituent elements of the memory controller 10 to be described below may be implemented by a central processing unit (CPU) executing firmware or may be implemented by hardware.

The memory controller 10 controls writing to the non-volatile memory 20 in accordance with a write request from the host 30. Further, the memory controller 10 controls reading from the non-volatile memory 20 in accordance with a read request from the host 30. The memory controller 10 includes a host interface (I/F) 17, a memory I/F 18, a processor 11, a random access memory (RAM) 12, a read only memory (ROM) 13, a randomizer 14, an ECC circuit 15, and a signal processing circuit 16. The host I/F 17, the memory I/F 18, the processor 11, the RAM 12, the ROM 13, the randomizer 14, the ECC circuit 15, and the signal processing circuit 16 are connected to one another via an internal bus 19.

The host I/F 17 performs processing according to an interface standard with the host 30, and outputs a request received from the host 30, user data of a write target, or the like to the internal bus 19. Further, the host I/F 17 transmits user data which is read out from the non-volatile memory 20 and restored, a response from the processor 11, or the like to the host 30.

The memory I/F 10 performs a write process on the non-volatile memory 20 on the basis of an instruction of the processor 11. Further, the memory I/F 18 performs a read process on the non-volatile memory 20 on the basis of an instruction of the processor 11.

The processor 11 is a control unit which controls the respective constituent elements of the memory system 1 in general. When a request from the host 30 is received via the host I/F 17, the processor 11 performs control in accordance with the request. For example, in response to the write request from the host 30, the processor 11 instructs the memory I/F 18 to write the user data and the parity in the non-volatile memory 20. In response to the read request from the host 30, the processor 11 instructs the memory I/F 18 to read the user data and the parity from the non-volatile memory 20.

Further, when the write request is received from the host 30, the processor 11 decides a storage region (memory region) on the non-volatile memory 20 for the user data stored in the RAM 12. In other words, the processor 11 manages a write destination of the user data. A correspondence between a logical address of the user data received from the host 30 and a physical address indicating a storage region on the non-volatile memory 20 in which the user data is stored is stored as an address translation table.

Further, when the read request is received from the host 30, the processor 11 converts a logical address designated by the read request into a physical address using the address translation table, and instructs the memory I/F 18 to perform reading from the physical address.

Here, in the NAND memory, writing and reading are generally performed in units of data called a page, and erasing is performed in units of data called a block. In the present embodiment, a plurality of memory cells connected to the same word line are referred to as a memory cell group. In a case in which the memory cell is a single level cell (SLC), one memory cell group corresponds to one page. In a case in which the memory cell is a multi-bit cell such as the MLC, the TLC, or the QLC, one memory cell group corresponds to a plurality of pages. Further, each memory cell is connected to a word line and a bit line. Therefore, each memory cell can be identified by an address identifying the word line and an address identifying the bit line.

The RAM 12 is used as a data buffer, for example, and temporarily stores the user data received from the host 30 by the memory controller 10 until the user data is stored in the non-volatile memory 20. Further, the RAM 12 temporarily stores the user data read from the non-volatile memory 20 until the user data is transmitted to the host 30. For example, a general purpose memory such as a static random access memory (SRAM) or a dynamic random access memory (DRAM) can be used as the RAM 12.

Further, the RAM 12 may be used as a working memory which stores various kinds of management tables such as the address translation table and a master table (snapshot) which is read out from a specific region of the non-volatile memory 20 at the time of activation or the like and developed, log information which is a change difference in various kinds of management tables, and the like.

The ROM 13 stores various programs, parameters, and the like for operating the memory controller 10. The programs, the parameters, and the like stored in the ROM 13 are read out to the processor 11 and executed if necessary.

The randomizer 14 includes, for example, a linear feedback shift register or the like and generates a pseudo random number which is uniquely obtained with respect to an input seed value. For example, the pseudo random number generated by the randomizer 14 is exclusive OR with write data in the processor 11. Accordingly, the write data to be written in the non-volatile memory 20 is randomized.

The signal processing circuit 16 operates as an encoder that performs the error mitigation coding on data to be written in the non-volatile memory 20. The signal processing circuit 16 also operates as a decoder that performs the error mitigation decoding on data read from the non-volatile memory 20. A configuration example and operation example of the signal processing circuit 16 will be described later in further detail.

The user data transmitted from the host 30 is transferred to the internal bus 19, temporarily stored in the RAM 12, undergoes the error mitigation coding performed by the signal processing circuit 16, undergoes the error correction coding (hereinafter referred to as ECC coding) performed by the ECC circuit 15, and then written in the non-volatile memory 20 via the memory I/F 18. On the other hand, the data read from the non-volatile memory 20 undergoes the error correction decoding (hereinafter referred to as ECC decoding) performed by the ECC circuit 15, then undergoes the error mitigation coding performed by the signal processing circuit 16 if necessary, and restored as the user data. For example, the restored user data is temporarily stored in the RAM 12 and then transferred to the host 30 via the host I/F 17. In addition to the user data, control data or the like used in the memory controller 10 may be included in data to be encoded by the signal processing circuit 16 and/or the ECC circuit 15.

In the write process in the memory system 1 having the configuration described above, the processor 11 instructs the signal processing circuit 16 and the ECC circuit 15 to perform the error mitigation coding and the ECC coding on the user data when writing to the non-volatile memory 20 is performed. At this time, the processor 11 decides a storage location (write address) of the write data in the non-volatile memory 20 and gives an instruction for the decided storage location to the memory I/F 18. The signal processing circuit 16 performs the error mitigation coding on the user data on the RAM 12 on the basis of the instruction from the processor 11. Then, the ECC circuit 15 further performs the ECC coding on the error mitigation coded user data on the RAM 12 on the basis of the instruction from the processor 11. The generated write data is written at the designated storage location of the non-volatile memory 20 via the memory I/F 18. For example, an encoding scheme using a low-density parity-check (LDPC) code, a Bose-Chaudhuri-Hocquenghem (BCH) code, or a Reed-Solomon (RS) code can be employed as an encoding scheme of the ECC circuit 15.

On the other hand, in the read process, when reading from the non-volatile memory 20 is performed, the processor 11 designates an address on the non-volatile memory 20 and instructs the memory I/F 18 to perform reading. Further, the processor 11 instructs the ECC circuit 15 to start the ECC decoding, and instructs the signal processing circuit 16 to start the error mitigation decoding if necessary. In response to the instruction from the processor 11, the memory I/F 18 executes reading for the designated address of the non-volatile memory 20, and inputs the read data obtained by the reading to the ECC circuit 15. Then, the ECC circuit 15 performs the ECC decoding on the input read data, and when the decoding is successful, the ECC circuit 15 stores the restored original user data in the RAM 12. On the other hand, when the ECC decoding fails, the processor 11 gives, for example, a notification indicating a read error to the host 30.

Figure 7:
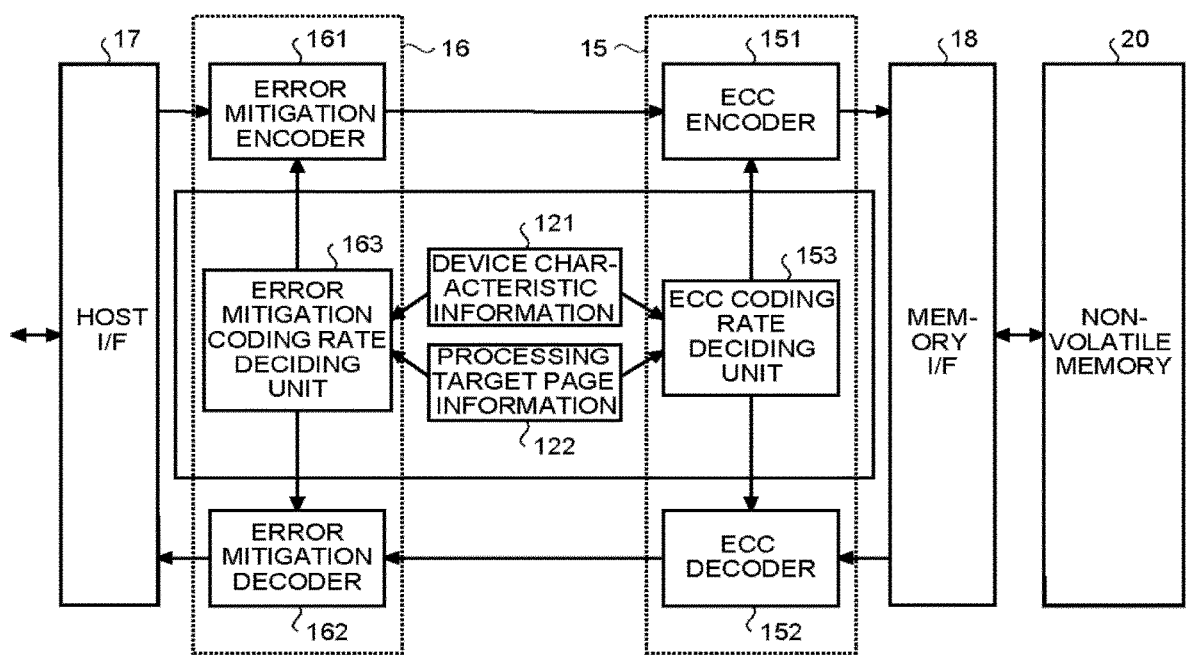
FIG. 7 is a block diagram illustrating one implementation form of an error mitigation code and an error correction code according to the first embodiment.

Next, an implementation form of the error mitigation code according to the present embodiment will be described in detail with reference to the appended drawings. FIG. 7 is a block diagram illustrating one implementation form of the error mitigation code and the error correction code according to the present embodiment.

Figure 8:
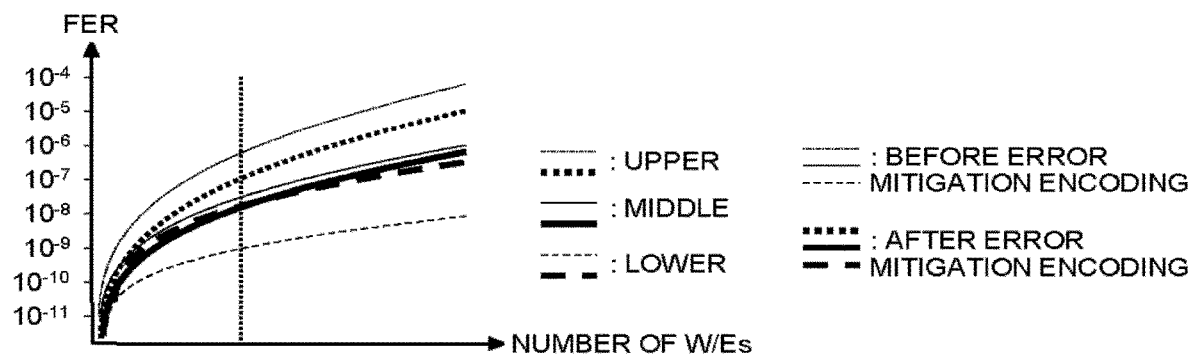
FIG. 8 is a diagram illustrating a FER characteristic in a case in which a different error mitigation coding rate is set for each page according to the first embodiment.

As illustrated in FIG. 8, one implementation form of the error mitigation code and the error correction code according to the present embodiment has a configuration in which write data input from the host 30 via the host I/F 17 undergoes the error mitigation coding by an error mitigation encoder 161, a parity is added by an ECC encoder 151, and then resulting write data is written from the memory I/F 18 to a non-volatile memory 20, similarly to the general implementation form of the error mitigation code and the error correction code described above with reference to FIG. 1. Further, read data read from the non-volatile memory 20 by the memory I/F 18 undergoes the error correction performed by an ECC decoder 152 and then decoded by an error mitigation decoder 162.

Further, in one implementation form of the error mitigation code and the error correction code according to the present embodiment, in addition to the above configuration, an error mitigation coding rate deciding unit 163 and an ECC coding rate deciding unit 153 are added. In this configuration, the error mitigation encoder 161, the error mitigation decoder 162, and the error mitigation coding rate deciding unit 163 constitute, for example, the signal processing circuit 16 of FIG. 6. The ECC encoder 151, the ECC decoder 152, and the ECC coding rate deciding unit 153 constitute, for example, the ECC circuit 15 of FIG. 6.

The error mitigation coding rate deciding unit 163 decides the coding rate of the error mitigation code on the basis of device characteristic information 121 and processing target page information 122 which is information indicating a page being currently processed (UPPER/MIDDLE/LOWER). Similarly, the ECC coding rate deciding unit 153 decides the coding rate of the error correction code to be executed by the ECC encoder 151 on the basis of the device characteristic information 121 and the processing target page information 122. The device characteristic information 121 will be described later. Further, for example, the device characteristic information 121 and the processing target page information 122 are assumed to be appropriately acquired and held in the RAM 12 or the like.

In the present embodiment, the coding rate of the error mitigation and the coding rate of the error correction may differ depending on the page. In this, the improvement effect of the reliability of the memory system 1 can be improved by setting the coding rate at which the FER is best for each page.

FIG. 8 illustrates the FER characteristic in a case in which a different error mitigation coding rate is set for each page for the non-volatile memory 20 having a non-uniform error characteristic for each page. As described above with reference to FIG. 5, in a case in which the error mitigation is not applied, the UPPER page is worst in the FER, and the improvement effect by the error mitigation is small, and thus in the present embodiment, a large error mitigation coding rate and a small error correction coding rate are set for the UPPER page. On the other hand, the LOWER page is much better in the FER characteristic than the UPPER page, and thus a small error mitigation coding rate and a large error correction coding rate are set for the LOWER page. Further, for the MIDDLE page located in the middle in terms of a characteristic, for example, the error mitigation coding rate and the error correction coding rate which are the same as those when the common coding rate described in FIG. 5 is set are set.

By setting the small error mitigation coding rate in the LOWER page as described above, the control performance of the threshold voltage corresponding to the bits "0" and "1" in the LOWER page is improved, and thus the FER of the UPPER page is improved. In the LOWER page, the FER gets worse because the large error correction coding rate is set, but the FER is still better than the FER in the UPPER page. Therefore, the reliability of the memory system 1 can be improved by improving the FER for the UPPER page having the worst FER.

Figure 9:
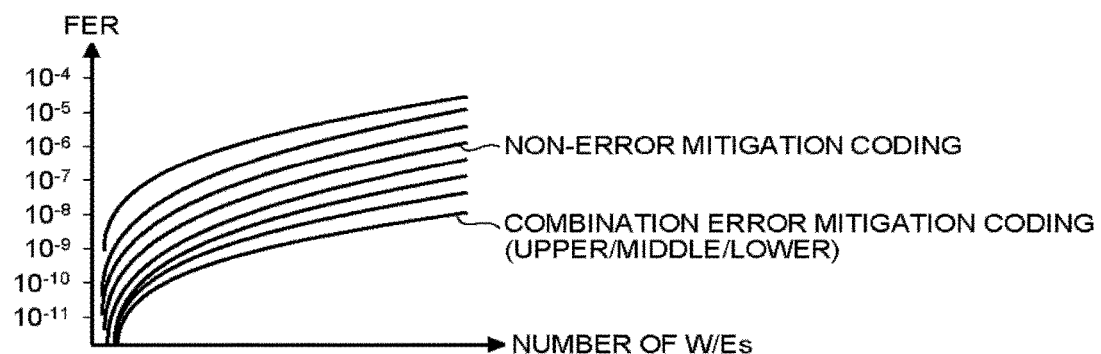
FIG. 9 is a diagram illustrating an example of device characteristic information according to the first embodiment.
Figure 10A:
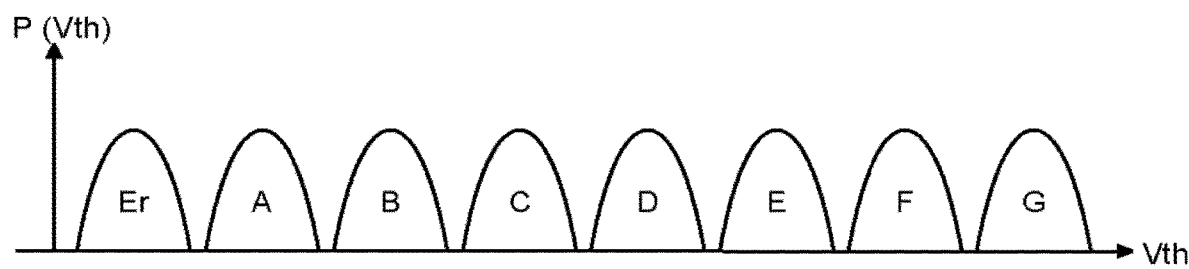
FIGS. 10A to 10D are diagrams illustrating other examples of the device characteristic information according to the first embodiment.
Figure 10B:
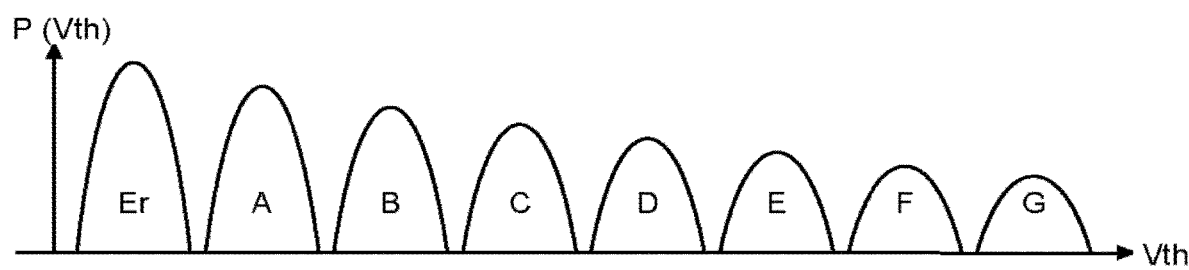
Figure 10C:
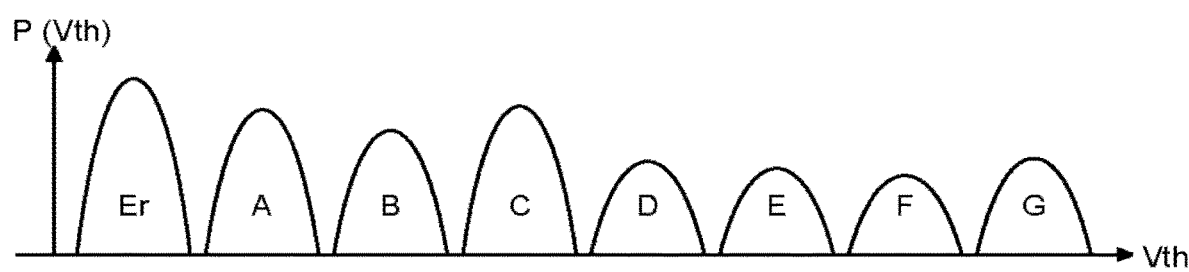
Figure 10D:
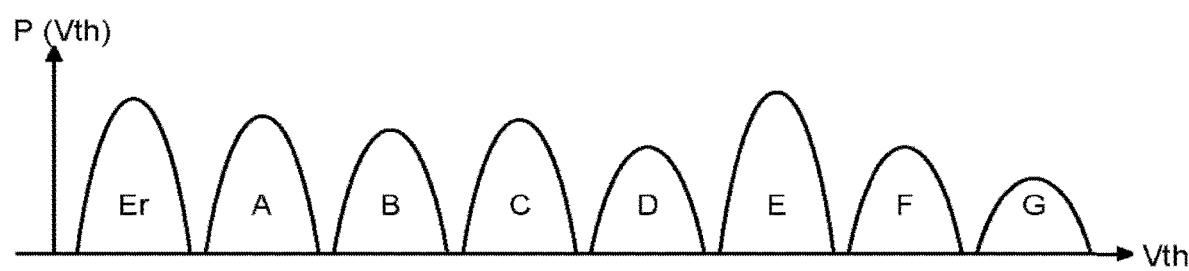

The device characteristic information 121 described above may include, for example, the following information. One is information related to a combination of error mitigation coding rates of respective pages, a change in the BER or the FER, a change in a relative relation between the BER and the FER as illustrated in FIG. 9. The other is information related to relations between combinations of the error mitigation coding rates of respective pages and control performance of threshold voltages of cells as illustrated in FIGS. 10A to 10D. The error mitigation encoder 161 and the ECC encoder 151 in FIG. 7 can maximize the effect of improving the reliability by selecting an optimum error mitigation coding rate in each page with reference to the device characteristic information 121 as described above.

As described above, in the present embodiment, in a case in which the error mitigation coding is applied to each page, the coding rate of the error mitigation is caused to change in accordance with the error characteristic of each page. Accordingly, according to the present embodiment, it is possible to improve the probability (FER) of the failure of the error correction in each page as compared with a case in which the common error mitigation coding rate is set in all pages. As a result, it is possible to implement the memory system capable of suppressing the occurrence of bit errors and enabling stable data reading.

Second Embodiment

Next, a second embodiment will be described. In the following description, for configurations and operations similar to those in the above embodiment, the configurations and the operations described above are referred to, and thus duplicate description will be omitted.

In the first embodiment, control is performed such that a sum of the data amount increased by the error mitigation coding and the data amount increased by the error correction coding is constant by changing the coding rate of the error correction as the coding rate of the error mitigation is caused to change in accordance with a characteristic of each page. On the other hand, in the second embodiment, as illustrated in FIG. 11, the coding rate of the error correction is caused to be constant in all pages, and a part of the error mitigation encoded data which is low in the coding rate of the error mitigation is arranged in a page which is high in the coding rate of the error mitigation.

In the example illustrated in FIG. 11, the coding rate of the error correction is caused to be constant in all pages, and parities $P_U$, $P_M$, and $P_L$ of the UPPER page, the MIDDLE page, and the LOWER page have the same parity length, but a data length of error mitigation encoded data $(D_L+D_L')$ of the LOWER page having the lowest coding rate of the error mitigation is larger than data lengths of error mitigation encoded data $D_U$ and $D_M$ of the other pages, that is, the MIDDLE page and the UPPER page.

In this regard, in the present embodiment, the error mitigation encoded data $D_L'$ of a part of the error mitigation encoded data $(D_L+D_L')$ of the longest LOWER page is arranged in, for example, the error mitigation encoded data $D_U$ of the shortest UPPER page. Accordingly, it is possible to equalize the error mitigation encoded data $(D_U+D_L')$, $D_M$, and $D_L$ which are actually stored in the UPPER page, the MIDDLE page, and the LOWER page.

The memory system according to the present embodiment may be similar to, for example, the memory system 1 described above with reference to FIG. 6 in the first embodiment, and one implementation form of the error mitigation code and the error correction code according to the present embodiment may be similar to, for example, one implementation form of the error mitigation code and the error correction code described above with reference to FIG. 7 in the first embodiment.

However, in the present embodiment, combinations of parity $P_U$, $P_M$, and $P_L$ stored in the UPPER page, the MIDDLE page, and the LOWER page and the error mitigation encoded data which are error correction targets of the respective parities are as follows:

$P_U$: $(D_U + D_L')$
$P_M$: $D_M$
$P_L$: $D_L$

According to the above combinations, the correction target of each parity protects the error mitigation encoded data written in the page to which the parity belongs.

Further, the read operations of the UPPER page, the MIDDLE page and the LOWER page are as follows.

<Read Operation on UPPER Page>

(1) $D_U$, $D_L'$, and $P_U$ are read, and the error correction is performed on $D_U$ and $D_L'$ using $P_U$. (2) The error mitigation decoding is performed on $D_U$ which has undergone the error mitigation, and restored user data is output.

<Read Operation on MIDDLE Page>

(1) $D_M$ and $P_M$ are read, and the error correction is performed $D_M$ using $P_M$. (2) The error mitigation decoding is performed on $D_M$ which has undergone the error correction, and restored user data is output.

<Read Operation on LOWER Page>

(1) $D_U$, $D_L'$, and $P_U$ are read, and the error correction is performed on $D_U$ and $D_L'$ using $P_U$. (2) $D_L$ and $P_L$ are read, and the error correction is performed on $D_L$ using $P_L$. (3) The error mitigation encoded data $(D_L + D_L')$ of the LOWER page by connecting $D_L$ and $D_L'$. (4) The error mitigation decoding is performed on the restored error mitigation encoded data $(D_L + D_L')$, and restored user data is output.

As described above, in the present embodiment, the read operation and the error correction corresponding to the two pages are necessary when the LOWER page is read, but there is an advantage that the coding rate of the error correction can be common to all pages. The other configurations, operations, and effects are similar to those in the above embodiments, and thus detailed description thereof is omitted here.

Third Embodiment

Next, a third embodiment will be described. In the following description, for configurations and operations similar to those in the above embodiment, the configurations and the operations described above are referred to, and thus duplicate description will be omitted.

In the third embodiment, similarly to the second embodiment, a part of the error mitigation encoded data is arranged in another page. Here, in the present embodiment, the combinations of the parities $P_U$, $P_M$, and $P_L$ stored in the UPPER page, the MIDDLE page, and the LOWER page and the error mitigation encoded data which is the error correction target of each parity is different from that in the second embodiment. In other words, in the present embodiment, the following combinations are used.

$P_U$: $D_U$
$P_M$: $D_M$
$P_L$: $(D_L + D_L')$

According to the above combinations, the parity length is common to all pages, but the coding rate of the error correction is different for each page. Further, in the present embodiment, it is possible to set the error correction necessary when the LOWER page is read to one page. The other configurations, operations, and effects are similar to those in the above embodiments, and thus detailed description thereof is omitted here.

Fourth Embodiment

Next, a fourth embodiment will be described. In the following description, for configurations and operations similar to those in the above embodiments, the configurations and the operations described above are referred to, and thus duplicate description will be omitted.

FIGS. 12A and 12B are diagrams for describing a relation between the error mitigation coding rate according to the first embodiment and the error mitigation coding rate according to the fourth embodiment. FIG. 12A is a diagram illustrating the error mitigation coding rate according to the first embodiment, and FIG. 12B is a diagram illustrating the error mitigation coding rate according to the fourth embodiment.

As illustrated in FIGS. 12A and 12B, in the first embodiment (see FIG. 12A) and the fourth embodiment (see FIG. 12B), the UPPER page, the MIDDLE page, and the LOWER page are equal in the data length of the error mitigation encoded data $D_U$, $D_M$, and $D_L$ and the parity lengths of the parities $P_U$, $P_M$, and $P_L$, but in the fourth embodiment, for example, a data amount stored per page before the error mitigation coding (referred to as a "logical data amount") is smaller than that in the first embodiment described above. Accordingly, in the present embodiment, the coding rate of the error mitigation of each page is lower than that in the first embodiment.

In the present embodiment, the coding rate of the error mitigation of each page is lowered by reducing the data amount stored per page before the error mitigation coding (the logical data amount) as described above. Accordingly, it is possible to further improve the reliability of the memory system. The other configurations, operations, and effects are similar to those in the above embodiments, and thus detailed description thereof is omitted here.

Fifth Embodiment

In the fourth embodiment, the example in which the coding rate of the error mitigation of each page is lowered by reducing the data amount stored per page before the error mitigation coding (the logical data amount) on the basis of the first embodiment has been described, but an embodiment serving as the basis is not limited to the first embodiment but may be, for example, the second or third embodiment or embodiments to be described later. Accordingly, it is possible to further improve the reliability of the memory system in each embodiment.

Sixth Embodiment

Next, a memory system according to a sixth embodiment will be described in detail with reference to the appended drawings. In the sixth embodiment, a more specific example of a method of changing the coding rate of the error mitigation between the pages described in the above embodiments will be described. Here, it is not intended that the method of changing the coding rate of the error mitigation between the pages according to the above embodiments is limited to methods to be described below. In the following description, for configurations and operations similar to those in the above embodiments, the configurations and the operations described above are referred to, and thus duplicate description will be omitted.

The memory system according to the present embodiment may be similar to, for example, the memory system 1 described above with reference to FIG. 6 in the first embodiment, and one implementation form of the error mitigation code and the error correction code according to the present embodiment may be similar to, for example, one implementation form of the error mitigation code and the error correction code described above with reference to FIG. 7 in the first embodiment. Here, in the present embodiment, the flow of the error mitigation coding is as follows. In the present embodiment, the memory cell of the non-volatile memory 20 is assumed to be an MLC.

In the sixth embodiment, write data of a write target (also referred to as an original data string) is divided into data crumbs having a certain fixed data length, and the error mitigation coding is performed in units of divided data crumbs. In this regard, in the error mitigation coding according to the present embodiment, first, a data length of a basic data crumb is decided, and then each of the UPPER page and the LOWER page are divided by an arbitrary integer (corresponding to a division number to be described below). In the present description, a data piece generated by the division is referred to as a sub data crumb. A data length of the sub data crumb is 1/integer (1 or more) of the data length of the basic data crumb. In a case in which the division number is 1, the encoding may not be performed. In this case, the error mitigation coding rate for the page is 1 as will be described in an eighth embodiment to be described later.

In the error mitigation coding according to the present embodiment, a flag is added to each sub data crumb. The flag is meta information indicating whether or not a corresponding sub data crumb undergoes data conversion and, for example, is a 1-bit flag. Therefore, for example, when the sub data crumb undergoes data conversion, "1" is set in the flag, whereas the sub data crumb does not undergo data conversion, "0" is set in the flag. Therefore, in the present embodiment, redundant data (flag data) corresponding to the number of bits corresponding to the division number to the sub data crumb is added to each page data. Accordingly, in the present embodiment, the coding rate of the error mitigation changes between the pages.

In the error mitigation coding according to the present embodiment, the error mitigation coding is executed in units of data crumbs. In the error mitigation coding, by using flags of all pages included in the data crumb, a data conversion candidate is generated for all combinations of whether or not each sub data crumb undergoes data conversion. The generation of the data conversion candidate will be described below with reference to FIGS. 13A to 15H.

FIGS. 13A and 13B are diagrams illustrating an example of a correspondence between a threshold voltage distribution of the PLC which is a 2-bit/cell and data coding. FIG. 13B illustrates the threshold voltage distribution of the PLC, and FIG. 13A illustrates an example of data coding associated with each distribution illustrated in FIG. 13B. Further, in FIG. 13B, a horizontal axis represents a threshold voltage, and a vertical axis represents the number of memory cells.

As illustrated in FIG. 13B, in the case of the MLC, as the threshold voltage distribution, there are four distributions, that is, a distribution Er, a distribution A, a distribution B, and a distribution C. The distribution Er is lowest in the threshold voltage and corresponds to a threshold voltage distribution in an erased state. The threshold voltage increases in the order of the distribution A, the distribution B, the distribution C. The distribution C is highest in the threshold voltage. In a case in which the MLC of the 2-bit/cell is used, a 2-bit data value is associated with the four threshold data distributions Er, A, B, and C. This correspondence is referred to as data coding. The data coding is decided in advance, and when data is written (programmed), charges are injected into each memory cell so that the threshold voltage distribution corresponds to the data value stored in accordance with the data coding.

In the case of the PLC, data (hereinafter referred to as word line data) stored in a memory cell group connected to one word line corresponds to data of two pages (hereinafter referred to as page data). Every two bits which can be stored in each memory cell correspond to one of the two pages. In the present embodiment, the two pages are referred to as a LOWER page and an UPPER page.

FIG. 13B is a diagram illustrating an example of the data coding. As illustrated in FIG. 13B, the distribution Er corresponds to a data value of "11," the distribution A corresponds to a data value of "01," the distribution B corresponds to a data value of "00," and the distribution C corresponds to a data value of "10." The data coding illustrated in FIG. 13B is an example, and the data coding is not limited to the example of FIG. 13B. A read voltage VA is set between the distribution Er and the distribution A, a read voltage VB is set between the distribution A and the distribution B, and a read voltage VC is set between the distribution B and the distribution C. VB indicates a read voltage for determining the data value of the LOWER page, and VA and VC indicate read voltages for determining the data value of the UPPER page. The data coding according to the present embodiment is not limited to the example illustrated in FIG. 13B, and various modifications are possible.

FIG. 14 is a diagram for describing the flow of dividing the word line data which is the write data in the present embodiment into units (sub data crumbs) smaller than the data crumb. As illustrated in FIG. 14, in the present embodiment, first, one or more data crumbs are generated by dividing the word line data with a certain fixed data length. Each data crumb includes page data of each of the UPPER page and the LOWER page. Then, in the present embodiment, the page data of each of the UPPER page and the LOWER page is divided into sub data crumbs. In this case, in the present embodiment, the division number is set to 1 or more. In the present embodiment, in order to enable each page data to be divided into sub data crumbs having an equal data length, the data length of the data crumb is set to an integral multiple of the division number. In the example illustrated in FIG. 14, the page data of the LOWER page is divided into two, and the page data of the UPPER page is divided into one.

Then, in the error mitigation coding according to the present embodiment, data conversion candidates which are equal in the number of patterns to combination patterns of flags to be added to respective sub data crumbs are virtually generated for the data crumb generated as illustrated in FIG. 14. Referring to the example of FIG. 14, one flag is set for the UPPER page which is divided into one (not divided), and a total of two flags are set for the LOWER page which is divided into two, that is, one flag is set for each of the two sub data crumbs. In other words, in the example illustrated in FIG. 14, a total of three flags are set. In this regard, in the present embodiment, one data conversion candidate is generated for each of bit patterns which can be obtained by a 3-bit flag (eight bit patterns in this description) as illustrated in FIGS. 15A to 15H.

FIGS. 15A to 15H illustrate examples in which each data conversion candidate is generated such that the data conversion (bit flipping) is performed on the page data corresponding to a flag of "1," and the data conversion is not converted on the page data corresponding to a flag of "0." Therefore, in the example illustrated in FIG. 15A, since all the flags are "0," the data conversion candidate is identical to the original write data. On the other hand, in the example illustrated in FIG. 15B, since a flag set in a sub data crumb #0 of the LOWER page is "1," the data conversion candidate in which a bit value of the sub data crumb #0 is flipped is generated. In FIGS. 15C to 15H, similarly, each data conversion candidate is generated by flipping a bit value of a sub data crumb whose flag is "1."

If the data conversion candidates are generated for all the combination patterns of flags as described above, in the error mitigation coding according to the present embodiment, one data conversion candidate is selected from the generated data conversion candidates in accordance with a selection rule prepared in advance.

Here, an example of the selection rule will be described. In the present embodiment, for example, one data conversion candidate is selected from the generated data conversion candidates in accordance with the following selection rules (1) and (2). (1) A conversion candidate in which the number of locations at which the distribution Er and the distribution C are adjacent is smallest is selected. In other words, a conversion candidate in which the number of adjacent data patterns in which an EtoA error is likely to occur is smallest is selected. (2) If there are a plurality of conversion candidates satisfying the condition of (1), a conversion candidate which is largest in the number of distributions Er is selected. In other words, a conversion candidate which is owner in a degree of fatigue given to the cell is selected.

This selection rule is merely an example, and any other selection rule may be employed. For example, in order to further reduce the degree of fatigue given to the cell, selecting a conversion candidate in which the distribution C having the highest threshold voltage is smaller may be set as a first condition of the selection rule. In other words, it is important to select the best condition from a plurality of candidates, and content of the selection rule may be transformed into other various forms in accordance with a characteristic of a target memory.

Further, in the error mitigation coding according to the present embodiment, the flag data including the flag bit for each sub data crumb added to the data conversion candidate selected in accordance with the selection rule. Therefore, in the present embodiment, a data amount of the flag data is a value which changes in accordance with the number of sub data crumbs in each data crumb. Further, data content of the flag data is set so that the selected data conversion candidate indicates a sub data crumb converted to original write data. In other words, in the present embodiment, the flag data illustrated in FIGS. 15A to 15H are added to the selected data conversion candidate.

In the error mitigation coding according to the present embodiment, the above processing is executed for all the data crumbs. Therefore, the flag data is included in the data written in the non-volatile memory 20.

Figure 16:
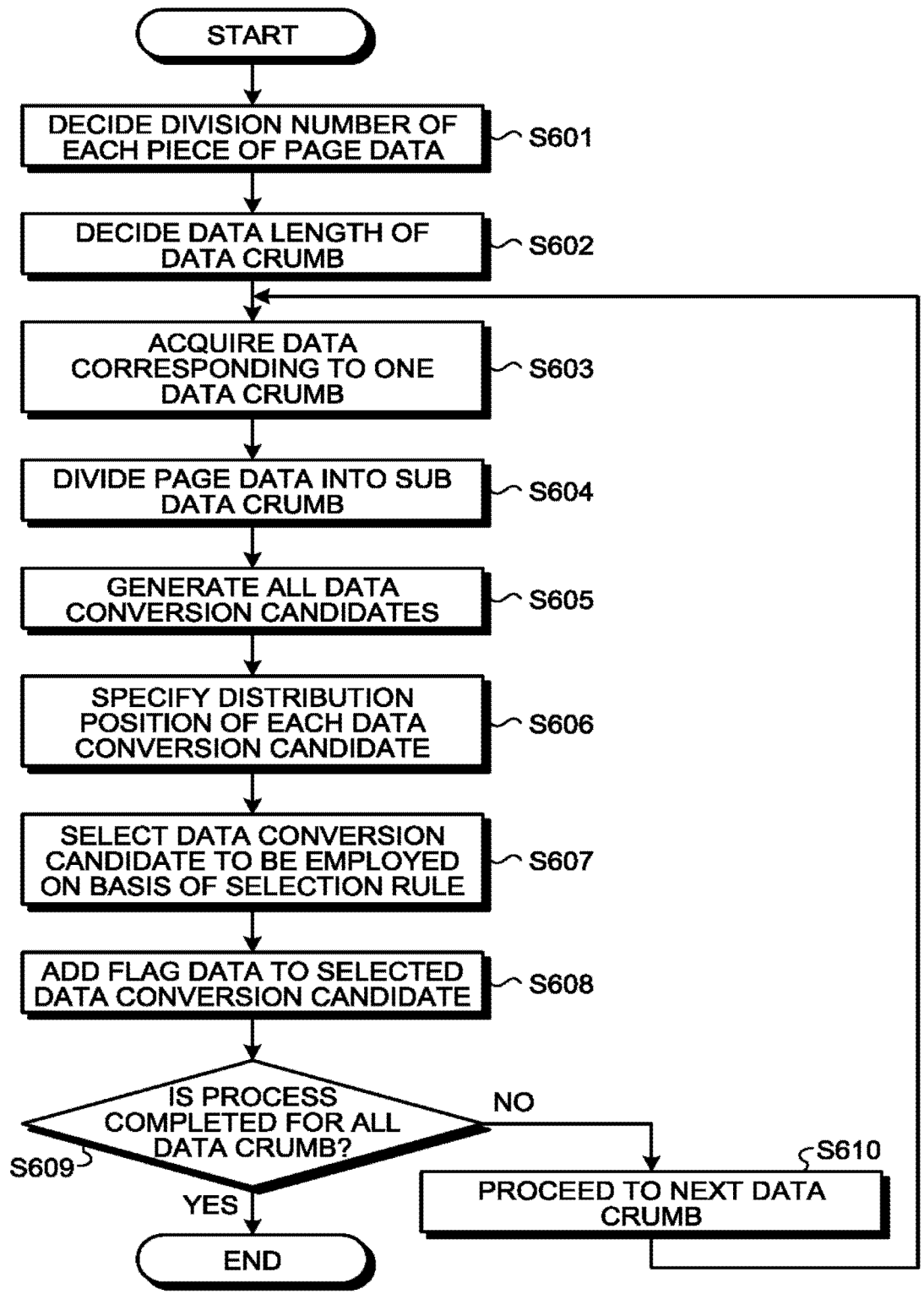
FIG. 16 is a flowchart illustrating an example of a further detailed flow of error mitigation coding according to the sixth embodiment.

Next, a further detailed flow of the error mitigation coding according to the present embodiment will be described with reference to the configuration illustrated in FIG. 6 and the flowchart illustrated in FIG. 16. As illustrated in FIG. 16, in the error mitigation coding, first, the signal processing circuit 16 decides the division number of each of the page data of the UPPER page and the page data of the LOWER page on the basis of, for example, device characteristic information (corresponding to the device characteristic information 121 in FIG. 7) (Step S601). Then, the signal processing circuit 16 decides the data length of the data crumb on the basis of the division number of each piece of page data decided in Step S601 (Step S602). For example, the signal processing circuit 16 decides the data length to be a multiple of a least common multiple of the division number for dividing each piece of page data. In this case, in the example illustrated in FIGS. 13A to 15H, since the division number of the UPPER page is 1, and the division number of the LOWER page is 2, the data length is 2 which is a multiple of a least common multiple 1 and 2.

Then, the signal processing circuit 16 acquires data equivalent to one data crumb from, for example, the write data accumulated in the RAM 12 (see FIG. 6) (Step S603), and divides the page data of each page of the acquired data crumb into the sub data crumbs corresponding to the division number decided in Step S601 (Step S604). Then, the signal processing circuit 16 appropriately performs the data conversion (bit flipping) on each sub data crumb and generates all the data conversion candidates for the data crumb (Step S605).

Then, the signal processing circuit 16 specifies a distribution position of each data conversion candidate (Step S606). Specifically, for example, in the case of the data conversion candidate illustrated in FIG. 15A, since the data crumbs are "11," "10," "10," "00," "00," "01," "01," and "11," the signal processing circuit 16 specifies distribution positions of the distribution A, the distribution C, the distribution C, the distribution B, the distribution B, the distribution A, the distribution A, and the distribution Er, and stores the distribution positions in association with memory cell number. The memory cell number is, for example, a memory cell number assigned in association with to a bit line to which each memory cell is connected.

Then, the signal processing circuit 16 selects one of the data conversion candidates generated in Step S605 on the basis of the specified distribution position and the selection rule prepared in advance (Step S607). Then, the signal processing circuit 16 adds a combination of flags used to generate the data conversion candidate to the selected data conversion candidate as the flag data Step S608). Accordingly, the error mitigation code for the data crumb acquired in Step S603 is generated.

Thereafter, the signal processing circuit 16 determines whether or not the error mitigation coding is completed for all the data crumbs (Step S609), and when the error mitigation coding is completed for all the data crumbs (YES in Step S609), the present operation ends. On the other hand, when the error mitigation coding is not completed for any one of the data crumbs (NO in Step S609), the signal processing circuit 16 proceeds to the next data crumb (Step S610), returns to Step S603, and executes a subsequent operation.

Then, the suppression decoding according to the present embodiment will be described. In the error mitigation decoding according to the present embodiment, basically, a reverse procedure of the error mitigation coding described above, that is, reverse conversion of the data conversion executed by the error mitigation coding is executed. Here, in the error mitigation decoding according to the present embodiment, reading of data from a page including data of a read target in non-volatile memory 20 is executed. It is because, when the error mitigation coding is performed, it is necessary to deal all pieces of page data in the word line collectively and specify each distribution position, but when the error mitigation decoding is performed, all pieces of page data in the word line are not required. In the error mitigation coding, the write data is divided into units having a certain fixed data length, and the error mitigation coding is executed in units of divided data crumbs, whereas in the error mitigation decoding, the error mitigation decoding is executed in units of sub data crumbs. Here, as an arrangement of the data crumb and the flag, an arrangement decided at the error mitigation coding is used without change.

As described in the description of the error mitigation coding, the flag data indicates whether or not the original data is flipped at the time of the error mitigation coding in units of sub data crumbs and units of pages. Therefore, at the time of the error mitigation decoding, it is possible to determine whether or not data is flipped in units of sub data crumbs on the basis of the content of the flag data.

Then, a further detailed flow of the error mitigation decoding according to the present embodiment will be described with reference to the configuration illustrated in FIG. 6 and the flowchart illustrated in FIG. 17. In the present operation, data input to the signal processing circuit 16 may be data read which is directly from the non-volatile memory 20 or may be data which is read from the non-volatile memory 20 and temporarily stored in the RAM 12.

Figure 17:
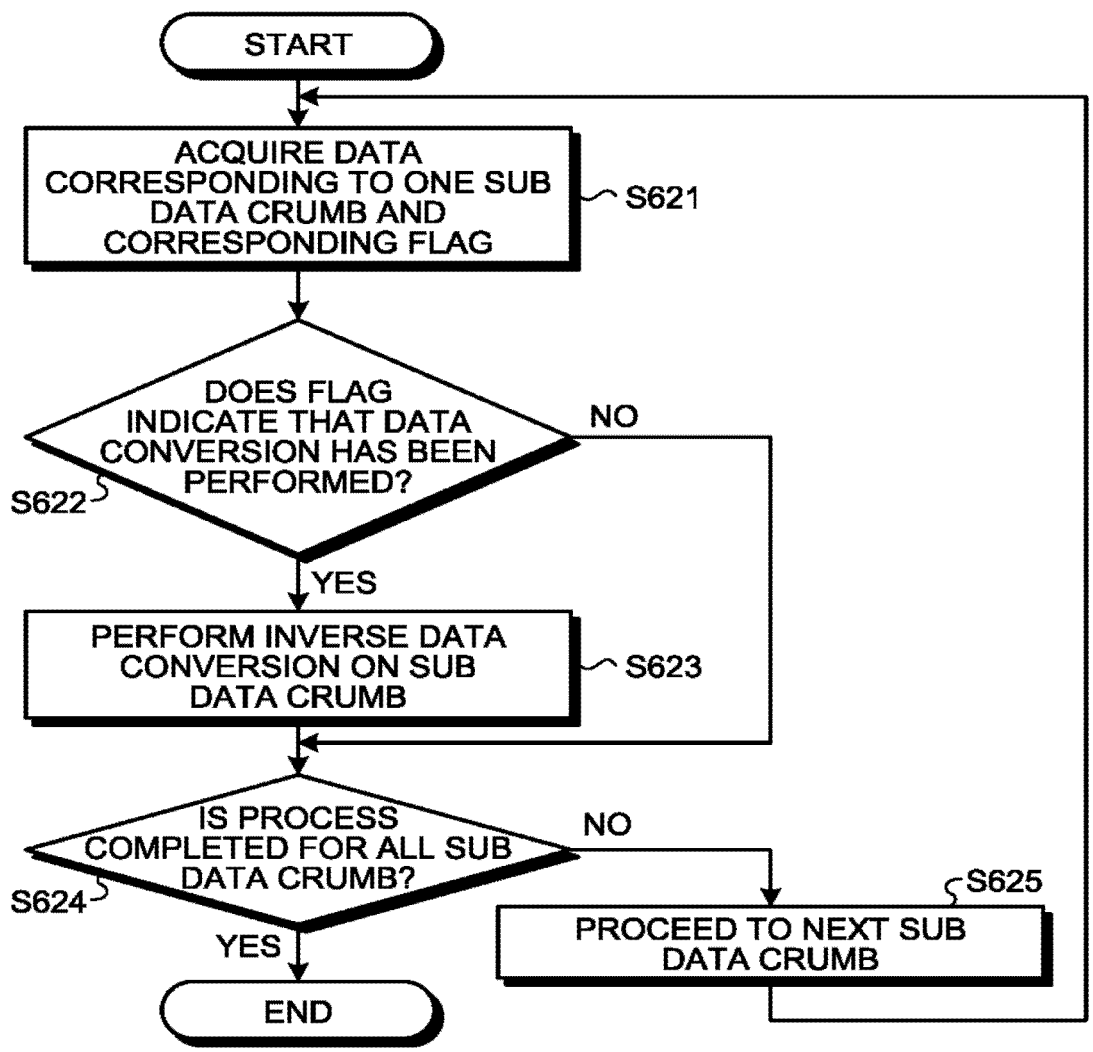
FIG. 17 is a flowchart illustrating an example of a further detailed flow of error mitigation decoding according to the sixth embodiment.

As illustrated in FIG. 17, in the error mitigation decoding, first, the signal processing circuit 16 acquires data corresponding to one sub data crumb and a flag corresponding to the sub data crumb from the non-volatile memory 20 or the RAM 12 (Step S621). Then, the signal processing circuit 16 determines whether or not the acquired flag indicates that "data conversion" has been performed on the sub data crumb (Step S622). In the examples illustrated in FIGS. 15A to 15H, in a case in which the flag is "0," it indicates that "no data conversion" has been performed on the sub data crumb, and in a case in which the flag is "1," it indicates that "data conversion" has been performed on the sub data crumb.

When the flag indicates that "data conversion" has been performed (YES in Step S622), the signal processing circuit 16 performs data conversion for solving the performed data conversion (referred to as "inverse data conversion") on the sub data crumb acquired in Step S621 (Step S623), and proceeds to Step S624. On the other hand, when the flag indicates that "no data conversion" has been performed (NO in Step S622), the signal processing circuit 16 skips Step S623 and proceeds to Step S624. In a case in which the data conversion is bit flipping, the inverse data conversion may similarly be bit flipping.

In Step S624, the signal processing circuit 16 decides whether or not the execution of the above operation is completed for all the sub data crumbs constituting the data of the read target, and when the execution of the above operation is completed (YES in Step S624), the signal processing circuit 16 ends the present operation. On the other hand, when the execution of the above operation is not completed for any one of the sub data crumbs constituting the data of the read target (NO in Step S624), the signal processing circuit 16 shifts the processing target to the next sub data crumb (Step S625), then returns to Step S621, and executes a subsequent operation.

As described above, according to the present embodiment, it is possible to independently change the error mitigation coding rate for each page by controlling the division number of the page data of each page. Accordingly, according to the present embodiment, it is possible to implement the memory system capable of suppressing the occurrence of bit errors and enabling stable data reading.

In the above example, an independent calculation is performed for each data crumb in both the error mitigation coding and the error mitigation decoding. Therefore, in an actual implementation of the error mitigation code, both an implementation form in which calculations are performed in series for each data crumb and an implementation form in which calculations are performed in parallel for a plurality of data crumbs are possible.

Further, for the arrangement of the flag data, various modifications such as a configuration in which data and a flag are collectively arranged or a configuration in which data and a flag are dispersed over the entire data length and arranged can be made.

Further, in the present embodiment, the example in which each of the UPPER page and the LOWER page is divided into sub data crumbs has been described, but the present embodiment is not limited to such an example, and for example, a configuration in which the error mitigation coding is not performed for one of pages may be provided.

Further, in the present embodiment, the bit flipping has been described as an example of the data conversion, but data conversion other than the bit flipping can also be applied. For example, an XOR operation for calculating an exclusive OR of a predetermined fixed pattern and a sub data crumb, interleaving for rearranging bits in accordance with a predetermined rule, or the like can be used as the data conversion.

Further, as long as the selection rule for the data conversion candidate according to the present embodiment is a selection rule capable of selecting a data conversion candidate with a good condition (preferably, a data conversion candidate with the best condition) from among a plurality of data conversion candidates, the selection rule is not limited to the selection rule described above, and various modifications can be made. For example, the selection rule may be appropriately changed in accordance with the characteristic of the target non-volatile memory 20.

The other configurations, operations, and effects are similar to those in the above embodiments, and thus detailed description thereof is omitted here.

Seventh Embodiment

In the sixth embodiment described above, the example in which the memory cell of the non-volatile memory 20 is the PLC has been described. On the other hand, in a seventh embodiment, an example in which the memory cell of the non-volatile memory 20 is the TLC will be described. In the following description, for configurations and operations similar to those in the above embodiments, the configurations and the operations described above are referred to, and thus duplicate description will be omitted.

Similarly to the sixth embodiment, a memory system according to the seventh embodiment may be the memory system 1 described above with reference to FIG. 6 in the first embodiment, and one implementation form of the error mitigation code and the error correction code according to the present embodiment may be similar to, for example, one implementation form of the error mitigation code and the error correction code described above with reference to FIG. 7 in the first embodiment. Further, the flows of the error mitigation coding and the error mitigation decoding according to the present embodiment may basically similar to the flows according to the sixth embodiment. The error mitigation coding and the error mitigation decoding according to the present embodiment will be described below in further detail.

First, the error mitigation coding according to the present embodiment will be described. FIGS. 18A and 18B are diagrams illustrating an example of a correspondence between the threshold voltage distribution of the TLC which is a 3-bit/cell and data coding. FIG. 18B illustrates the threshold voltage distribution of the TLC, and FIG. 18A illustrates an example of data coding associated with each distribution illustrated in FIG. 18B. Further, in FIG. 18B, a horizontal axis represents a threshold voltage, and a vertical axis represents the number of memory cells.

As illustrated in FIGS. 18A and 18B, in the case of the TLC, similarly to the case of the MLC (see FIGS. 13A and 13B), the write data is divided into units having a certain fixed data length, and the error mitigation coding is executed in units of divided data crumbs. In the error mitigation coding, the data length of the basic data crumb is decided, and then the page data of each of the UPPER page, the MIDDLE page, and the LOWER page is divided by an arbitrary integer, so that each piece of page data is divided into one or more sub data crumbs.

FIG. 19 is a diagram for describing a flow of dividing the word line data according to the present embodiment into sub data crumbs. As illustrated in FIG. 19, in the present embodiment, first, one or more data crumbs are generated by dividing the word line data with a certain fixed data length. Each data crumb includes the page data of each of the UPPER page, the MIDDLE page, and the LOWER page. In the present embodiment, the page data of each of the UPPER page, the MIDDLE page, and the LOWER page is divided into sub data crumbs. At this time, similarly to the sixth embodiment, in the present embodiment, the division number of each piece of page data is set to 1 or more. Further, in order to enable each page data to be divided into sub data crumbs having an equal data length, the data length of the data crumb, is set to an integral multiple of the division number. In the example illustrated in FIG. 19, the page data of the LOWER page is divided into four, the page data of the MIDDLE page is divided into two, and the page data of the UPPER page is divided into one.

Further, in the present embodiment, similarly to the operation described above with reference to FIGS. 15A to 15H in the sixth embodiment, one data conversion candidate is generated for each of bit patterns (128 bit patterns in this description) which can be obtained by flags which are equal in number to the sub data crumbs (a 7-bit flag in this description). Then, one data conversion candidate is selected from the generated 128 data conversion candidates in accordance with the selection rule prepared in advance. Then, similarly to the sixth embodiment, the flag data is added to the data conversion candidate selected in accordance with the selection rule, and encoded data which has undergone the error mitigation coding is generated.

Next, the error mitigation decoding according to the present embodiment will be described. In the error mitigation decoding according to the present embodiment, basically, a reverse procedure of the error mitigation coding described above is executed, similarly to the error mitigation decoding according to the sixth embodiment. In other words, data reading is executed only on the page including data of a read target. Then, inverse data conversion is performed on all necessary sub data crumbs on the basis of the arrangement of the original data string and the flag at the time of error mitigation coding and the data content.

As described above, according to the present embodiment, even in a case in which the memory cell of the non-volatile memory 20 is the TLC, similarly to the sixth embodiment, it is possible to independently change the error mitigation coding rate by controlling the division number of the page data of each page. Accordingly, according to the present embodiment, it is possible to implement the memory system capable of suppressing the occurrence of bit errors and enabling stable data reading.

The other configurations, operations, and effects are similar to those in the above embodiments, and thus detailed description thereof is omitted here.

Eighth Embodiment

In an eighth embodiment, an example in which the memory cell of the non-volatile memory 20 is the QLC is exemplified. In the following description, for configurations and operations similar to those in the above embodiments, the configurations and the operations described above are referred to, and thus duplicate description will be omitted.

Similarly to the sixth and seventh embodiments, a memory system according to the eighth embodiment may be similar to the memory system 1 described above with reference to FIG. 6 in the first embodiment, and one implementation form of the error mitigation code and the error correction code according to the present embodiment may be similar to, for example, one implementation form of the error mitigation code and the error correction code described above with reference to FIG. 7 in the first embodiment. Further, the flows of the error mitigation coding and the error mitigation decoding according to the present embodiment may basically similar to the flows according to the sixth and seventh embodiments. The error mitigation ding and the error mitigation decoding according to the present embodiment will be described below in further detail.

Figures 20A, 20B:
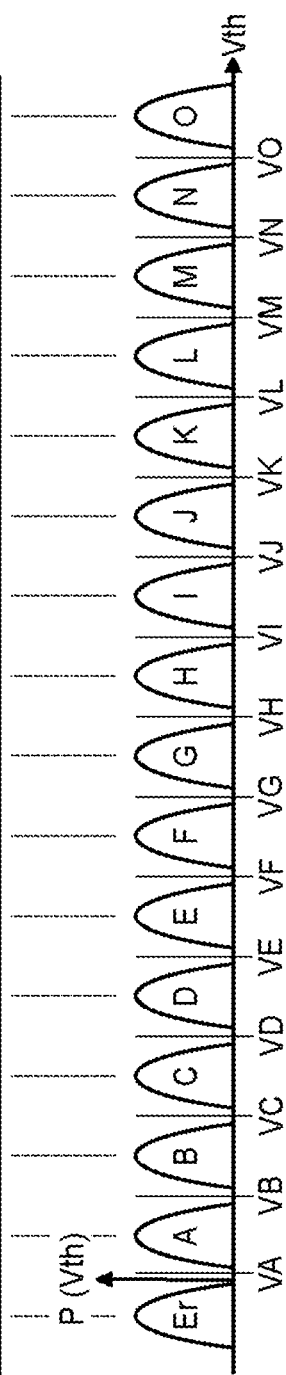
FIGS. 20A and 20B are diagrams illustrating an example of a correspondence between a threshold voltage distribution of a QLC and data coding according to the eighth embodiment.

First, the error mitigation coding according to the present embodiment will be described. FIGS. 20A and 20B are diagrams illustrating an example of a correspondence between the threshold voltage distribution of the QLC which is a 4-bit/cell and data coding. FIG. 20B illustrates the threshold voltage distribution of the QLC, and FIG. 20A illustrates an example of data coding associated with distribution illustrated in FIG. 20B. Further, in FIG. 20B, a horizontal axis represents a threshold voltage, and a vertical axis represents the number of memory cells.

As illustrated in FIGS. 20A and 20B, in the case of the QLC, similarly to the case of the MLC and the TLC (see FIGS. 13A, 13B, 18A and 18B), the write data is divided into units having a certain fixed data length, and the error mitigation coding is executed in units of divided data crumbs. In the error mitigation coding, the data length of the basic data crumb is decided, and then the page data of each of the TOP page, the UPPER page, the MIDDLE page, and the LOWER page is divided by an arbitrary integer, so that each piece of page data is divided into one or more sub data crumbs.

Figure 21:
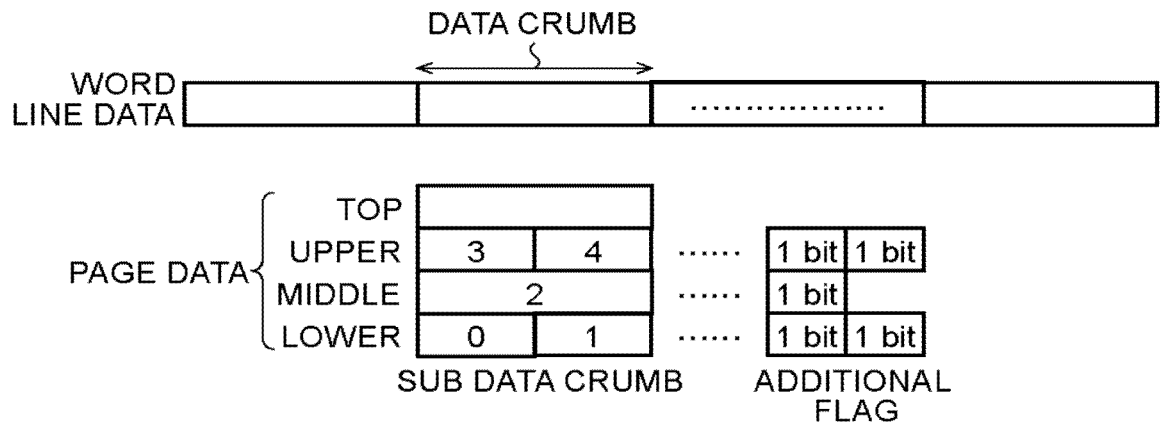
FIG. 21 is a diagram for describing the flow of dividing word line data into sub data crumbs according to the eighth embodiment.

FIG. 21 is a diagram for describing a flow of dividing the word line data according to the present embodiment into sub data crumbs. As illustrated in FIG. 21, in the present embodiment, first, one or more data crumbs are generated by dividing the word line data with a certain fixed data length.

Each data crumb includes the page data of each of the TOP page, the UPPER page, the MIDDLE page, and the LOWER page.

In this regard, in the present embodiment, an example in which the error mitigation coding is performed on the UPPER page, the MIDDLE page, and the LOWER page excluding the TOP page from the target of the error mitigation coding. In this case, the page data of each of the UPPER page, the MIDDLE page, and the LOWER page excluding the TOP page is divided into sub data crumbs. At this time, similarly to the sixth and seventh embodiments, in the present embodiment, the division number of each piece of page data is set to 1 or more.

Further, in order to enable each page data to be divided into sub data crumbs having an equal data length, the data length of the data crumb is set to an integral multiple of the division number. In the example illustrated in FIG. 21, the page data of the LOWER page is divided into two, the page data of the MIDDLE page is divided into one, and the page data of the UPPER page is divided into two.

Further, in the present embodiment, similarly to the operation described above with reference to FIGS. 15A to 15H in the sixth and seventh embodiments, one data conversion candidate is generated for each of bit patterns (32 bit patterns in this description) which can be obtained by flags which are equal in number to the sub data crumbs (a 5-bit flag in this description). Then, one data conversion candidate is selected from the generated 32 data conversion candidates in accordance with the selection rule prepared in advance. Then, similarly to the sixth and seventh embodiments, the flag data is added to the data conversion candidate selected in accordance with the selection rule, and encoded data which has undergone the error mitigation coding is generated.

Next, the error mitigation decoding according to the present embodiment will be described. In the error mitigation decoding according to the present embodiment, basically, a reverse procedure of the error mitigation coding described above is executed, similarly to the error mitigation decoding according to the sixth and seventh embodiments. In other words, data reading is executed only on the page including data of a read target. Then, inverse data conversion is performed on all necessary sub data crumbs on the basis of the arrangement of the original data string and the flag at the time of error mitigation coding and the data content.

As described above, according to the present embodiment, even in a case in which the memory cell of the non-volatile memory 20 is the QLC, similarly to the sixth and seventh embodiments, it is possible to independently change the error mitigation coding rate by controlling the division number of the page data of each page. Accordingly, according to the present embodiment, it is possible to implement the memory system capable of suppressing the occurrence of bit errors and enabling stable data reading.

The other configurations, operations, and effects are similar to those in the above embodiments, and thus detailed description thereof is omitted here.

Ninth Embodiment

Then, a ninth embodiment will be described. The ECC circuit 15 (see FIG. 6) for executing the error correction is installed in the memory system using the non-volatile memory 20 as described in the above embodiments. In this regard, in the present embodiment, the operation of the memory system 1 (see FIG. 6) including the signal processing circuit 16 and the ECC circuit 15 for executing the error mitigation will be described in detail with reference to the appended drawings.

A memory system in accordance with the ninth aspect may be similar to the memory system 1 described above with reference to FIG. 6 in the above embodiment. Further, the flow in any one of the above embodiments may be applied as the flows of the error mitigation coding and the error mitigation decoding according to the present embodiment.

Figure 22:
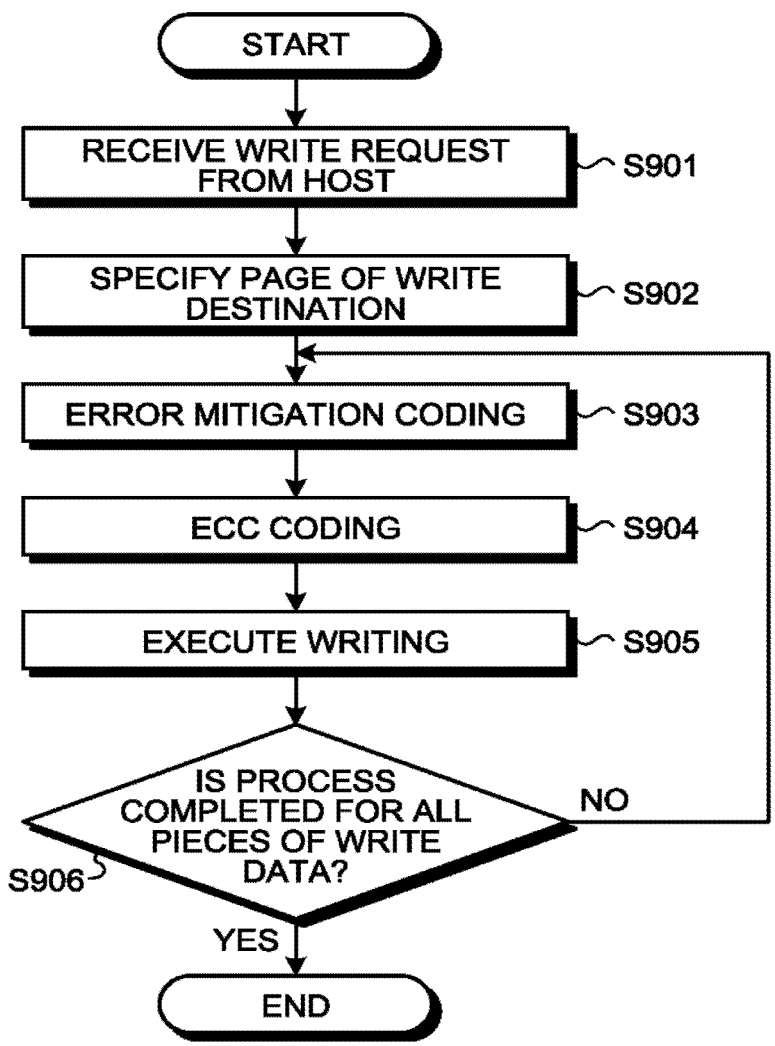
FIG. 22 is a flowchart illustrating an example of a write operation according to a ninth embodiment.

FIG. 22 is a flowchart illustrating an example of a write operation according to the present embodiment. As illustrated in FIG. 22, in the write operation according to the present embodiment, the processor 11 serving as a control unit first receives a write request from the host 30 via the host I/F 17 (Step S901). Then, the processor 11 specifies a physical address indicating a page of a write destination from a logical address included in the write request using an address translation table (not illustrated) (Step S902). Further, the data (write data) of the write target included in the write request together with the logical address is temporarily held in the RAM 12, for example.

Then, the processor 11 instructs the signal processing circuit 16 to execute the error mitigation coding. At this time, since the writing to the non-volatile memory 20 is executed in units of word lines, the processor 11 instructs the signal processing circuit 16 to execute the error mitigation coding on the write data corresponding to one piece of word line data in the RAM 12. On the other hand, the signal processing circuit 16 acquires one piece of word line data from the RAM 12 and executes the error mitigation coding described in the above embodiment on the acquired word line data (Step S903). The data obtained by the error mitigation coding (hereinafter referred to as error mitigation encoded data) is stored in, for example, the RAM 12 again.

Then, the processor 11 instructs the ECC circuit 15 to execute the ECC coding on the error mitigation encoded data stored in the RAM 12. On the other hand, the ECC circuit 15 acquires the error mitigation encoded data from the RAM 12 and executes the ECC coding on the acquired error mitigation encoded data (Step S904). The ECC coding is executed in units of ECC frames. The ECC frame will be described later.

Further, the processor 11 instructs the memory I/F 18 to write the ECC frame generated through the ECC coding by the ECC circuit 15 in the non-volatile memory 20. On the other hand, the memory I/F 18 transfers the ECC frame input from the ECC circuit 15 to the non-volatile memory 20, and instructs a command processing unit (not illustrated) in the non-volatile memory 20 to write the ECC frame to the physical address. Accordingly, the writing of the ECC frame to the physical address is executed in the non-volatile memory 20 (Step S905).

Thereafter, the processor 11 determines whether or not the process is completed for all pieces of write data in the RAM 12 (Step S906), and when the process is completed for all pieces of write data in the RAM 12 (YES in Step S906), the processor 11 ends the present operation. On the other hand, when the process is not completed for any one piece of write data in the RAN 12 (NO in Step S906), the processor 11 returns to Step S903 and executes a subsequent process on the next word line data.

In the write operation illustrated in FIG. 22, the error mitigation coding is first executed, and then the ECC coding is executed in order to protect the entire data including the flag data as well as the data crumb through the error correction code. In other words, when an error occurs in the flag data, the entire sub data crumb which has undergone the data conversion is determined to have an error on the basis of an error flag, and thus an error rate is amplified. In this regard, in the present embodiment, the ECC coding is executed on the error mitigation encoded data, so that the entire data including the flag data as well as the data crumb is protected through the error correction code.

Figure 23:
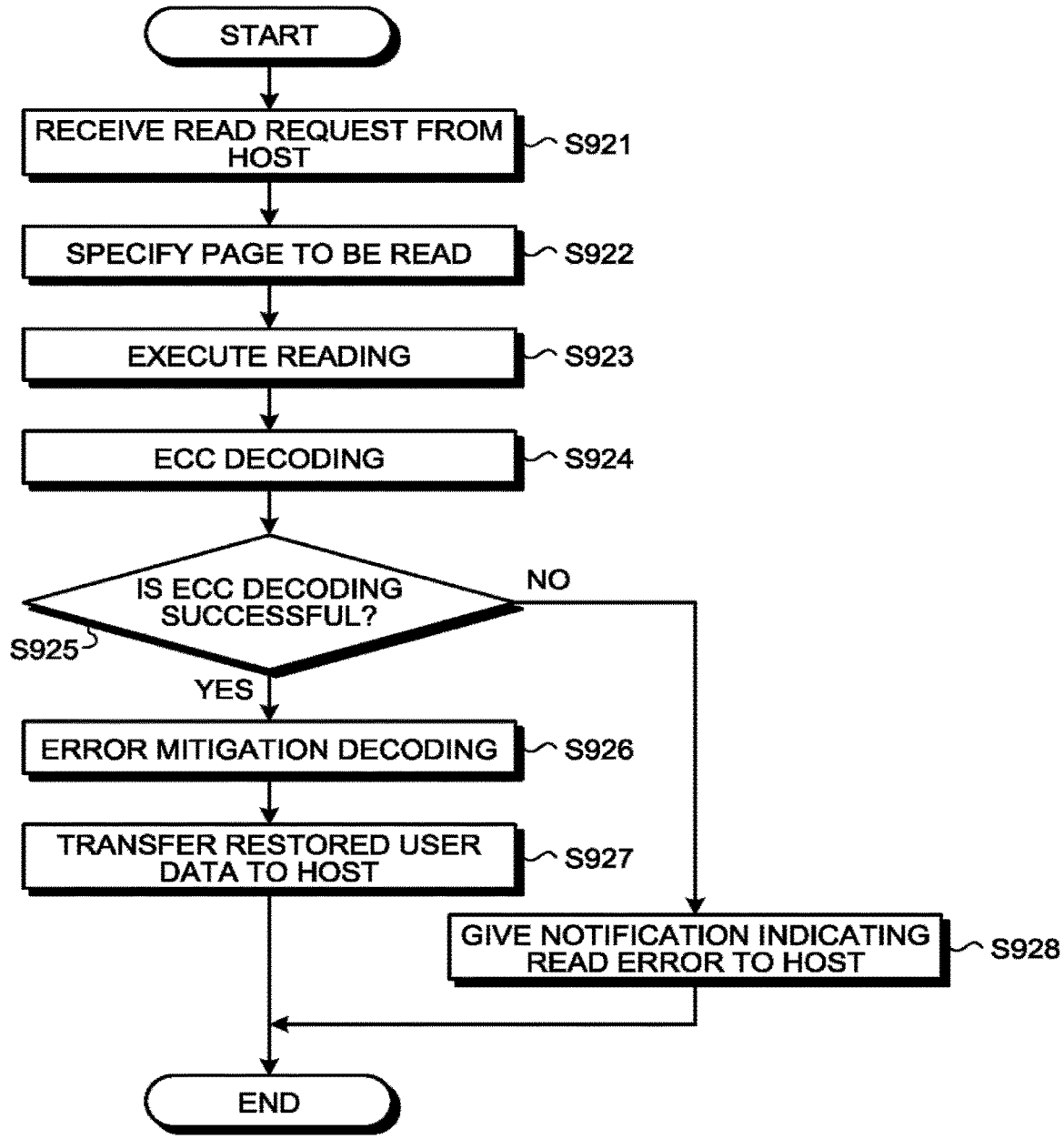
FIG. 23 is a flowchart illustrating an example of a read operation according to the ninth embodiment.

Next, a read operation according to the present embodiment will be described in detail with reference to the appended drawing. FIG. 23 is a flowchart illustrating an example of the read operation according to the present embodiment. As illustrated in FIG. 23, in the read operation according to the present embodiment, first, the processor 11 receives a read request from the host 30 via the host I/F 17 (Step S921). Then, the processor 11 specifies a physical address indicating a page of a read destination from a logical address included in the read request using an address translation table (not illustrated) (Step S922). Then, the processor 11 instructs the memory I/F 18 to read data from the specified physical address. On the other hand, the memory I/F 18 instructs the command processing unit (not illustrated) in the non-volatile memory 20 to read data from the designated physical address. Accordingly, the reading of the data from the physical address is executed in the non-volatile memory 20 (Step S923).

The read data read by the memory I/F 18 is first input to the ECC circuit 15. In response to the instruction from the processor 11, the ECC circuit 15 executes the ECC decoding on the input read data (Step S924). The data which has undergone the error correction through the ECC decoding by the ECC circuit 15 is stored in, for example, the RAM 12.

Then, the processor 11 determines whether or not the ECC decoding by the ECC circuit 15 is successful (Step S925), and when the ECC decoding not successful (NO in Step S925), the processor 11 transmits a read error to the hoses 30 via the host I/F 17 (Step S928) and ends the present operation. On the other hand, when the ECC decoding is successful (YES in Step S925), the processor 11 instructs the signal processing circuit 16 to execute the error mitigation decoding on the data which has undergone the error correction through the ECC decoding by the ECC circuit 15 (hereinafter referred to as error corrected data). On the other hand, the signal processing circuit 16 executes the error mitigation decoding described in the above embodiment on the error corrected data stored in the RAM 12 (Step S926). The user data restored by the error mitigation decoding is again stored in, for example, the RAM 12.

Thereafter, the processor 11 transfers the user data restored the RAM 12 to the host 30 via the host I/F 17 (Step S927) and ends the present operation.

As described above, in the read operation according to the present embodiment, the data is read in units of pages, and the error correction decoding is executed after the ECC decoding is performed on the read data.

Figure 24:
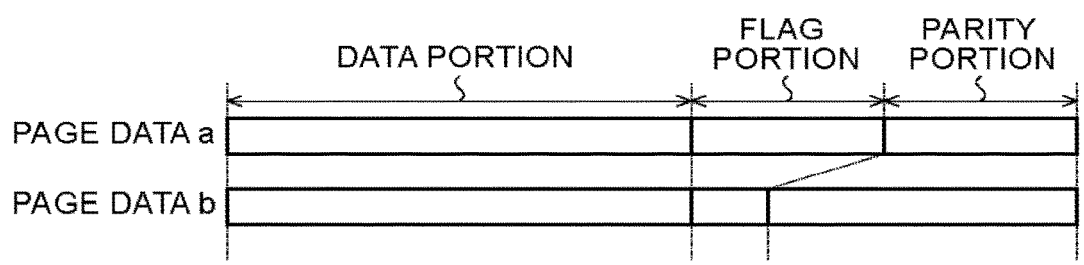
FIG. 24 is a diagram illustrating a schematic configuration example of an ECC frame according to the ninth embodiment.

Next, the ECC frame according to the present embodiment will be described in detail with reference to the appended drawing. FIG. 24 is a diagram illustrating a schematic configuration example of the ECC frame according to the present embodiment. Here, the ECC frame is a unit of data when the ECC coding and the ECC decoding are executed. In general, the page length of the non-volatile memory 20 is fixed, but in the sixth to eighth embodiments described above, the data size of the flag differs for each page depending on the division number of the sub data crumb. In this regard, as illustrated in FIG. 24, in the present embodiment, the error correction coding rate is adjusted so that a total data amount of a data portion storing the user data to undergo the ECC coding, flag data added by the error mitigation coding, and an ECC parity portion storing a parity added by the ECC coding is constant.

As described above, according to the present embodiment, it is possible to implement the memory system capable of enabling more stable data reading by combining the error mitigation code and the error correction code.

The other configurations, operations, and effects are similar to those in the above embodiments, and thus detailed description thereof is omitted here.

Tenth Embodiment

Next, a memory system according to a tenth embodiment will be described in detail with reference to the appended drawings. In the present embodiment, a multi-dimensional error correction code is used as the ECC code in the above embodiment. The multi-dimensional error correction code refers to a code in which a symbol which is at least one or more constituent units of the ECC code is protected in a multiple manner through a plurality of smaller component codes. In this case, one symbol includes, for example, an element of an alphabet such as one bit (an element of a binary field) or a finite field other than a binary field. In the following description, the product code will be described as a specific example of the multi-dimensional error correction code. However, the multi-dimensional error correction code is not limited to the product code, and various multi-dimensional error correction codes can be used.

Figure 25:
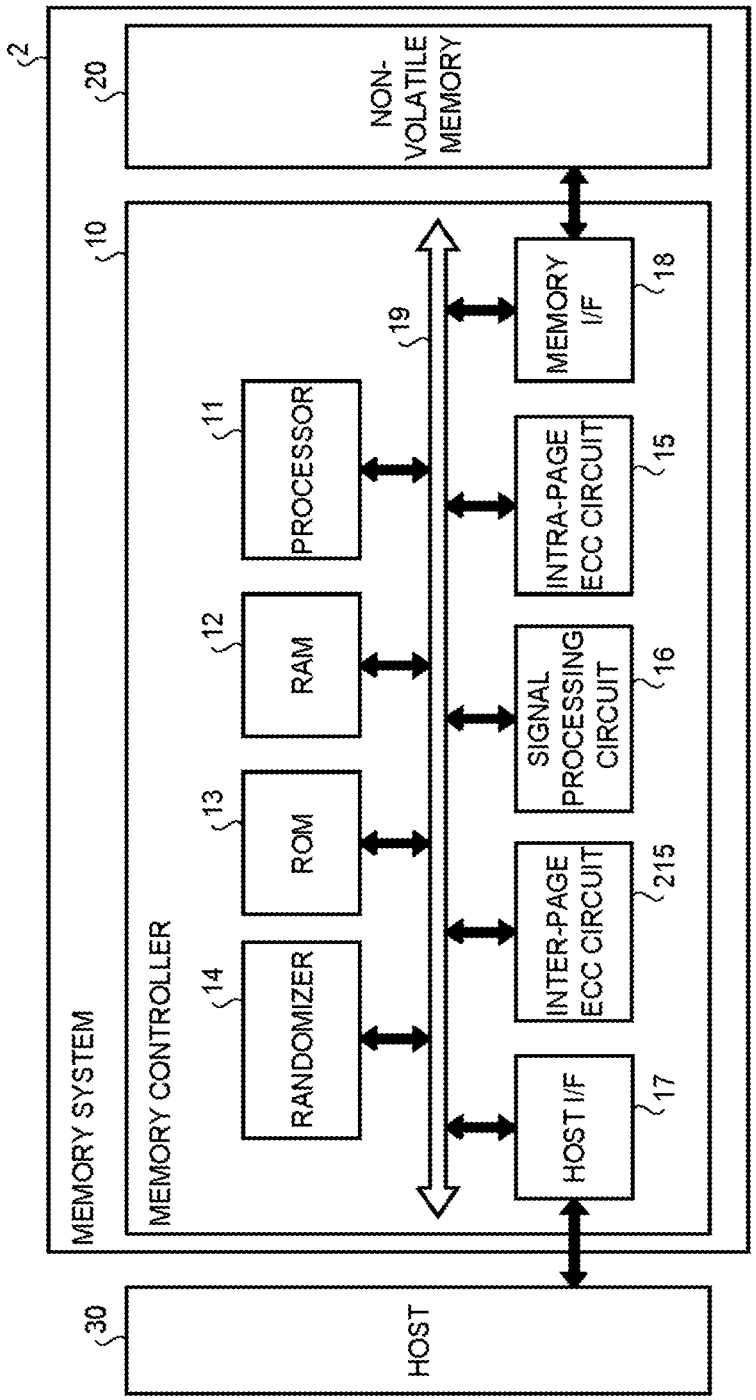
FIG. 25 is a block diagram illustrating a schematic configuration example of a memory system according to a tenth embodiment.

FIG. 25 is a block diagram illustrating a schematic configuration example of the memory system according to the present embodiment. As illustrated in FIG. 25, a memory system 2 according to the present embodiment further includes, for example, an inter-page ECC circuit 215 in addition to a configuration similar to that of the memory system 1 described above with reference to FIG. 6 in the first embodiment. In other words, the memory system according to the present embodiment includes the ECC circuit 15 that executes the ECC coding/decoding on each piece of page data as the ECC frame and the inter-page ECC circuit 215 that executes the ECC coding/decoding on the product code configured with a plurality of pieces of page data in an inter-page direction. In the present embodiment, the ECC circuit 15 is referred to as an intra-page ECC circuit 15, the ECC coding/decoding by the intro-page ECC circuit 15 is referred to as ECC1 coding/decoding, and a parity generated by the ECC1 coding/decoding is referred to as an ECC1 parity. The ECC coding/decoding by the inter-page ECC circuit 215 is referred to as ECC2 coding/decoding, and the parity generated by the ECC2 coding/decoding is referred to as an ECC2 parity.

Figure 26:
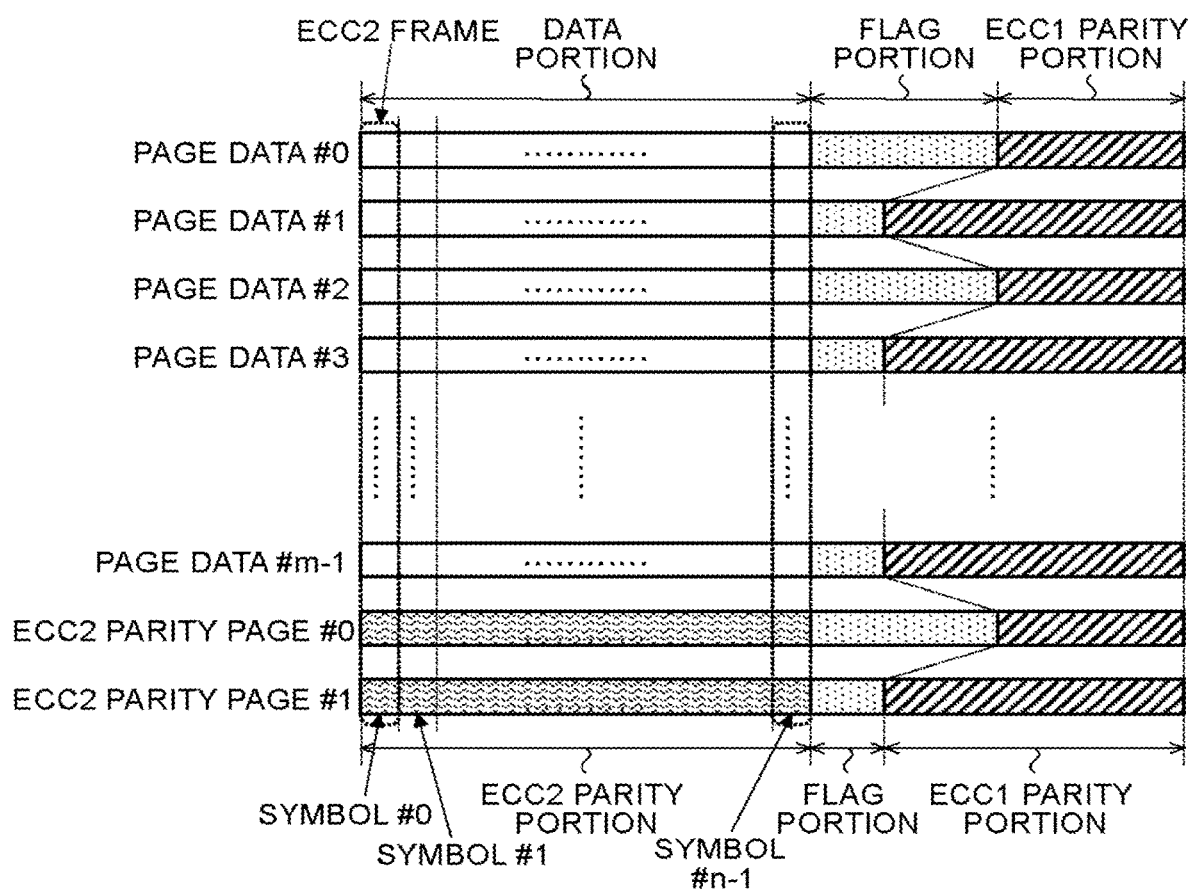
FIG. 26 is a diagram illustrating an example of a product code according to the tenth embodiment.

Here, FIG. 26 illustrates an example of the product code according to the present embodiment. The product code illustrated in FIG. 26 has a structure in which one or more ECC2 parities (two ECC2 parity pages #0 and #1 in this example,) are added to a plurality of pieces of page data #0 to # m−1 in the inter-page direction. Each piece of the page data #0 to # m−1 includes a data portion that stores user data of the same number of symbols (n symbols) between pages, a flag portion that stores flag data of a different length between pages, and an ECC1 parity portion that stores an ECC1 parity of a length adjusted so that each piece of page data has an equal length. Each piece of the page data #0 to # m−1 is an ECC frame which is the coding unit of the intra-page ECC circuit 15. In the present description, each piece of page data #0 to # m−1 is referred to as an ECC1 frame.

On the other hand, each of the ECC2 parity paces #0 and #1 includes an ECC2 parity portion of the same number of symbols as the data portion of the ECC1 frame, a flag portion that stores a flag data of a different length between the ECC2 parity pages, and an ECC1 parity portion that stores an ECC1 parity of a length adjusted so as each ECC2 parity page has an equal length. Each of the ECC2 parity pages #0 and #1 is also an ECC frame which is the coding unit of the intra-page ECC circuit 15. The number of ECC2 parity pages is not limited to two and may be variously modified in accordance with a desired coding rate or a desired error correction capability.

For example, each of the ECC2 parity pages #0 and #1 is generated as follows. First, m ECC1 frames are collected from an arbitrary page of an arbitrary word line, and the data portion of each ECC1 frame is divided into n symbols. Then, the symbols of the same number in the respective ECC1 frames are collected, n pieces of frame data for calculating n symbols in the ECC2 parity portion of each of the ECC2 parity pages #0 and #1 are generated. Then, the ECC2 coding is performed on the n pieces of frame data, so that the ECC2 parity portion including the n symbols of each of the 2 parity pages #0 and #1 is generated.

The generated ECC2 parity portion undergoes the error mitigation coding and is assigned the flag portion, similarly to the data portion in the page data #0 to # m−1. Further, the ECC1 coding is executed on the ECC2 parity portion to which the flag portion is assigned, and the ECC1 parity portion is generated. As a result, the ECC2 parity pages #0 and #1 including each ECC2 parity portion, the flag portion, and the ECC1 parity portion are generated.

Figure 27:
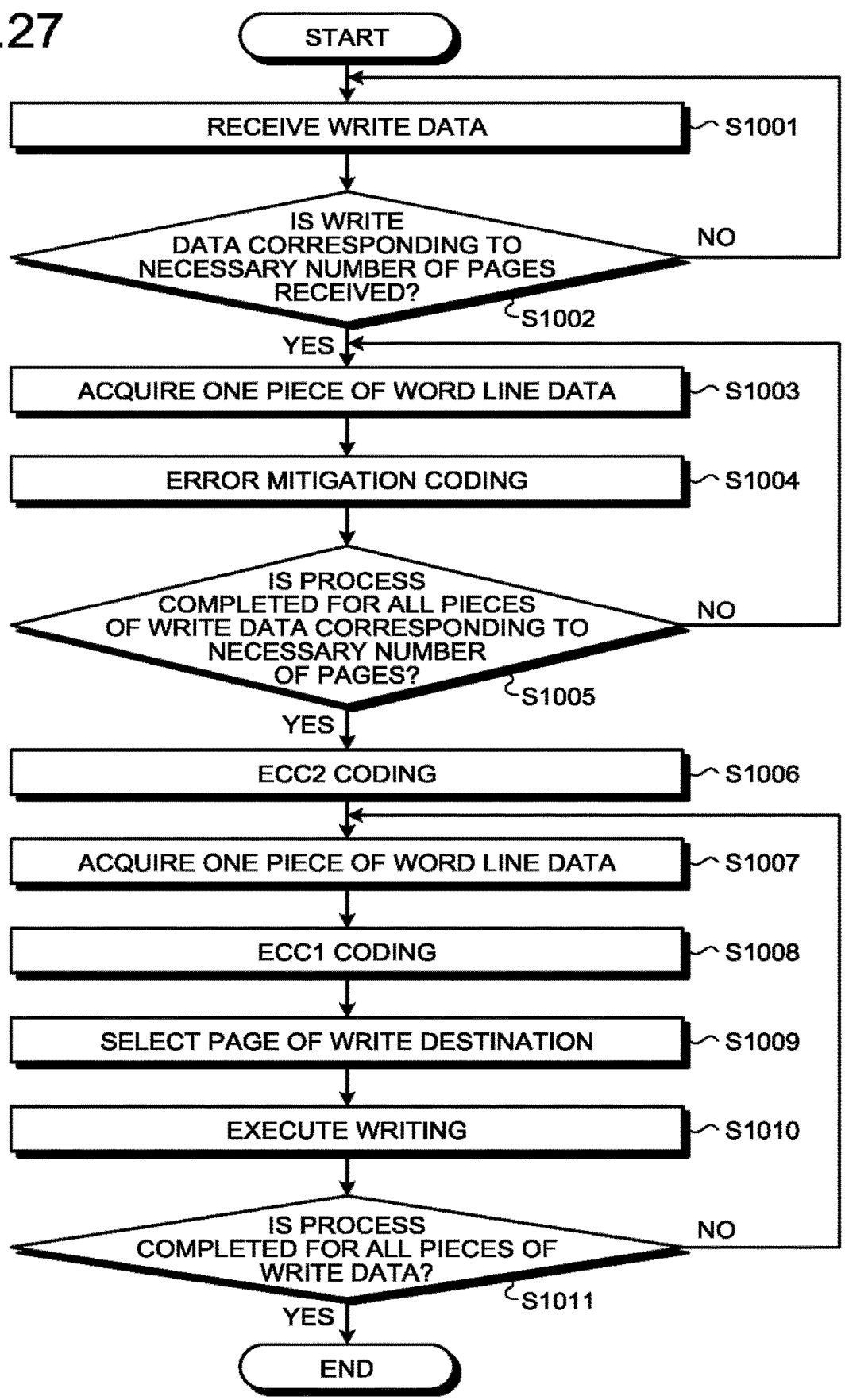
FIG. 27 is a flowchart illustrating an example of a write operation according to the tenth embodiment.

Next, a write operation according to the present embodiment will be described in detail with reference to the appended drawings. FIG. 27 is a flowchart illustrating an example of the write operation according to the present embodiment. As illustrated in FIG. 27, in the write operation according to the present embodiment, the processor 11 serving as the control unit first receives the write data of the write target from the host 30 via the host I/F 17 (Step S1001). The received write data is accumulated in, for example, the RAM 12.

Then, the processor 11 determines whether or not the write data corresponding to number of pages necessary for the execution of the error mitigation coding in accordance with any one of the above embodiments is received, that is, whether or not the write data corresponding to the necessary number of pages is accumulated in the RAM 12 (Step S1002), and when the write data corresponding to the necessary number of pages is not accumulated yet (NO in Step S1002), the process returns to Step S1001. On the other hand, when the write data corresponding to the necessary number of pages is accumulated in the RAM 12 (YES in Step S1002), the processor 11 instructs the signal processing circuit 16 to execute the error mitigation coding on the write data corresponding to the necessary number of pages accumulated in the RAM 12. On the other hand, the signal processing circuit 16 sequentially acquires the write data corresponding to one piece of word line data from the RAM 12 (Step S1003), and executes the error mitigation coding described in the above embodiment on the acquired word line data (Step S1004). Then, the signal processing circuit 16 determines whether or not the execution of the error mitigation coding is completed for all pieces of write data corresponding to the necessary number of pages stored in the RAM 12 (Step S1005), and when the execution of the error mitigation coding is completed for all pieces of write data corresponding to the necessary number of pages stored in the RAM 12 (YES in Step S1005), the process proceeds to Step S1006. On the other hand, when the execution of the error mitigation coding is not completed for any one piece of write data corresponding to the necessary number of pages stored in the RAM 12 (NO in Step S1005), the process returns to Step S1003, and a subsequent process is executed on the next one piece of word line data. Accordingly, the error mitigation encoded data corresponding to the necessary number of pages is accumulated in the RAM 12.

In Step S1006, the processor 11 instructs the inter-page ECC circuit 215 to execute the ECC2 coding on the error mitigation encoded data corresponding to the necessary number of pages accumulated in the RAM 12. On the other hand, the inter-page ECC circuit 215 acquires the error mitigation encoded data corresponding to the necessary number of pages from the RAM 12 and executes the ECC2 coding on the acquired error mitigation encoded data (Step S1006). The ECC2 encoded data obtained by the ECC2 coding may be stored in the RAM 12.

Then, the processor 11 instructs the intra-page ECC circuit 15 to execute the ECC1 coding on the ECC2 encoded data stored in the RAM 12. On the other hand, the intra-page ECC circuit 15 sequentially acquires the write data corresponding to one piece of word line data from the RAM 12 (Step S1007), and executes the ECC1 coding on the acquired word line data (Step S1008). Then, the processor 11 selects a page of a write destination (Step S1009), and then, for example, similarly to Step S905 of FIG. 22, instructs the memory I/F 18 to write the ECC1 frame generated by the ECC1 coding in the non-volatile memory 20, and as the memory I/F 18 operates in response to the instruction, the ECC1 frame is written in the non-volatile memory 20 (Step S1010).

Then, the processor 11 determines whether or not the execution of ECC1 coding is completed for all pieces of ECC2 encoded data stored in the RAM 12 (Step S1011), and when the execution of ECC1 coding is completed for all pieces of ECC2 encoded data stored in the RAM 12 (YES in Step S1011), the processor 11 ends the present operation. On the other hand, when the execution of ECC1 coding is not completed for any one piece of ECC2 encoded data stored in the RAM 12 (NO in Step S1011), the process returns to Step S1007, and a subsequent processing is executed on the next one piece of word line data.

As described above, in the write operation according to the present embodiment, since the ECC2 coding is applied to a plurality of pages, the write operation is collectively performed on a plurality of pages necessary for the ECC2 coding. As described in the ninth embodiment, since it is necessary to perform the ECC coding after performing the error mitigation coding, in the present embodiment, it is necessary to first perform the error mitigation coding for all of a plurality of pages necessary for the ECC2 coding. Further, the ECC1 coding is executed on each piece of page data for a bundle of page data which has undergone the error mitigation coding and the ECC2 coding, and the ECC1 frame obtained accordingly is sequentially written in the non-volatile memory 20.

Figure 28:
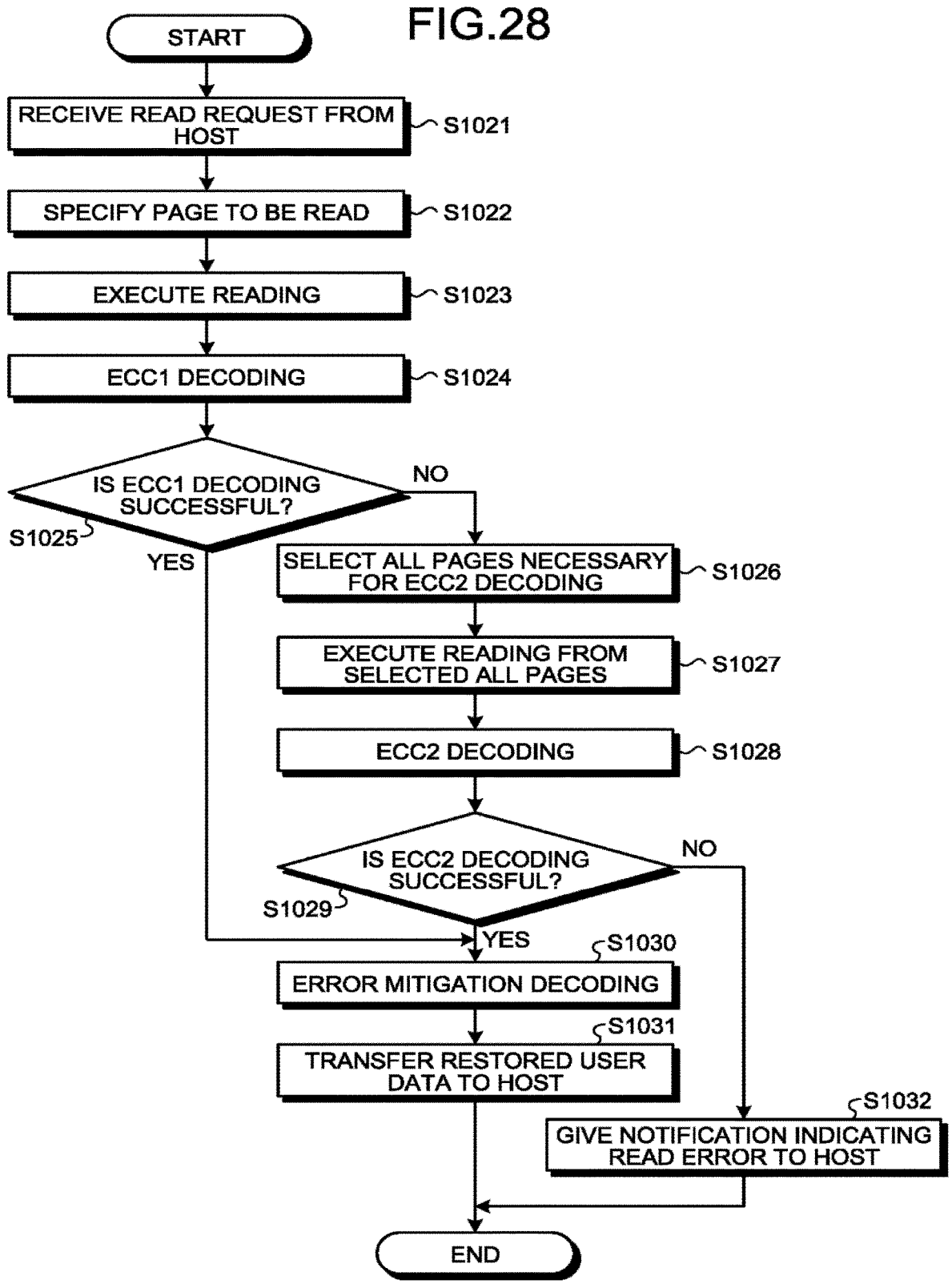
FIG. 28 is a flowchart illustrating an example of a read operation according to the tenth embodiment.

Next, a read operation according to the present embodiment will be described in detail with reference to the appended drawing. FIG. 28 is a flowchart illustrating an example of the read operation according to the present embodiment. As illustrated in FIG. 28, in the read operation according to the present embodiment, similarly to Steps S921 to S924 of FIG. 23, page data is read from a page designated by a read request in response to the read request received from the host 30, and the ECC1 decoding is executed on the read page data (Steps S1021 to S1024). Then, the processor 11 determines whether or not the ECC1 decoding by the intra-page ECC circuit 15 is successful (Step S1025).

When the ECC1 decoding is successful (YES in Step S1025), the processor 11 proceeds to Step S1030. On the other hand, when the ECC1 decoding fails (NO in Step S1025), the processor 11 selects a page in which all pieces of page data necessary for executing ECC2 decoding on the page data read from the page of the read target are stored (Step S1026), and instructs the memory I/F 18 to read data from all the selected pages. On the other hand, the memory I/F 18 instructs the command processing unit (not illustrated) in the non-volatile memory 20 to read data from all the selected pages. Accordingly, the reading of data from all the selected pages is executed in the non-volatile memory 20 (Step S1027).

Then, tree processor 11 instructs the inter-page ECC circuit 215 to perform the ECC2 coding on the page data read from all the selected pages. The inter-page ECC circuit 215 executes the ECC2 decoding on all pieces of input page data in accordance with the instruction from the processor 11 (Step S1026).

Then, the processor 11 determines whether or not the ECC2 decoding by the inter-page ECC circuit 215 is successful (Step S1029), and when the ECC2 decoding by the inter-page ECC circuit 215 is not successful (NO in Step S1029), the processor 11 gives a notification indicating the read error to the host 30 via the host I/F 17 (Step S1032), and ends the present operation. On the other hand, when the ECC2 decoding is successful (YES in Step S1029), the processor 11 proceeds to Step S1030.

In Step S1030, the processor 11 instructs the signal processing circuit 16 to execute the error mitigation decoding on the error corrected data which is error-corrected by the ECC2 decoding by the inter-page ECC circuit 215. On the other hand, the signal processing circuit 16 executes the error mitigation decoding described in the above embodiment on the error corrected data stored in the RAM 12. The user data restored by the error mitigation decoding is stored in, for example, the RAM 12.

Thereafter, the processor 11 transfers the user data restored in the RAM 12 to the host 30 via the host I/F 17 (Step S1031), and ends the present operation.

As described shove, in the read process according to the present embodiment, the ECC2 decoding is executed when the ECC1 decoding fails, but since the data necessary for the ECC2 decoding spans over a plurality of pages at that time, it is necessary to read all pieces of data before the ECC2 decoding. Then, when the ECC2 decoding is successfully performed, and the error correction is performed, the error mitigation decoding is executed on the page data of the read target.

As described above, according to the present embodiment, it is possible to implement the memory system capable of enabling more stable data reading by combining the multi-dimensional error correction code with a higher correction capability and the error mitigation code.

The other configurations, operations, and effects are similar to those in the above embodiments, and thus detailed description thereof is omitted here.

Eleventh Embodiment

Next, a memory system according to the eleventh embodiment will be described in detail with reference to the appended drawings. In the above-described tenth embodiment, when the ECC2 coding is executed, only the data portions of collected m frames (page data) undergo the ECC2 coding. Here, in the decoding process, there are cases in which it is uncorrectable through the ECC1 decoding, but it is correctable through the subsequent ECC2 decoding. In this case, in the tenth embodiment, since the flag portion is not the target of the ECC2 decoding, if an error is included in the flag portion, the error of the flag portion is unable to be corrected through the ECC2 decoding, and as a result, there is a possibility of a subsequent error mitigation decoding being unable to be performed normally. In this regard, in the eleventh embodiment, an example in which the flag portion is set as the target of the ECC2 coding will be described.

Here, a data length (also referred to as a flag length) of the flag portion may be different for each page. In a case in which the ECC2 coding is executed in a state in which there are pages with different flag lengths, a page in which there is no data is likely to occur in the ECC2 coding on the flag portion. In this regard, in the present embodiment, in order to prevent the occurrence of such a situation, page data satisfying the condition that the data length of the flag portion is the same in addition to the condition that the data length of the data portion is the same is used as page data to be used as a collection target when the product code is configured. For example, in the case of the MLC, the product code is constructed by collecting the ECC1 frames of only the UPPER page or the LOWER page.

Figure 29:
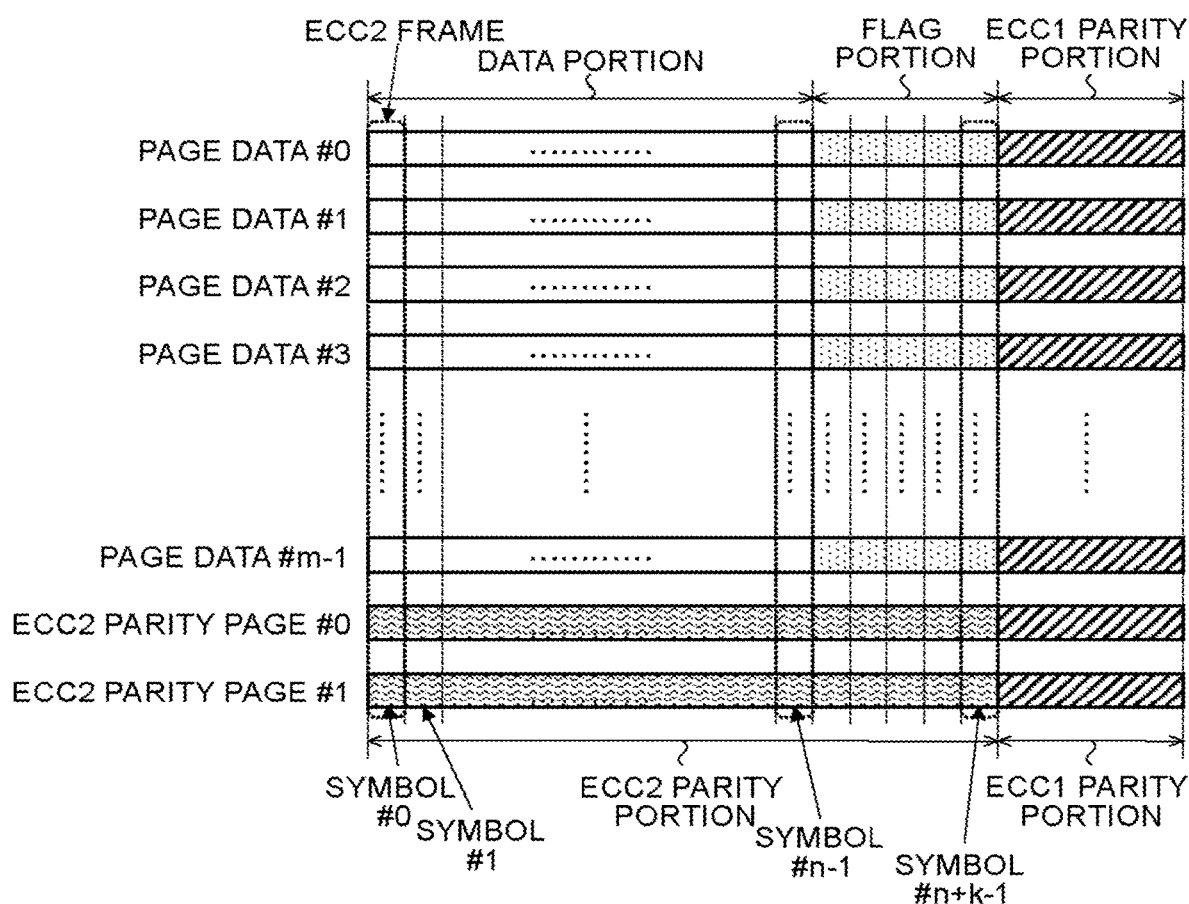
FIG. 29 is a diagram illustrating an example of a product code according to an eleventh embodiment.

FIG. 29 is a diagram illustrating an example of a product code according to the present embodiment. As illustrated in FIG. 29, in the product code according to the present embodiment, in addition to the data length of the data portion in which the number of symbols is n, the data length of the flag portion in which the number of symbols is k (k is an integer of 1 or more) is also the same in the page data #0 to # m−1. Therefore, in the present embodiment, it is possible to execute the ECC2 coding on the flag portion as well as the data portion. As a result, the ECC2 parity portion configured with a total of n+k ECC2 parities #0 to # n+k−1 is included in the ECC2 parity pages #0 and #1.

As described above, according to the present embodiment, it is possible to protect the flag data through the ECC2 parity by setting the flag data as the target of the ECC2 coding as well, and thus it is possible to implement the memory system capable of enabling more stable data reading.

The other configurations, operations, and effects are similar to those in the above embodiments, and thus detailed description thereof is omitted here.

Twelfth Embodiment

Next, a memory system in accordance with a twelfth embodiment will be described in detail with reference to the appended drawings. In the eleventh embodiment described above, the product code is constituted by collecting the page data in which the data length of the flag portion as well as the data length of the data portion is the same. On the other hand, in the twelfth embodiment, flag lengths are pseudo-equalized by adding dummy data to a flag having a short data length, and thus it is possible to protect the flag portion as well through the ECC2 code while mitigating a condition applied to the page data to be collected when the product code is configured to the same extent as the tenth embodiment.

Figure 30:
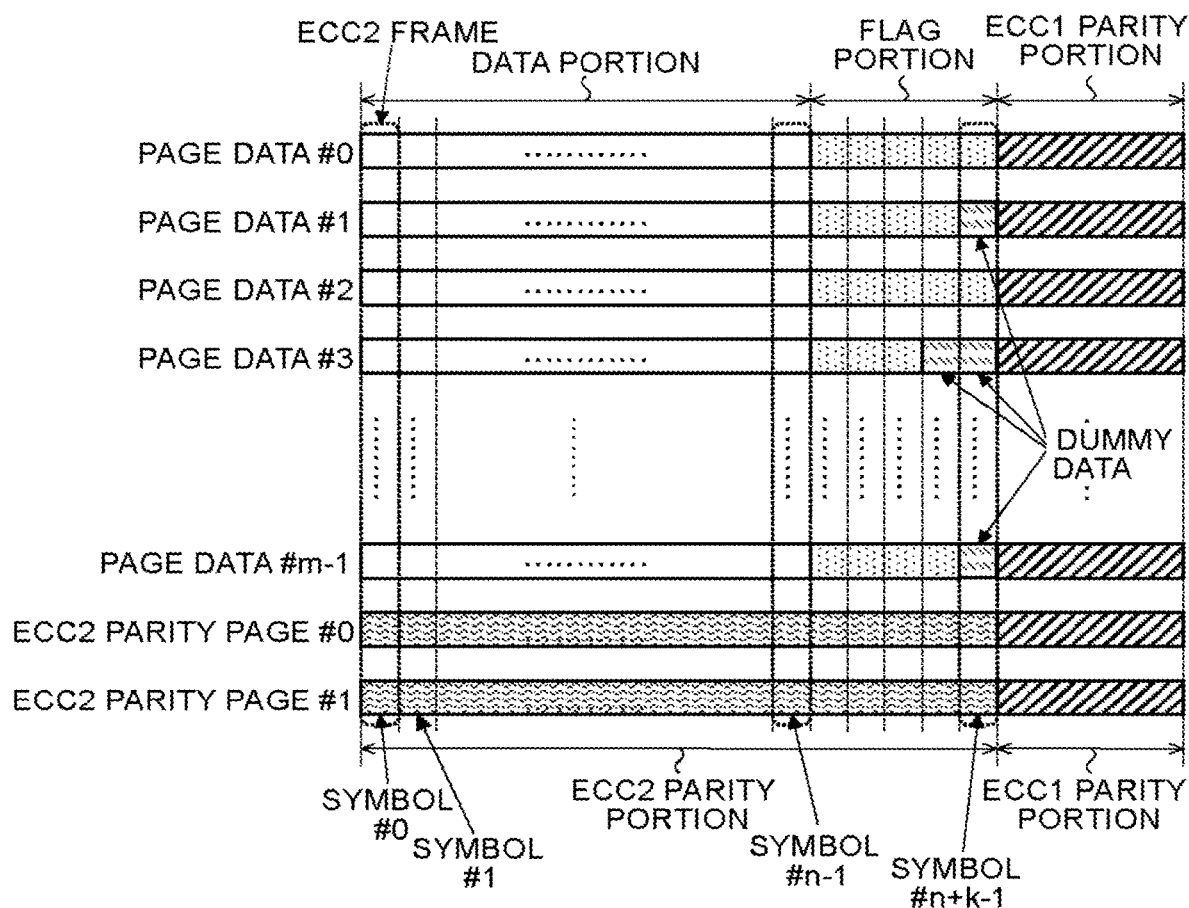
FIG. 30 is a diagram illustrating an example of product code according to a twelfth embodiment.

FIG. 30 is a diagram illustrating an example of a product code according to the present embodiment. As illustrated in FIG. 30, in the product code according to the present embodiment, flag lengths of page data #1 and # m−1 are one symbol shorter than the longest flag length of other page data, and a flag length of page data #3 is two symbols shorter than the longest flag length. In this regard, in the present embodiment, dummy data of one symbol is added to flag portions of the page data #1 and # m−1, and dummy data of two symbols is added to a flag portion of the page data #3, so that the flag lengths are pseudo-equalized. Content of dummy data is arbitrary, but, for example, a symbol in which all bits are "0" may be used. In this case, the addition of the dummy data is also referred to as zero padding.

As described above, according to the present embodiment, it is possible to pseudo-equalize the flag lengths between pages through the zero padding, and thus it is possible to increase a degree of freedom of selection of page data constituting the multi-dimensional error correction code.

The other configurations, operations, and effects are similar to those in the above embodiments, and thus detailed description thereof is omitted here.

Thirteenth Embodiment

Next, a memory system in accordance with a thirteenth embodiment will be described in detail with reference to the appended drawings. In the above-described twelfth embodiment, the flag length is pseudo-equalized by adding the dummy data to a flag having a snort data length. On the other hand, in the thirteenth embodiment, an example in which the flag lengths are pseudo-equalized by redistributing a symbol (flag) of a part of a flag portion having a long flag length to a flag portion having a short flag length.

Figure 31:
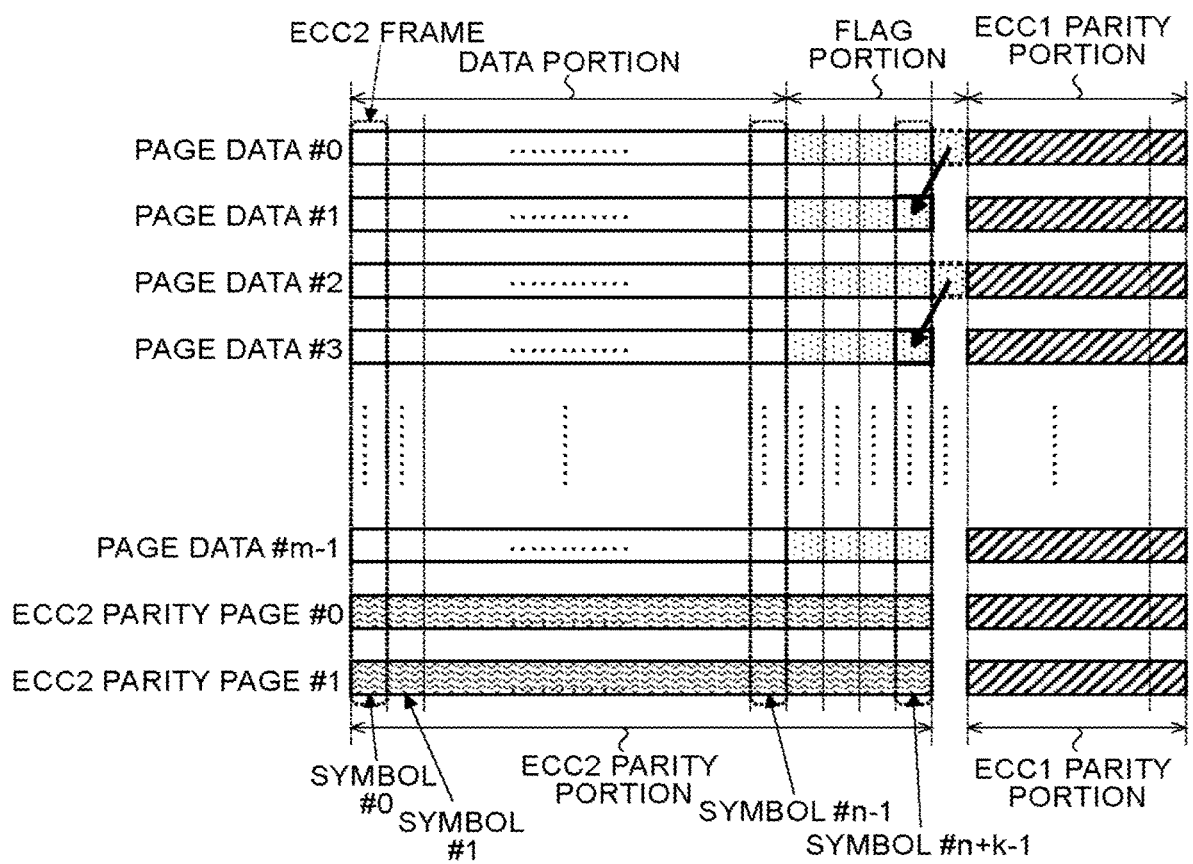
FIG. 31 is a diagram illustrating an example of a product code according to a thirteenth embodiment.

FIG. 31 is a diagram illustrating an example of a product code according to the present embodiment. As illustrated in FIG. 31, in the product code according to the present embodiment, flag lengths of page data #0 and #2 are one symbol longer than an average flag length, and flag lengths of page data #1 and #3 are one symbol shorter than the average flag length. In this regard, in the present embodiment, the flag lengths are pseudo-equalized by redistributing one symbol of each of the flag portions of the page data 40 and 42 in which the flag length is one symbol longer than the average to each of the flag portions of the page data #1 and #3 in which the flag length is one symbol shorter than the average.

As described above, according to the present embodiment, the flag lengths can be pseudo-equalized between the pages by redistributing the flag data, and thus it is possible to increase the degree of freedom of selection of the page data constituting the multi-dimensional error correction code.

The other configurations, operations, and effects are similar to those in the above embodiments, and thus detailed description thereof is omitted here.

Fourteenth Embodiment

Then, a memory system in accordance with a fourteenth embodiment will be described in detail with reference to the appended drawings. In the thirteenth embodiment described above, the flag lengths are pseudo-equalized by redistributing a flag of a part of the flag portion having the long flag length to the flag portion having the short flag length, but in this case, there is a possibility of the flag being unable to be distributed so that the flag lengths are equal between the pages due to the actual data length of the flag portion. In this regard, in the fourteenth embodiment, as a result of redistributing the flag, the dummy data is added to page data in which the flag length is insufficient, and thus the flag lengths are pseudo-equalized.

Figure 32:
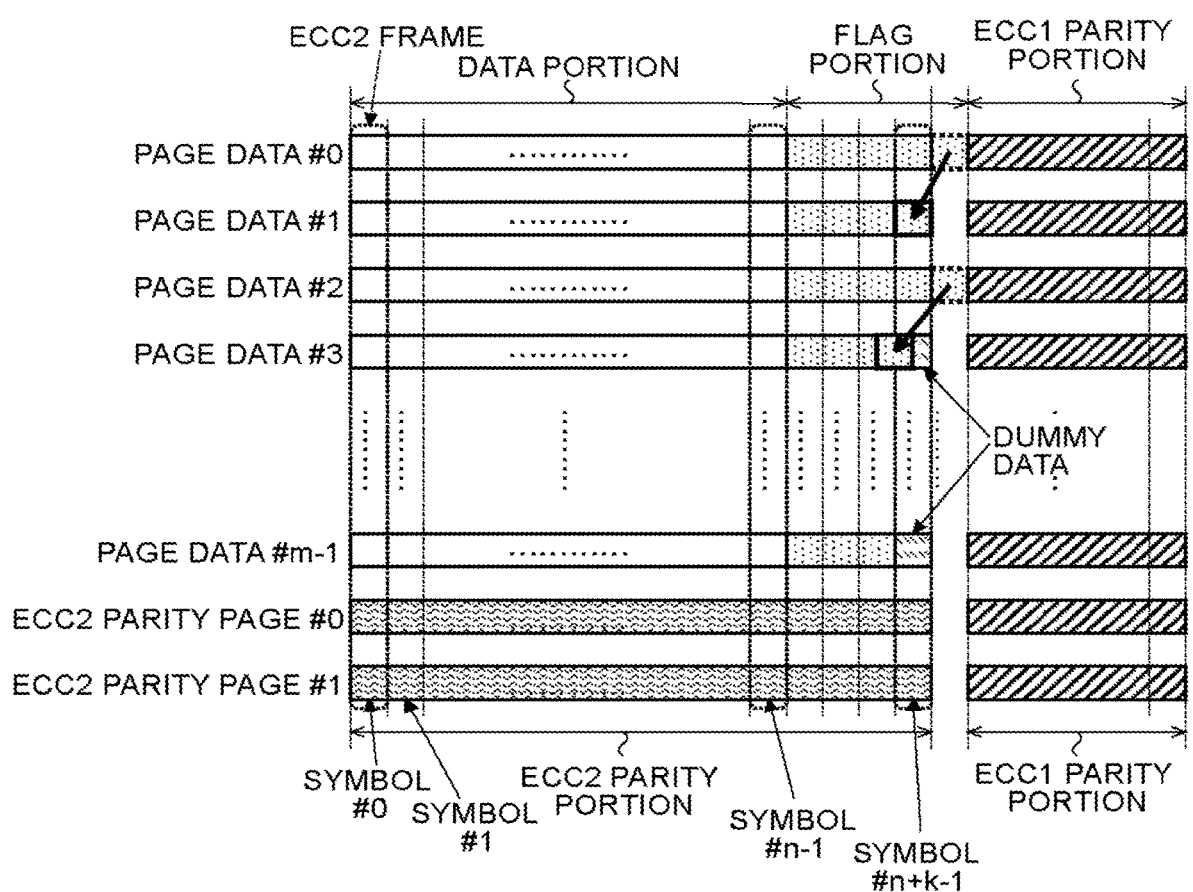
FIG. 32 is a diagram illustrating an example of a product code according to a fourteenth embodiment.

FIG. 32 is a diagram illustrating an example of a product code according to the present embodiment. As illustrated in FIG. 32, in the product code according to the present embodiment, flag lengths of page data #0 and #2 are one symbol longer than an average flag length, flag lengths of the page data #1 and # m−1 are one symbol shorter than the average flag length, and a flag length of page data #3 is 1.5 symbols shorter than the average flag length.

In this regard, in the present embodiment, one symbol of each of the page portions of the page data #0 and #2 in which the flag length is one symbol longer than the average flag length is redistributed to each of the flag portions of the page data #1 and #3 in which the flag length is one symbol or more shorter than the average flag length. Further, dummy data corresponding to a shortfall is added to the flag portion of page data # m−1 in which the flag is not redistributed and the flag portion of the page data #3 in which the flag length is insufficient although the flag is redistributed, and thus the flag lengths are pseudo-equalized. The dummy data may be similar to, for example, the dummy data described in the twelfth embodiment.

As described above, according to the present embodiment, it is possible to pseudo-equalize the flag lengths between the pages by a combination of the flag data redistribution and the zero padding, and thus it is possible to increase the degree of freedom of selection of the page data constituting the multi-dimensional error correction code.

The other configurations, operations, and effects are similar to those in the above embodiments, and thus detailed description thereof is omitted here.

Fifteenth Embodiment

Next, a memory system in accordance with a fifteenth embodiment will be described in detail with reference to the appended drawings. In a case in which the product code in which the intra-page ECC is used as an inner code, and an inter-page ECC is used as an outer code as described above in the tenth to the fourteenth embodiments, when the error correction using the intra-page ECC fails, the error correction process using the inter-page ECC is performed. In this case, if the error mitigation coding process is inserted between the intra-page ECC and the inter-page ECC, the error amplification may occur in the error mitigation decoding when the error correction using the intra-page ECC fails. This will be described with reference to FIGS. 33 and 34.

Figure 33:
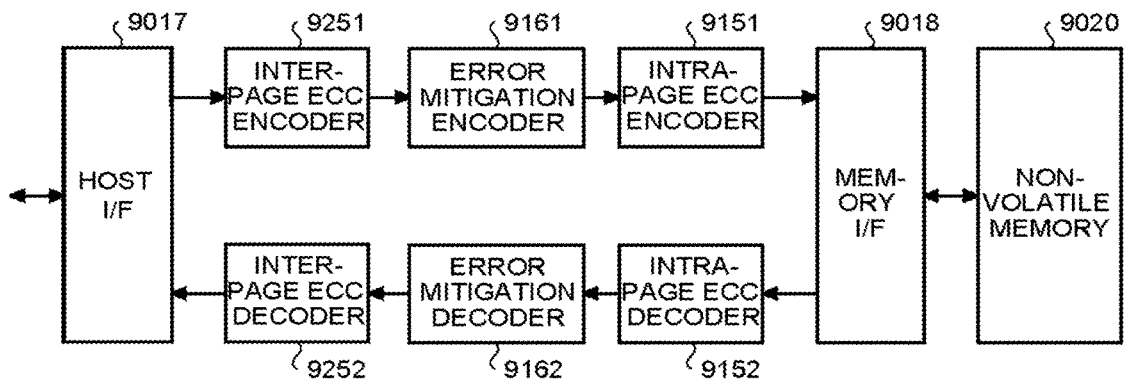
FIG. 33 is a block diagram illustrating one implementation form of error correction code, error mitigation code in an inter-page direction and an error correction code in an intra-page direction.

FIG. 33 is a block diagram illustrating one implementation form of the error correction code and the error mitigation code in an inter-page direction and the error correction code in an intra-page direction. FIGS. 34A to 34D are diagrams illustrating an example in which an error occurred in data which has undergone the error mitigation coding by an error mitigation encoder illustrated in FIG. 33 is amplified by an error mitigation decoder. In FIG. 33, an intra-page ECC encoder 9151 and an intra-page ECC decoder 9152 may be similar to the ECC encoder 9151 and the ECC decoder 9152 illustrated in FIG. 1. Resides, a host I/F 9017, a memory I/F 9018, a non-volatile memory 9020, an error mitigation encoder 9161, and an error mitigation decoder 9162 may be similar to those illustrated in FIG. 1. Further, an inter-page ECC encoder 9251 executes the ECC coding on the product code including a plurality of pieces of page data in the inter-page direction, and an inter-page ECC decoder 9252 executes the ECC decoding on the product code in the inter-page direction.

In the example illustrated in FIG. 33, the write data input from the host 30 via the host I/F 17 is first input to the inter-page ECC encoder 9251, the ECC2 parity is added, and then the resulting write data is input to the error mitigation encoder 9161 and undergoes the error mitigation coding. Then, the error mitigation encoded data is input to the intra-page ECC encoder 9151, the ECC1 parity is added, and then the resulting data is written in the non-volatile memory 9020 via the memory I/F 9018.

The read data read from the non-volatile memory 9020 via the memory I/F 9018 is input to the intra-page ECC decoder 9152, the error correction is performed on the page data in the intra-page ECC decoder 9152, and then the resulting page data is input to the error mitigation decoder 9162 and undergoes the error mitigation decoding. Then, the error mitigation decoded data is input to the inter-page ECC decoder 9252 and undergoes the error correction in the inter-page direction. In the present embodiment, "performing the error correction on the page data in intra-page ECC decoder 9152" is referred to as "performing the error correction in the intra-page direction by the intra-page ECC decoder 9152."

Figure 34A:
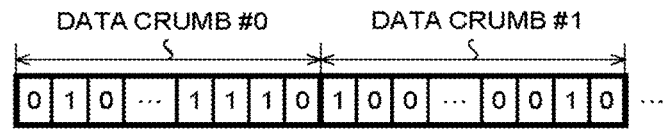
FIGS. 34A to 34D are diagrams for describing a flow when an error of read data is amplified by error mitigation decoding in a configuration illustrated in FIG. 33.

Here, an example in which an error of read data read out from the non-volatile memory 9020 is amplified by the error mitigation decoding will be described using the example of FIGS. 34A to 34D. FIG. 34A illustrates an example of data (write data) input to the error mitigation encoder 9161, FIG. 34B illustrates an example of error mitigation encoded data output from the error mitigation encoder 9161, FIG. 34C illustrates an example of data (read data) input to the error mitigation decoder 9162, and FIG. 34D illustrates an example of error mitigation decoded data output from the error mitigation decoder 9162.

Figure 34B:
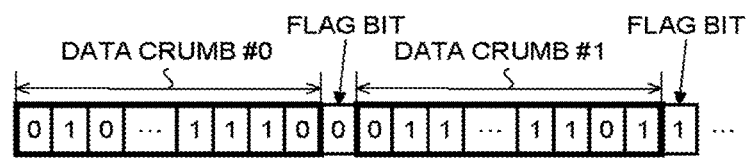

As illustrated in FIG. 34A to FIG. 34B, the error mitigation encoder 9161 executes the data conversion (the bit flipping in the example illustrated in FIGS. 34A to 34D) on each data crumb if necessary. Then, the error mitigation encoder 9161 adds a flag bit of "0" to a data crumb which does not undergo the data conversion, adds a flag bit of "1" to a data crumb which undergoes the data conversion, and outputs the error mitigation encoded data. In the example illustrated in FIG. 34B, the flag bit of "0" added to a first data crumb #0 which does not undergone the data conversion, and the flag bit of "1" is added to a second data crumb #1 which has undergone the data conversion. The data obtained by the error mitigation coding as described above undergoes the ECC1 coding in the intra-page ECC encoder 9151 and then written in the non-volatile memory 9020 by the memory I/F 9018.

Figure 34C:
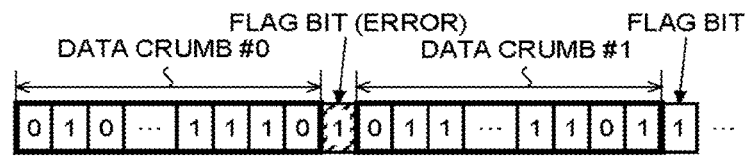
Figure 34D:
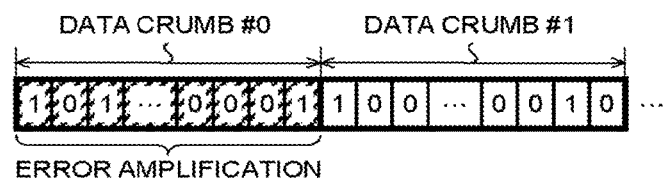

Thereafter, as illustrated in FIG. 34C, an error of a flag bit occurs in the data (read data) read from the non-volatile memory 9020 by the memory I/F 9018, and when the read data including the error of the flag bit (which has undergone the ECC1 decoding) is input to the error mitigation decoder 9162, the error mitigation decoder 9162 executes the error mitigation decoding based on the flag bit having the error. For example, in the example illustrated in FIG. 34C and FIG. 34D, the first data crumb #0 is bit-converted (bit-flipped) on the basis of the flag "1" in which the error has occurred. As a result, as illustrated in FIG. 34D, the error of the flag to which the first data crumb #0 is added is amplified to the entire data crumb #0 in which no error has occurred originally.

In this regard, in the present embodiment, a memory system capable of reducing the amplification of the error occurred in the flag caused by the error mitigation decoding will be described as an example.

Figure 35:
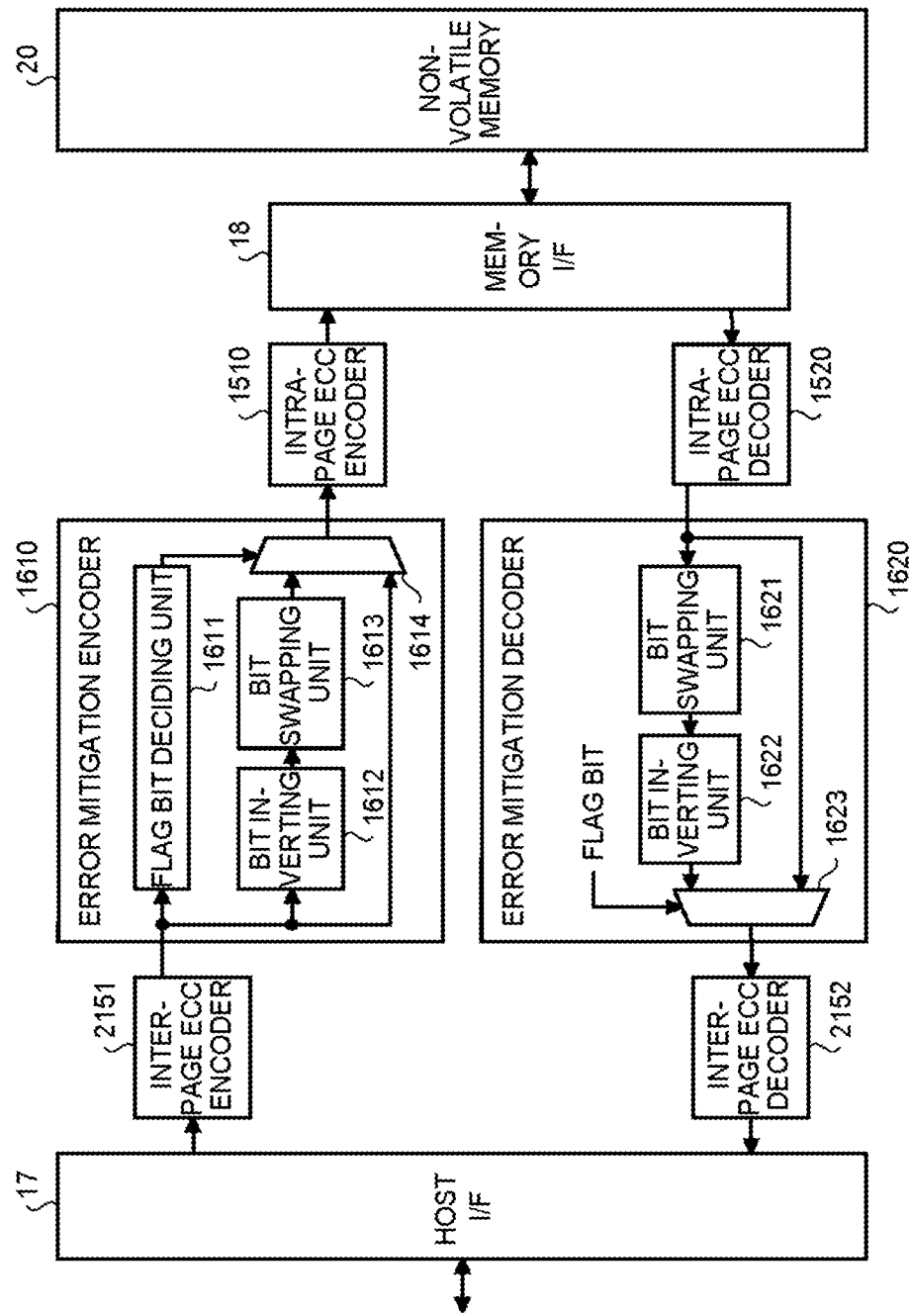
FIG. 35 is a block diagram illustrating one implementation form of an error mitigation code and an error correction code according to a fifteenth embodiment.

FIG. 35 is a block diagram illustrating one implementation form of the error mitigation code and the error correction code according to the present embodiment. As illustrated in FIG. 35, one implementation form of the error mitigation code and the error correction code according to the present embodiment has a configuration in which an inter-page ECC encoder 2151, an error mitigation encoder 1610, and an intro-page ECC encoder 1510 are arranged between the host I/F 17 and the memory I/F 18 as an encoding system, and an intra-page ECC decoder 1520, an error mitigation decoder 1620, and an inter-page ECC decoder 2152 are arranged as a decoding system. In this configuration, for example, the inter-page ECC encoder 2151 and the inter-page ECC decoder 2152 correspond to, for example, the inter-page ECC circuit 215 of FIG. 25, the error mitigation encoder 1610 and the error mitigation decoder 1620 correspond to, for example, the signal processing circuit 16 of FIG. 25, and the intra-page ECC encoder 1510 and the intra-page ECC decoder 1520 correspond to, for example, the intra-page ECC circuit 15 of FIG. 25.

In FIG. 35, the ECC2 coding by the inter-page ECC encoder 2151, the ECC1 coding by the intra-page ECC encoder 1510, the ECC1 decoding by the intra-page ECC decoder 1520, and the ECC2 decoding by the inter-page ECC decoder 2152 may be similar to the ECC2 coding and the ECC2 decoding by the inter-page ECC circuit 215 and the ECC1 coding and the ECC1 decoding by the intra-page ECC circuit 15.

The error mitigation encoder 1610 according to the present embodiment includes a flag bit deciding unit 1611, a bit inverting unit 1612, a bit swapping unit 1613, and a selector 1614. In this configuration, data is input to the error mitigation encoder 1610 in units of data crumbs which are units of the error mitigation coding. The data crumb input to the error mitigation encoder 1610 is input to the flag bit deciding unit 1611, the bit inverting unit 1612, and the selector 1614.

The bit inverting unit 1612 performs bit inversion (bit flipping) on the input data crumb. The data crumb which is bit flipped by the bit inverting unit 1612 is input to the bit swapping unit 1613. The bit swapping unit 1613 performs a bit swapping process of swapping bits, for example, in units of adjacent two bits on the input data crumb. The data crumbs bit-swapped by the bit swapping unit 1613 are input to the selector 1614.

The flag bit deciding unit 1611 counts the number of bits "0" and the number of bits "1" in the input data crumb, and decides a value of the flag bit to be added to the data crumb on the basis of the count value. Further, the flag bit deciding unit 1611 inputs the decided flag bit to a control terminal of the selector 1614. Therefore, the selector 1614 selectively outputs either a data crumb which is bit-flipped and flip-swap or a data crumb which is bit-flipped but not bit-swapped on the basis of the value of the flag bit input from the flag bit deciding unit 1611. For example, when the decided flag bit is "1," the flag bit deciding unit 1611 outputs the data crumb which is bit-flipped and flip-swap to the selector 1614. On the other hand, when the decided flag bit is "0," the flag bit deciding unit 1611 outputs the data crumb which is bit-flipped but not flip-swap to the selector 1614.

The error mitigation decoder 1620 according the present embodiment includes a bit swapping unit 1621, a bit inverting unit 1622, and a selector 1623. In this configuration, data is input to the error mitigation decoder 1620 in units of data crumbs which are units of the error mitigation decoding. The data crumb input to error mitigation decoder 1620 is input to the bit swapping unit 1621 and the selector 1614.

The bit swapping unit 1621 executes a bit swapping process of swapping bits in units of adjacent two bits so that the bit swapping in units of adjacent two bits by the bit swapping unit 1613 in the error mitigation encoder 1610 is canceled, and inputs the bit-swapped data crumb to the bit inverting unit 1622. The bit inverting unit 1622 executes a bit flipping process on the data crumb from which the bit swapping is canceled so that the bit flipping is further canceled. Accordingly, the data crumb in which the bit flipping and the bit swapping are canceled while passing through the bit swapping unit 1621 and the bit inverting unit 1622 is input to the selector 1623 in addition to the data crumb that does not pass through the bit swapping unit 1621 and the bit inverting unit 1622.

The flag bit added to each data crumb is also input to the control terminal of the selector 1623. The selector 1623 selectively outputs either of the data crumb that does not pass through the bit swapping unit 1621 and the bit inverting unit 1622 and the data crumb that passes through the bit swapping unit 1621 and the bit inverting unit 1622 on the basis of the value of the flag bit. For example, in a case in which the input flag bit is "1," the selector 1623 outputs the data crumb in which the bit flipping and the bit swapping are canceled while passing through the bit swapping unit 1621 and the bit inverting unit 1622. On the other hand, when the input flag bit is "0," the selector 1623 outputs the data crumb that does not pass through the bit swapping unit 1621 and the bit inverting unit 1622.

Figure 36:
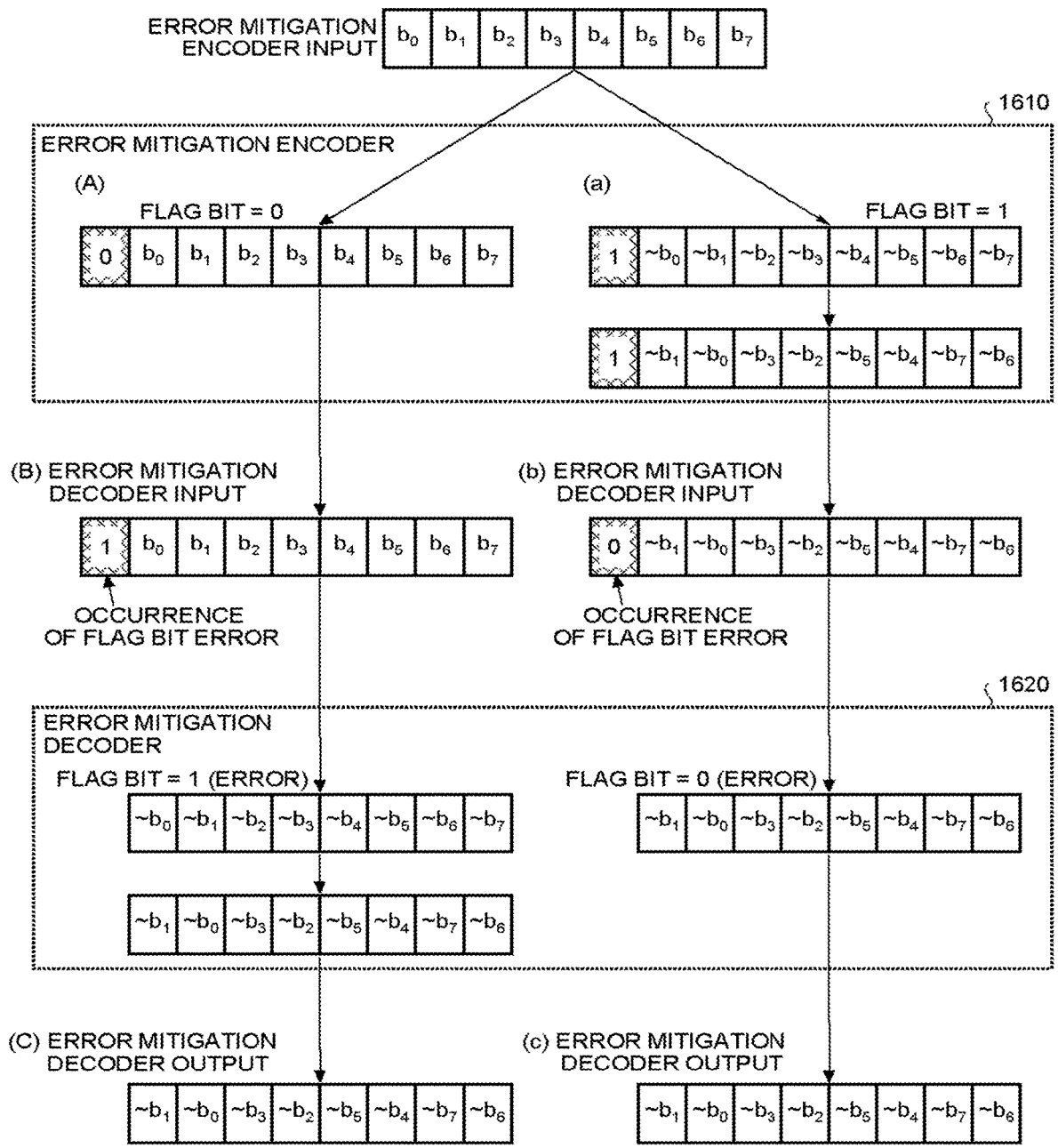
FIG. 36 is a diagram illustrating an example in a case in which an error occurs in a flag bit in a flow from an error mitigation coding to an error mitigation decoding according to the fifteenth embodiment.

Next, the flows of the error mitigation coding/decoding according to the present embodiment and effects thereof will be described in detail with reference to the appended drawings. FIG. 36 is a diagram illustrating an example in which an error occurs in the flag bit in the flow from the error mitigation coding to the error mitigation decoding according to the present embodiment. FIG. 36 exemplifies an example in which the error mitigation coding is performed in units of eight bits. A bit array of the 8-bit data crumb is assumed to be $\{b_0, b_1, b_2, b_3, b_4, b_5, b_6, b_7\}$. Further, in the drawings and the following description, "~" indicates that the bit flipping is performed.

FIGS. 36A to 36C illustrate the flow in a case in which the flag bit=0 is added to the data crumb by the error mitigation coding performed by the error mitigation encoder 1610. As illustrated in FIG. 36A, the bit flipping and the bit swapping are not executed on the data crumb to which the flag bit=0 is added. Therefore, the bit array of the data crumb is a bit array in which the flag bit=0 is added to the original bit array $\{b_0, b_1, b_2, b_3, b_4, b_5, b_6, b_7\}$. In this regard, as illustrated in FIG. 36B, in a case in which an error occurs in the flag bit, and thus the flag bit is changed to the flag bit=1, the error mitigation decoder 1620 executes the bit swapping and the bit flipping on the basis of the flag bit=1 which is an error. Accordingly, as illustrated in FIG. 36C, the bit array of the data crumb output from the error mitigation decoder 1620 is $\{\sim b_1, \sim b_0, \sim b_3, \sim b_2, \sim b_4, \sim b_7, \sim b_6\}$ which is significantly different from the original bit array $\{b_0, b_1, b_2, b_3, b_4, b_5, b_6, b_7\}$.

On the other hand, FIGS. 36A to 36C illustrate the flow in a case in which the flag bit=1 is added to the data crumb by the error mitigation coding performed by the error mitigation encoder 1610. As illustrated in FIG. 36A, the bit flipping and the bit swapping are sequentially executed on the data crumb to which the flag bit=1 is added. Therefore, the bit array of the data crumb is a bit array in which the flag bit=1 is added to the bit array $\{\sim b_1, \sim b_0, \sim b_3, \sim b_2, \sim b_5, \sim b_4, \sim b_7, \sim b_6\}$ which has undergone the bit flipping and the bit swapping. Therefore, as illustrated in FIG. 36B, in a case in which an error occurs in the flag bit, and thus the flag bit is changed to the flag bit=0, the error mitigation decoder 1620 does not execute the bit swapping and the bit flipping on the input data on the basis of the flag bit=0 which is an error. As a result, as illustrated in FIG. 36C, the bit array of the data crumb output from the error mitigation decoder 1620 is $\{\sim b_0, \sim b_3, \sim b_2, \sim b_5, \sim b_4, \sim b_7, \sim b_6\}$ which is significantly different from the original bit array $\{b_0, b_1, b_2, b_3, b_4, b_5, b_6, b_7\}$.

As described above, in a case in which an error occurs in the flag bit in the process of inputting to the error mitigation decoder 1620 after writing to the non-volatile memory 20, the bit array of the data crumb output from the error mitigation decoder 1620 is changed from the original bit array $\{b_0, b_1, b_2, b_3, b_4, b_5, b_6, b_7\}$ to be originally output to the bit array $\{\sim b_1, \sim b_0, \sim b_3, \sim b_2, \sim b_5, \sim b_4, \sim b_7, \sim b_6\}$ which has undergone the bit flipping and the bit swapping on the basis of the error flag. Therefore, a degree of error amplification by the error of the flag bit can be indicated by the number of bits which do not coincide between the hit values in the original bit array $\{b_0, b_1, b_2, b_3, b_4, b_5, b_6, b_7\}$ and the bit values in the bit array $\{\sim b_1, \sim b_0, \sim b_3, \sim b_2, \sim b_5, \sim b_4, \sim b_7, b_6\}$ which has undergone the bit flipping and the bit swapping on the basis of the error flag. The number K of non-coinciding bits can be obtained from the following Formula (1). In Formula (1), "^" indicates an XOR (exclusive OR) between bits.

[Math. 1]

$$K = +(b_0 \hat{\,} \sim b_1) + (b_1 \hat{\,} \sim b_0) + (b_2 \hat{\,} \sim b_3) + (b_3 \hat{\,} \sim b_2) + \ldots + (b_6 \hat{\,} \sim b_7) + (b_7 \hat{\,} \sim b_6) \qquad (1)$$

As is apparent from Formula (1), a probability that $(b_x \hat{\,} \sim b_{x+1})$ is "1" between the input of the error mitigation encoder 1610 and the output of the error mitigation decoder 1620, that is, a probability that certain bits x and (x+1) do not coincide with each other is ½ as shown in the following Table 1 if there is no correlation between adjacent bits.

TABLE 1

| $b_x$ | $b_{x+1}$ | Bit non-coincidence $(b_x \hat{\,} \sim b_{x+1})$ | Bit non-coincidence probability |
|---|---|---|---|
| 0 | 0 | 1 | 1/2 |
| 0 | 1 | 0 | |
| 1 | 0 | 0 | |
| 1 | 1 | 1 | |

On the other hand, if an error occurs in the flag bit in a configuration in which the bit swapping is not performed in units of adjacent two bits (for example, see FIG. 33), a probability that bits do not coincide between the input of the error mitigation encoder 9161 and the output of the error mitigation decoder 9162 is 1. Therefore, as in the present embodiment, it is possible to reduce the error amplification at the time of flag error to ½ by employing the configuration in which the bit swapping is performed in units of adjacent two bits. Further, since an appearance frequency of "0" bit/"1" bit is not changed by the bit swapping process, it is also possible to prevent the performance of the error mitigation from being lowered.

The other configurations, operations, and effects are similar to those in the above embodiments, and thus detailed description thereof is omitted here.

Sixteenth Embodiment

Next, a memory system in accordance with a sixteenth embodiment will be described in detail with reference to the appended drawings. In the fifteenth embodiment described above, the configuration in which the bit swapping is performed in units of adjacent two hits when the flag bit=1 has been described as an example. On the other hand, in the sixteenth embodiment, an example in which the bit swapping is adaptively executed in units adjacent four bits in accordance with the input to the error mitigation encoder will be described.

Figure 37:
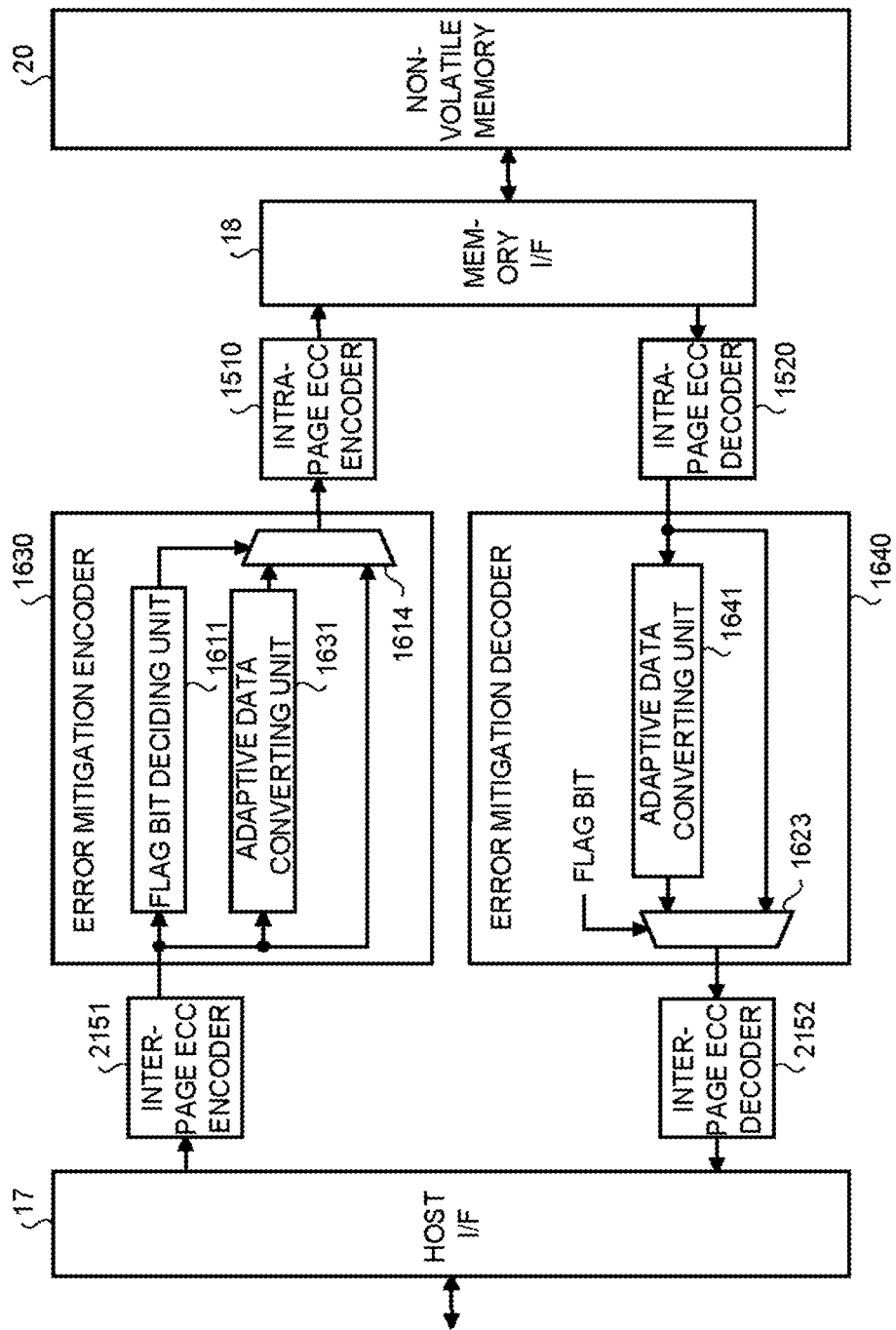
FIG. 37 is a block diagram illustrating one implementation form of an error mitigation code and an error correction code according to a sixteenth embodiment.

FIG. 37 is a block diagram illustrating one implementation form of the error mitigation code and the error correction code according to the present embodiment. As illustrated in FIG. 37, one implementation form of the error mitigation code and the error correction code according to the present embodiment has a configuration similar to one implementation form of the error mitigation code and the error correction code illustrated in FIG. 35 except that the error mitigation encoder 1610 and the error mitigation decoder 1620 are replaced with an error mitigation encoder 1630 and an error mitigation decoder 1640.

The error mitigation encoder 1630 has a configuration similar to that of the error mitigation encoder 1610 illustrated in FIG. 35 except that the bit inverting unit 1612 and the bit swapping unit 1613 are replaced with an adaptive data converting unit 1631. Similarly, the error mitigation decoder 1640 has a similar configuration to that of the error mitigation decoder 1620 illustrated in FIG. 35 except that the bit swapping unit 1621 and the bit inverting unit 1622 are replaced with an adaptive data converting unit 1641.

For example, the adaptive data converting unit 1631 adaptively performs the bit swapping on, for example, the data crumb input from the inter-page EGG encoder 2151 in units of four adjacent bits in accordance with Table 2 shown below. Specifically, the adaptive data converting unit 1631 performs the bit inversion (bit flipping) on the data crumb which is an error mitigation encoder input and then performs the bit swapping on the data crumb which has undergone the bit inversion in units f adjacent four hits {$b_x$, $b_{x+1}$, $b_{x+2}$, $b_{x+3}$} according to Table 2.

TABLE 2

| $b_x$ | $b_{x+1}$ | $b_{x+2}$ | $b_{x+3}$ |
|---|---|---|---|
| Error suppression encoder input | | | |
| 0 | 0 | 0 | 0 |
| 0 | 0 | 0 | 1 |
| 0 | 0 | 1 | 0 |
| 0 | 0 | 1 | 1 |
| 0 | 1 | 0 | 0 |
| 0 | 1 | 0 | 1 |
| 0 | 1 | 1 | 0 |
| 0 | 1 | 1 | 1 |
| 1 | 0 | 0 | 0 |
| 1 | 0 | 0 | 1 |
| 1 | 0 | 1 | 0 |
| 1 | 0 | 1 | 1 |
| 1 | 1 | 0 | 0 |
| 1 | 1 | 0 | 1 |
| 1 | 1 | 1 | 0 |
| 1 | 1 | 1 | 1 |
| Bit inversion | | | |
| 1 | 1 | 1 | 1 |
| 1 | 1 | 1* | 0* |
| 1 | 1 | 0* | 1* |
| 1* | 1* | 0* | 0* |
| 1* | 0* | 1 | 1 |
| 1* | 0* | 1* | 0* |
| 1* | 0* | 0* | 1* |
| 1* | 0* | 0 | 0 |
| 0* | 1* | 1 | 1 |
| 0* | 1* | 1* | 0* |
| 0* | 1* | 0* | 1* |
| 0* | 1* | 0 | 0 |
| 0* | 0* | 1* | 1* |
| 0 | 0 | 1* | 0* |
| 0 | 0 | 0* | 1* |
| 0 | 0 | 0 | 0 |
| Bit swapping | | | |
| 1 | 1 | 1 | 1 |
| 1 | 1 | 0* | 1* |
| 1 | 1 | 1* | 0* |
| 0* | 0* | 1* | 1* |
| 0* | 1* | 1 | 1 |
| 0* | 1* | 0* | 1* |
| 0* | 1* | 1* | 0* |
| 0* | 1* | 0 | 0 |
| 1* | 0* | 1 | 1 |
| 1* | 0* | 0* | 1* |
| 1* | 0* | 1* | 0* |
| 1* | 0* | 0 | 0 |
| 1* | 1* | 0* | 0* |
| 0 | 0 | 0* | 1* |
| 0 | 0 | 1* | 0* |
| 0 | 0 | 0 | 0 |

Here, in the present embodiment, since the effect of the bit swapping is not obtained for a combination of "0" bits and a combination of "1" bits, it is preferable to adaptively perform the bit swapping on a combination of "0" bits and "1" bits indicated by bits having an asterisk in Table 2.

Similarly, the adaptive data converting unit 1641 in the error mitigation decoder 1640 sequentially executes the bit inversion (bit flipping) and the bit swapping performed in units of adjacent four bits in accordance with Table 2 on the ECC1 frame input from the intra-page ECC decoder 1520.

In the present embodiment, the bit non-coincidence probability that the input to the error mitigation encoder 1630 when the error occurs in the flag bit does not coincide with the output from the error mitigation decoder 1640 is 0.375 as shown in Table 3 below. Therefore, as in the present embodiment, it is possible to reduce the error amplification at the time of flag error to 0.375 by employing the configuration in which the bit swapping is performed in units of adjacent four bits in accordance with Table 2. Further, since the appearance frequency of "0" bit/"1" bit is not changed by the bit swapping process, it is also possible to prevent the performance of the error mitigation from being lowered.

TABLE 3

| Flag bit | Error suppression encoder input ($b_x$ $b_{x+1}$ $b_{x+2}$ $b_{x+3}$) | Error suppression encoder output ($b_x$ $b_{x+1}$ $b_{x+2}$ $b_{x+3}$) | Error suppression decoder output (at time of flag bit error) ($b_x$ $b_{x+1}$ $b_{x+2}$ $b_{x+3}$) | Error suppression encoder input ≠ Error suppression encoder output ($b_x$ $b_{x+1}$ $b_{x+2}$ $b_{x+3}$) | Bit non-coincidence probability |
|---|---|---|---|---|---|
| 0 | 0 0 0 0 | 0 0 0 0 | 1 1 1 1 | 1 1 1 1 | 0.375 |
|   | 0 0 0 1 | 0 0 0 1 | 1 1 0 1 | 1 1 0 0 |   |
|   | 0 0 1 0 | 0 0 1 0 | 1 1 1 0 | 1 1 0 0 |   |
|   | 0 0 1 1 | 0 0 1 1 | 0 0 1 1 | 0 0 0 0 |   |
|   | 0 1 0 0 | 0 1 0 0 | 0 1 1 1 | 0 0 1 1 |   |
|   | 0 1 0 1 | 0 1 0 1 | 0 1 0 1 | 0 0 0 0 |   |
|   | 0 1 1 0 | 0 1 1 0 | 0 1 1 0 | 0 0 0 0 |   |
|   | 0 1 1 1 | 0 1 1 1 | 0 1 0 0 | 0 0 1 1 |   |
|   | 1 0 0 0 | 1 0 0 0 | 1 0 1 1 | 0 0 1 1 |   |
|   | 1 0 0 1 | 1 0 0 1 | 1 0 0 1 | 0 0 0 0 |   |
|   | 1 0 1 0 | 1 0 1 0 | 1 0 1 0 | 0 0 0 0 |   |
|   | 1 0 1 1 | 1 0 1 1 | 1 0 0 0 | 0 0 1 1 |   |
|   | 1 1 0 0 | 1 1 0 0 | 1 1 0 0 | 0 0 0 0 |   |
|   | 1 1 0 1 | 1 1 0 1 | 0 0 0 1 | 1 1 0 0 |   |
|   | 1 1 1 0 | 1 1 1 0 | 0 0 1 0 | 1 1 0 0 |   |
|   | 1 1 1 1 | 1 1 1 1 | 0 0 0 0 | 1 1 1 1 |   |
| 1 | 0 0 0 0 | 1 1 1 1 | 1 1 1 1 | 1 1 1 1 |   |
|   | 0 0 0 1 | 1 1 0 1 | 1 1 0 1 | 1 1 0 0 |   |
|   | 0 0 1 0 | 1 1 1 0 | 1 1 1 0 | 1 1 0 0 |   |
|   | 0 0 1 1 | 0 0 1 1 | 0 0 1 1 | 0 0 0 0 |   |
|   | 0 1 0 0 | 0 1 1 1 | 0 1 1 1 | 0 0 1 1 |   |
|   | 0 1 0 1 | 0 1 0 1 | 0 1 0 1 | 0 0 0 0 |   |
|   | 0 1 1 0 | 0 1 1 0 | 0 1 1 0 | 0 0 0 0 |   |
|   | 0 1 1 1 | 0 1 0 0 | 0 1 0 0 | 0 0 1 1 |   |
|   | 1 0 0 0 | 1 0 1 1 | 1 0 1 1 | 0 0 1 1 |   |
|   | 1 0 0 1 | 1 0 0 1 | 1 0 0 1 | 0 0 0 0 |   |
|   | 1 0 1 0 | 1 0 1 0 | 1 0 1 0 | 0 0 0 0 |   |
|   | 1 0 1 1 | 1 0 0 0 | 1 0 0 0 | 0 0 1 1 |   |
|   | 1 1 0 0 | 1 1 0 0 | 1 1 0 0 | 0 0 0 0 |   |
|   | 1 1 0 1 | 0 0 0 1 | 0 0 0 1 | 1 1 0 0 |   |
|   | 1 1 1 0 | 0 0 1 0 | 0 0 1 0 | 1 1 0 0 |   |
|   | 1 1 1 1 | 0 0 0 0 | 0 0 0 0 | 1 1 1 1 |   |

Meanwhile, as shown in the following Table 4, the bit swapping process using Table 2 can be regarded as the adaptive bit inversion process based on, for example, the following four rules:

- a first rule: when the number of "0" bits and the number of "1" bits are equal in adjacent four bits of an error mitigation encoder input (two by two), the adjacent four bits do not undergo the bit inversion;
- a second rule: when all of the adjacent four bits of the error mitigation encoder input are "0" bits or "1" bits, all the bits are inverted;
- a third rule: when the number of "0" bits is 1, and the number of "1" bits is 3 in the adjacent four bits of the error mitigation encoder input, "11" which are located in the lower two bits or the upper two bits among the four bits are bit-inverted into "00"; and
- a fourth rule: when the number of "0" bits is 3, and the number of "1" bits is 1 in the adjacent four bits of the error mitigation encoder input, "00" which are located in the lower two bits or the upper two bits among the four bits are bit-inverted into "11."

TABLE 4

| $b_x$ | $b_{x+1}$ | $b_{x+2}$ | $b_{x+3}$ | Number of "0" bits | Number of "1" bits |
|---|---|---|---|---|---|
| AC encoder input | | | | | |
| 0 | 0 | 0 | 0 | 4 | 0 |
| 0 | 0 | 0 | 1 | 3 | 1 |
| 0 | 0 | 1 | 0 | 3 | 1 |
| 0 | 0 | 1 | 1 | 2 | 2 |
| 0 | 1 | 0 | 0 | 3 | 1 |
| 0 | 1 | 0 | 1 | 2 | 2 |
| 0 | 1 | 1 | 0 | 2 | 2 |
| 0 | 1 | 1 | 1 | 1 | 3 |
| 1 | 0 | 0 | 0 | 3 | 1 |
| 1 | 0 | 0 | 1 | 2 | 2 |
| 1 | 0 | 1 | 0 | 2 | 2 |
| 1 | 0 | 1 | 1 | 1 | 3 |
| 1 | 1 | 0 | 0 | 2 | 2 |
| 1 | 1 | 0 | 1 | 1 | 3 |
| 1 | 1 | 1 | 0 | 1 | 3 |
| 1 | 1 | 1 | 1 | 0 | 4 |
| Adaptive bit inversion | | | | | |
| 1 | 1 | 1 | 1 | | |
| 1 | 1 | 0 | 1 | | |
| 1 | 1 | 1 | 0 | | |
| 0 | 0 | 1 | 1 | | |
| 0 | 1 | 1 | 1 | | |
| 0 | 1 | 0 | 1 | | |
| 0 | 1 | 1 | 0 | | |
| 0 | 1 | 0 | 0 | | |
| 1 | 0 | 1 | 1 | | |
| 1 | 0 | 0 | 1 | | |
| 1 | 0 | 1 | 0 | | |
| 1 | 0 | 0 | 0 | | |
| 1 | 1 | 0 | 0 | | |
| 0 | 0 | 0 | 1 | | |
| 0 | 0 | 1 | 0 | | |
| 0 | 0 | 0 | 0 | | |

TABLE 4-continued

| $b_x$ | $b_{x+1}$ | $b_{x+2}$ | $b_{x+3}$ | Number of "0" bits | Number of "1" bits |
|---|---|---|---|---|---|
| 0 | 0 | 1 | 0 | | |
| 0 | 0 | 0 | 0 | | |

The adaptive bit inversion described above has features described below. In other words, bits which correspond in number to a change amount of the number of "0" bits (or the number of "1" bits) before and after the bit inversion among the adjacent four bits of the error mitigation encoder input are inverted. Further, if the number of "0" bits among the adjacent four bits of the error mitigation encoder input is large, the bit inversion from "0" bit to "1" bit is performed, and if the number of "1" bits is large, the bit inversion from "1" bit to "0" is performed. In other words, since the bit inversion is performed only on a portion in which the number of "0" bits/"1" bits is changed by the bit inversion, it is possible to reduce the error amplification of the portion in which the number of "0" bits/"1" bits does not change without performing the bit inversion while keeping the error mitigation performance.

The other configurations, operations, and effects are similar to those in the above embodiments, and thus detailed description thereof is omitted here.

Seventeenth Embodiment

Next, a memory system according to a seventeenth embodiment will be described in detail with reference to the appended drawings. In the seventeenth embodiment, an example in which the adaptive bit inversion described in the sixteenth embodiment is expanded to adjacent $2^N$ bits (N is a positive integer) will be described.

In the seventeenth embodiment, a recursive bit inversion process is performed in accordance with a function f(x) ($x=\{b_0, b_1, \ldots, b_{M-1}\}$) (M is an integer of 2 or more) indicated in the following Formula (2). Similarly, in the decoding, when data which has undergone the adaptive bit inversion is y, data before application is obtained by f(y). In Formula (2), MSB indicates a most significant bit, and LSB indicates a least significant bit.

[Math. 2]
In a case in which all bits in x are "0" or "1": f(x)=~x
In a case in which both number of "0" bits and number of "1" bits in x are 1 or more:
  when the number of "0" bits and the number of "1" bits in x are equal, f(x)=x
  when the number of "0" bits and the number of "1" bits in x are different, f(x)={f(xa),f(xb)}
(here, xa indicates bits of half of x on the MSF side, and xb indicates bits of half of x on the LSE side)

Figure 38A:
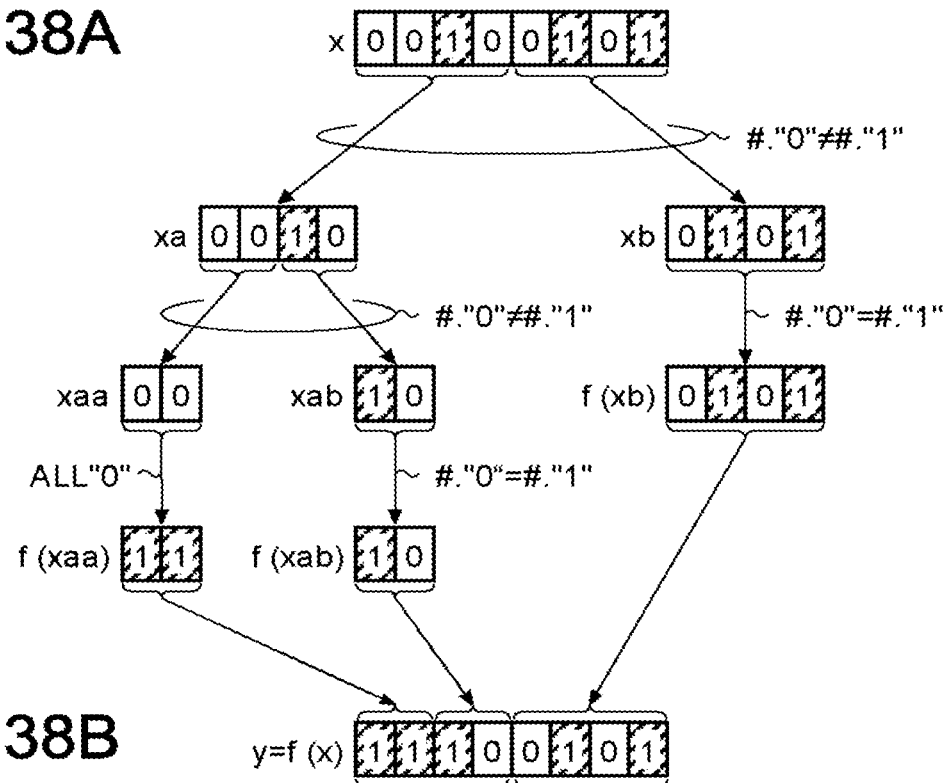
FIGS. 38A and 38B are diagrams for describing a result of extending adaptive bit inversion to neighbor $2^3$ (=8) bits (N=3) according to a seventeenth embodiment.
Figure 38B:
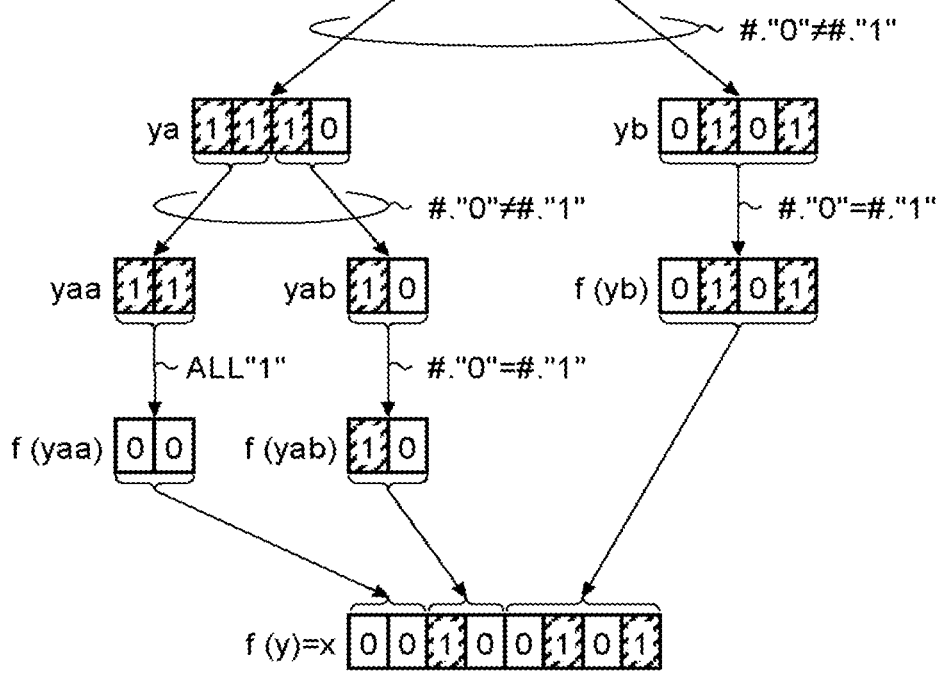

Here, a result of extending the adaptive bit inversion according to the present embodiment to adjacent $2^3$ bits (=8 bits) (N=3) will be described with reference to FIGS. 38A and 38B. FIGS. 38A and 38B illustrate an example in which the adaptive bit inversion is executed on x={0, 0, 1, 0, 0, 1, 0, 1}. FIG. 38A illustrates an example of the adaptive bit inversion process, and FIG. 38B illustrates the adaptive bit inversion process at the time of error mitigation decoding.

First, as illustrated in FIG. 38A, in the adaptive bit inversion process of error mitigation coding, since the number of "0" bits in x is 5, and the number of "1" bits is 3, x is divided into xa={0, 0, 1, 0} of four bits on the MSB side and xb={0, 1, 0, 1} of four bits on the LSB side. xb of a right side route in FIG. 38A is f(xb)=xb {0, 1, 0, 1} since both the number of "0" bits and the number of "1" bits are 2. On the other hand, since the number of "0" bits=3 and the number of "1" bits 1, xa of a left side route in FIG. 38A is divided into xaa={0, 0} of two bits on the MSB side and xab={1, 0} of two bits on the LSB side. Since all the bits of xaa are "0," f(xaa)=~xaa={1, 1}. On the other hand, since both the number of "0" bits and the number of "1" bits are 1, f(xab)=xab={1, 0}. As a result, f(x)={1, 1, 1, 0, 0, 1, 0, 1}.

Further, in a case in which it returns from y to x, it is preferably to apply the function f similarly. In other words, as illustrated in FIG. 38B, in the adaptive bit inversion processing at the time of error mitigation decoding, since the number of "0" bits in y (=f(x)) is 3, and the number of "1" bits is 5, y is divided into ya={1, 1, 1, 0} of four bits on the MSB side and four bits on the LSB side and yb={0, 1, 0, 1} of four bits on the LSB side. yb of a right side route in FIG. 38B is f(yb)=yb={0, 1, 0, 1} since both the number of "0" bits and the number of "1" bits are 2. On the other hand, since the number of "1" bits is 3, and the number of "0" bits is 1, ya of a left side route in FIG. 38B is divided into yaa={1, 1} two bits on the MSB side and yab={1, 0} of two bits on the LSB side. Since all bits of yaa" are "1," f(yaa)=~yaa={0, 0}. On the other hand, f(yab)=yab={1, 0} since both the number of "0" bits and the number of "1" bits are 1. As a result, f(y)=x={0, 0, 1, 0, 0, 1, 0, 1}.

Here, if x is compared with f(x), as a result of the adaptive bit inversion process, the original bit pattern is maintained without performing the bit inversion on the six bits on the LSB side even after the adaptive bit inversion, and the bit inversion is performed on only two bits on the MSB side. Therefore, for example, when an error occurs in the flag bit in the error mitigation encoded data, the error mitigation decoded data is erroneously y=f(x) other than x, but at this time, the bit pattern of x is maintained for the six bits on the LSB side. Therefore, no error occurs in the six bits on the LSB side, and an error occurs only in two bits on the MSB side. In other words, according to the present embodiment, it is possible to prevent the error occurring in the flag bit from being amplified in the entire data crumb.

In a case in which the adaptive bit inversion according to the present embodiment described above is applied to the entire eight-bit data, the bit non-coincidence probability that the input to the error mitigation encoder 1630 when an error occurs in the flag bit does not coincide with the output from the error mitigation decoder 1640 is 0.304. Therefore, it is possible to reduce the error amplification at the time of flag error to 0.304 by employing the adaptive bit inversion of the present embodiment.

The other configurations, operations, and effects are similar to those in the above embodiments, and thus detailed description thereof is omitted here.

In the above embodiment, as the example of the data coding for the multi-value memory cells, one type of data coding has been described for each of a 4-value memory cell, an 8-value memory cell, and a 16-value memory cell, but the data coding is limited to these data coding, and other various data coding can be applied.

In the above embodiments, four values, eight values, and sixteen values have been described as the number of multi-value states, but the number of multi-value states is not limited thereto, and the other number of states may be used.

Further, in the above embodiments, the NAND memory in which the data state of the memory cell is decided in accordance with the threshold voltage has been described as the example of the non-volatile memory 20, but the present embodiment is not limited to this example, but, for example, the above embodiments can be applied even when other types of non-volatile memories such as ReRAMs in which the data state of the memory cell is decided in accordance with a resistance value.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
    a non-volatile memory having a plurality of memory cells each capable of storing a multi-value bit;
    an error mitigation encoder that executes error mitigation coding on write data to be stored in each of a plurality of processing target pages of the non-volatile memory;
    a memory interface that writes the write data which has undergone the error mitigation coding in the plurality of processing target pages of the non-volatile memory and reads the write data which has undergone the error mitigation coding from the plurality of processing target pages as read data;
    an error mitigation decoder that performs error mitigation decoding on the read data read from the plurality of processing target pages of the non-volatile memory; and
    an error mitigation coding rate deciding unit that decides, for each of the plurality of processing target pages, an error mitigation coding rate of the error mitigation encoder and the error mitigation decoder on the basis of information indicating a device characteristic of the each of the plurality of processing target pages.

2. The memory system according to claim 1, further comprising:
    a first error correction encoder that executes first error correction coding of adding a first parity for first error correction in an intra-page direction to the write data which has undergone the error mitigation coding;
    a first error correction decoder that performs the first error correction using the first parity on the read data read from the plurality of processing target panes of the non-volatile memory; and
    an error correction coding rate deciding unit that decides, for each of the plurality of processing target pages, an error correction coding rate of the first error correction encoder and the first error correction decoder on the basis of the information indicating the device characteristic of the each of the plurality of processing target pages,
    wherein the memory interface writes the write data which has undergone the error mitigation coding and to which the first parity is added in the processing target page, and
    the error mitigation decoder executes the error mitigation decoding on the read data which has undergone the first error correction performed by the first error correction decoder.

3. The memory system according to claim 1, wherein the information indicating the device characteristic is information indicating a relation between a combination of the error mitigation coding rates of respective pages and a cell threshold voltage distribution.

4. The memory system according to claim 1, wherein the information indicating the device characteristic is information indicating a combination of the error mitigation coding rates of respective pages and a change in a bit error rate (BER) or a frame error rate (FER) or a change in a relative relation between the BER and the FER.

5. The memory system according to claim 2, wherein the error mitigation encoder and the first error correction encoder are controlled such that a sum of a data amount increased by the error mitigation coding and a data amount increased by the first error correction coding are constant.

6. The memory system according to claim 2, wherein the first error correction encoder performs the first error correction coding so that a data amount increased by the first error correction coding is equal in all of the plurality of processing target pages, and
    the error mitigation encoder executes the error mitigation coding so that the data amount excluding the first parity is equal in all of the plurality of processing target pages by writing a part of increase data in one of the plurality of processing target pages which is large in a data amount increased by the error mitigation coding in one of the plurality of processing target pages which is small in the data amount increased by the error mitigation coding.

7. The memory system, according to claim 1, wherein a logical data amount stored per page is reduced, and a reduced amount is used for lowering the error mitigation coding rate of the error mitigation encoder.

8. The memory system according to claim 1, wherein some memory cells among the plurality of memory cells constitute a memory cell group corresponding to a plurality of pages,
    the write data is a data crumb including a plurality of pieces of page data stored in each of the plurality of pages constituted by the memory cell group,
    the error mitigation coding rate deciding unit decides a division number in which each of the plurality of pieces of page data is divided into sub data crumbs on the basis of the information indicating the device characteristic of the each of the plurality of processing target pages, and
    the error mitigation encoder divides each of the plurality of pieces of page data into one or more sub data crumbs on the basis of the division number decided by the error mitigation coding rate deciding unit, decides whether or not data conversion is executed for each sub data crumb, adds a flag indicating whether or not the data conversion is executed on each of the sub data crumbs to the page data, and executes the data conversion on each of the sub data crumbs in accordance with the added flag.

9. The memory system according to claim 8, wherein the error mitigation encoder performs the data conversion on each of the sub data crumbs in accordance with all combinations of the flags added to the plurality of pieces of page data constituting the data crumb, generates data conversion candidates related to all the combinations of the flags, selects one data conversion candidate from the generated data conversion candidates in accordance with a predetermined selection rule, and sets the selected data conversion candidate as the write data which has undergone the error mitigation coding.

10. The memory system according to claim 8, wherein the error mitigation decoder executes error mitigation decoding which is an inverse conversion of the data conversion for each sub data crumb in accordance with the flag.

11. The memory system according to claim 8, further comprising:
a first error correction encoder that executes first error correction coding of adding a first parity for first error correction in an intra-page direction to the write data which has undergone the error mitigation coding;
a first error correction decoder that performs the first error correction using the first parity on the read data read from the plurality of processing target pages of the non-volatile memory; and
an error correction coding rate deciding unit that decides an error correction coding rate of the first error correction encoder and the first error correction decoder on the basis of the information indicating the device characteristic of the each of the plurality of processing target pages,
wherein the memory interface writes the write data which has undergone the error mitigation coding and to which the first parity is added in the plurality of processing target pages, and
the error mitigation decoder executes the error mitigation decoding on the read data which has undergone the first error correction performed by the first error correction decoder.

12. The memory system according to claim 8, further comprising,
a second error correction encoder that executes second error correction coding of adding a second parity for second error correction between pages on a multi-dimensional error correction code including a plurality of pieces of page data which has undergone the error mitigation coding;
a first error correction encoder that executes first error correction coding of adding a first parity for first error correction in an intra-page direction to each piece of page data which has undergone the error mitigation coding and the second parity generated by the second error correction coding;
a first error correction decoder that performs the first error correction using the first parity on the read data read from the plurality of processing target panes of the non-volatile memory;
a second error correction decoder that performs the second error correction using the second parity on the read data which has undergone the first error correction; and
an error correction coding rate deciding unit that decides, for each of the plurality of processing target pages, an error correction coding rate of the first error correction encoder and the first error correction decoder on the basis of the information indicating the device characteristic of the each of the plurality of processing target pages,
wherein the memory interface writes the write data which has undergone the error mitigation coding and to which the first parity is added and the second parity in the plurality of processing target pages, and
the error mitigation decoder executes the error mitigation decoding on the read data which has undergone the second error correction performed by the second error correction decoder.

13. The memory system according to claim 12, wherein the multi-dimensional error correction code includes the plurality of pieces of page data having an equal data length.

14. The memory system according to claim 12, wherein, in the multi-dimensional error correction code, the data lengths of the plurality of pieces of page data are equalized by adding predetermined data to page data having a short flag length of the plurality of pieces of page data.

15. The memory system according to claim 12, wherein, in the multi-dimensional error correction code, the data lengths of the plurality of pieces of page data are equalized by rearranging flag data of a part of page data having a long flag length to page data having a short flag length among the plurality of pieces of page data.

16. The memory system according to claim 1, wherein each of the plurality of memory cells is a memory cell capable of storing 2-bit data in one cell, a memory cell capable of storing 3-bit data in one cell, or a memory cell storing 4-bit data in one cell.

17. A memory system, comprising:
a non-volatile memory;
a first error correction encoder that executes first error correction coding of adding a first parity for first error correction in an intra-page direction on write data;
an error mitigation encoder that executes error mitigation coding on the write data which has undergone the first error correction coding;
a second error correction encoder that executes second error correction coding of adding a second parity for second error correction in an inter-page direction on the write data which has undergone the error mitigation coding;
a memory interface that writes the write data which has undergone the second error correction coding in the non-volatile memory and reads the write data which has undergone the second error correction coding from the non-volatile memory as read data;
a second error correction decoder that performs the second error correction on the read data read from the non-volatile memory;
an error mitigation decoder that executes error mitigation decoding on the read data which has undergone the second error correction; and
a first error correction decoder that performs first error correction on the read data which has undergone the error mitigation decoding.

18. The memory system according to claim 17, wherein the error mitigation coding performed by the error mitigation encoder includes
controlling bit inversion and non-bit inversion in first predetermined units so that a bias occurs in an appearance frequency of a first bit value and a second bit value for the write data which has undergone the first error correction coding,
generating bit-inverted data by performing the bit inversion on all bits of the write data of the first predetermined unit selected by the bit inversion,
generating divisional bit inverted data by dividing the bit inverted data into second predetermined units smaller than or equal to the first predetermined unit, and
executing a bit swapping process of swapping bits in units of the divisional bit inverted data units.

19. The memory system according to claim 17, wherein in the error mitigation coding performed by the error mitigation encoder includes
controlling bit inversion and non-bit inversion in first predetermined units so that a bias occurs in an appearance frequency of a first bit value and a second bit value for the write data which has undergone the first error correction coding, and performing bit inversion on bits excluding at least a part of an exclusion target bit string among the write data of the first predetermined unit selected by the bit inversion, and the exclusion target bit string is a partial bit string of divided input data obtained by dividing input data of the first predetermined unit by a second predetermined unit smaller than or equal to the first predetermined unit, and a first bit value and a second bit value are equal in the number of appearances.

20. The memory system according to claim 19, wherein, when the input data is $x=\{b_0, b_1, \ldots, b_{M-1}\}$, MSB indicates a most significant bit, and LSB indicates a least significant bit, the bit inversion of the input data is defined by the following Formula (1):

[Math. 1]

in a case in which all bits in x are "0" or "1": $f(x)=\sim x$ in a case in which both number of "0" bits and number of "1" bits in x are 1 or more:

when the number of "0" bits and the number of "1" bits in x are equal, $f(x)=x$ when the number of "0" bits and the number of "1" bits in x are different, $f(x)=\{f(xa),f(xb)\}$ (here, xa indicates bits of half of x on the MSB side, and xb indicates bits of half of x on the LSB side).

* * * * *